US009842878B2

(12) United States Patent
Terada et al.

(10) Patent No.: US 9,842,878 B2
(45) Date of Patent: Dec. 12, 2017

(54) SEMICONDUCTOR DEVICE AND A MANUFACTURING METHOD THEREOF

(71) Applicant: RENESAS ELECTRONICS CORPORATION, Tokyo (JP)

(72) Inventors: Takashi Terada, Tokyo (JP); Shinya Hori, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/491,670

(22) Filed: Apr. 19, 2017

(65) Prior Publication Data

US 2017/0221942 A1    Aug. 3, 2017

Related U.S. Application Data

(63) Continuation of application No. 15/058,668, filed on Mar. 2, 2016, now Pat. No. 9,685,474, which is a (Continued)

(30) Foreign Application Priority Data

Feb. 28, 2014  (JP) ................. 2014-038447

(51) Int. Cl.
*H01L 27/146*    (2006.01)
(52) U.S. Cl.
CPC ...... *H01L 27/1464* (2013.01); *H01L 27/1463* (2013.01); *H01L 27/14609* (2013.01);
(Continued)
(58) Field of Classification Search
None
See application file for complete search history.

(56) References Cited

U.S. PATENT DOCUMENTS 7,101,726 B2    9/2006  Yamamoto et al.
8,138,533 B2    3/2012  Koike et al.
(Continued)

FOREIGN PATENT DOCUMENTS

JP    2005-150463 A    6/2005
JP    2010-109137 A    5/2010
(Continued)

OTHER PUBLICATIONS

Office Action issued in corresponding Japanese Patent Application No. 2014-038447, dated Apr. 18, 2017.
(Continued)

*Primary Examiner* — Minh-Loan Tran
(74) *Attorney, Agent, or Firm* — McDermott Will & Emery LLP

(57) ABSTRACT

A semiconductor device has a chip region including a back-side illumination type photoelectric conversion element, a mark-like appearance part, a pad electrode, and a coupling part. The mark-like appearance part includes an insulation film covering the entire side surface of a trench part formed in a semiconductor substrate. The pad electrode is arranged at a position overlapping the mark-like appearance part. The coupling part couples the pad electrode and mark-like appearance part. At least a part of the pad electrode on the other main surface side of the substrate is exposed through an opening reaching the pad electrode from the other main surface side of the substrate. The mark-like appearance part and coupling part are arranged to at least partially surround the outer circumference of the opening in plan view.

12 Claims, 47 Drawing Sheets

Related U.S. Application Data continuation of application No. 14/634,557, filed on Feb. 27, 2015, now Pat. No. 9,312,295.

(52) U.S. Cl.
CPC .. *H01L 27/14618* (2013.01); *H01L 27/14621* (2013.01); *H01L 27/14623* (2013.01); *H01L 27/14627* (2013.01); *H01L 27/14632* (2013.01); *H01L 27/14636* (2013.01); *H01L 27/14643* (2013.01); *H01L 27/14645* (2013.01); *H01L 27/14683* (2013.01); *H01L 27/14687* (2013.01); *H01L 27/14689* (2013.01)

(56) References Cited

U.S. PATENT DOCUMENTS

| | | |
|---|---|---|
| 8,354,678 B1 | 1/2013 | Fox et al. |
| 8,435,824 B2 | 5/2013 | Tsai et al. |
| 8,456,014 B2 | 6/2013 | Kobayashi et al. |
| 8,492,805 B2 | 7/2013 | Akiyama et al. |
| 8,492,864 B2 | 7/2013 | Watanabe |
| 8,969,194 B2 | 3/2015 | Pyo |
| 9,177,981 B2 | 11/2015 | Nishizawa |
| 9,437,639 B2 | 9/2016 | Kashihara |
| 2009/0315132 A1 | 12/2009 | Kohyama |
| 2010/0230773 A1 | 9/2010 | Nakazawa et al. |
| 2012/0146116 A1 | 6/2012 | Sato |
| 2013/0032916 A1 | 2/2013 | Lin et al. |
| 2013/0105667 A1* | 5/2013 | Kobayashi ........ H01L 27/14634 250/208.1 |
| 2016/0172405 A1 | 6/2016 | Hori |

FOREIGN PATENT DOCUMENTS

| | | |
|---|---|---|
| JP | 2010-147230 A | 7/2010 |
| JP | 2011-014674 A | 1/2011 |
| JP | 2011-159706 A | 8/2011 |
| JP | 2011-524633 A | 9/2011 |
| JP | 2012-084693 A | 4/2012 |
| JP | 2012-099742 A | 5/2012 |
| JP | 2012-178496 A | 9/2012 |
| JP | 2013-021323 A | 1/2013 |
| JP | 2013-038391 A | 2/2013 |
| JP | 2013-168617 A | 8/2013 |

OTHER PUBLICATIONS

Notice of Allowance in U.S. Appl. No. 14/634,557 dated Dec. 8, 2015.

Notice of Allowance of U.S. Appl. No. 15/058,668 dated Mar. 2, 2016.

\* cited by examiner

SEMICONDUCTOR DEVICE AND A MANUFACTURING METHOD THEREOF

CROSS-REFERENCE TO RELATED APPLICATIONS

This application is a continuation patent application of U.S. patent application Ser. No. 15/058,668 filed on Mar. 2, 2016, which is a continuation patent application of U.S. patent application Ser. No. 14/634,557 filed on Feb. 27, 2015, now U.S. Pat. No. 9,312,295 issued on Apr. 12, 2016, which claims priority to Japanese Patent Application No. 2014-038447 filed on Feb. 28, 2014. The subject matter of each is incorporated herein by reference in entirety.

BACKGROUND

The present invention relates to a semiconductor device and a manufacturing method thereof. More particularly, it relates to a semiconductor device having a so-called back-side illumination type photoelectric conversion element, and a manufacturing method thereof.

In a CMOS (Complementary Metal Oxide Semiconductor) image sensor including a plurality of photoelectric conversion elements formed therein, miniaturization and densification of the light receiving surface have been pursued. Accordingly, with a related-art so-called front-side illumination type CMOS image sensor to be irradiated with a light on the photoelectric conversion elements from thereabove (the front surface side), unfavorably, the incident light is blocked by the wiring layer over the photoelectric conversion elements, and does not sufficiently reach the photoelectric conversion elements.

Under such circumstances, there have been proposed so-called back-side illumination type CMOS image sensors to be irradiated with a light on photoelectric conversion elements from thereunder (the back surface side) as described in, for example, the following Patent Documents 1 to 7.

PATENT DOCUMENTS

[Patent Document 1] Japanese Unexamined Patent Application Publication No. 2013-38391
[Patent Document 2] Japanese Unexamined Patent Application Publication No. 2013-21323
[Patent Document 3] Japanese Unexamined Patent Application Publication No. 2012-99742
[Patent Document 4] Japanese Unexamined Patent Application Publication No. 2012-84693
[Patent Document 5] Japanese Unexamined Patent Application Publication No. 2005-150463
[Patent Document 6] Japanese Unexamined Patent Application Publication No. 2011-14674
[Patent Document 7] Japanese Unexamined Patent Application Publication No. 2010-147230

SUMMARY

In general, the outer circumferential part of a semiconductor chip is surrounded by a seal ring fixed to a semiconductor substrate forming the semiconductor chip. As a result, photoelectric conversion elements and other internal circuits arranged in the inside of the seal ring may be less susceptible to malfunction due to external moisture intrusion. Herein, in the case of the front-side illumination type CMOS image sensor, the pad electrodes for supplying electric signals to the internal circuits are formed at the uppermost surface on the front surface side. For this reason, generally, the possibility of intrusion of moisture from the vicinity of the pad electrodes is not required to be considered.

However, in the case of the back-side illumination type CMOS image sensor, pad electrodes may often be formed in a lamination structure of a wiring layer formed over (on the front surface side of) a semiconductor substrate forming the semiconductor chip. Accordingly, often, an electric signal from the pad electrode can be extracted from the opening formed so as to reach the pad electrode from the lowermost surface on the back surface side toward the top surface side. In this case, moisture may intrude into the internal circuit and the like through the opening, unfavorably resulting in deterioration of the moisture resistance of the CMOS image sensor.

The pad electrode applicable with a given electric potential is required to be electrically insulated from a semiconductor substrate generally fixed at ground potential. However, when the insulating protective film as shown in, for example, each of the Patent Documents is used for the insulation, moisture may pass along the protective film, to intrude into the internal circuit or the like. Alternatively, when a so-called isolating insulation film is used as in, for example, Patent Document 3, the moisture path in the isolating insulation film with a low moisture resistance is short, resulting in a higher possibility that moisture may intrude into the inside through the isolating insulation film.

Whereas, in the back-side illumination type CMOS image sensor, a light shielding film provided at the light receiving surface on the back surface side, color filters, and microlenses are required to be arranged so as to ensure a high positional precision with respect to the photoelectric conversion elements. For this reason, a visible alignment mark is required to be formed on the back surface side. However, in the Patent Documents 1 to 7, the relationship between the alignment mark on the back surface side and the pad electrode is not disclosed at all. Thus, there is room for improvement by using the alignment mark for moisture resistance improvement of the pad electrodes of the back-side illumination type.

Other objects and novel features will be apparent from the description of this specification and the accompanying drawings.

A semiconductor device in accordance with one embodiment has a chip region including a back-side illumination type photoelectric conversion element, a mark-like appearance part, a pad electrode, and a coupling part. The mark-like appearance part includes an insulation film covering the entire side surface of a trench part formed in a semiconductor substrate. The pad electrode is arranged at a position overlapping the mark-like appearance part. The coupling part couples the pad electrode and the mark-like appearance part. At least a part of the pad electrode on the other main surface side of the semiconductor substrate is exposed through an opening reaching the pad electrode from the other main surface side of the semiconductor substrate. The mark-like appearance part and the coupling part are arranged in such a manner as to surround at least a part of the outer circumference of the opening in plan view.

With a method for manufacturing a semiconductor device in accordance another embodiment, a back-side illumination type photoelectric conversion element is formed. An insulation film covering the entire side surface of a trench part formed in a semiconductor substrate is formed, thereby to form a mark-like appearance part. There is formed a coupling part for coupling a pad electrode and the mark-like appearance part. The pad electrode is formed at a position overlapping the mark-like appearance part. An opening reaching the pad electrode from the other main surface side of the semiconductor substrate is formed in such a manner as to expose at least a part of the pad electrode on the other main surface side of the semiconductor substrate. The mark-like appearance part and the coupling part are formed in such a manner as to surround at least a part of the outer circumference of the opening in plan view.

In accordance with a still other embodiment, in a semiconductor device having a back-side illumination type photoelectric conversion element, a mark-like appearance part covering the entire side surface of a trench part reaching a pad electrode from the other main surface side of the semiconductor substrate, and a coupling part for coupling the pad electrode and the mark-like appearance part can suppress the intrusion of moisture into the inside through the opening.

DETAILED DESCRIPTION

Below, embodiments will be described by reference to the accompanying drawings.

First Embodiment

First, referring to FIGS. 1 and 2, a semiconductor device in a wafer state will be described as the present embodiment.

Figure 1:
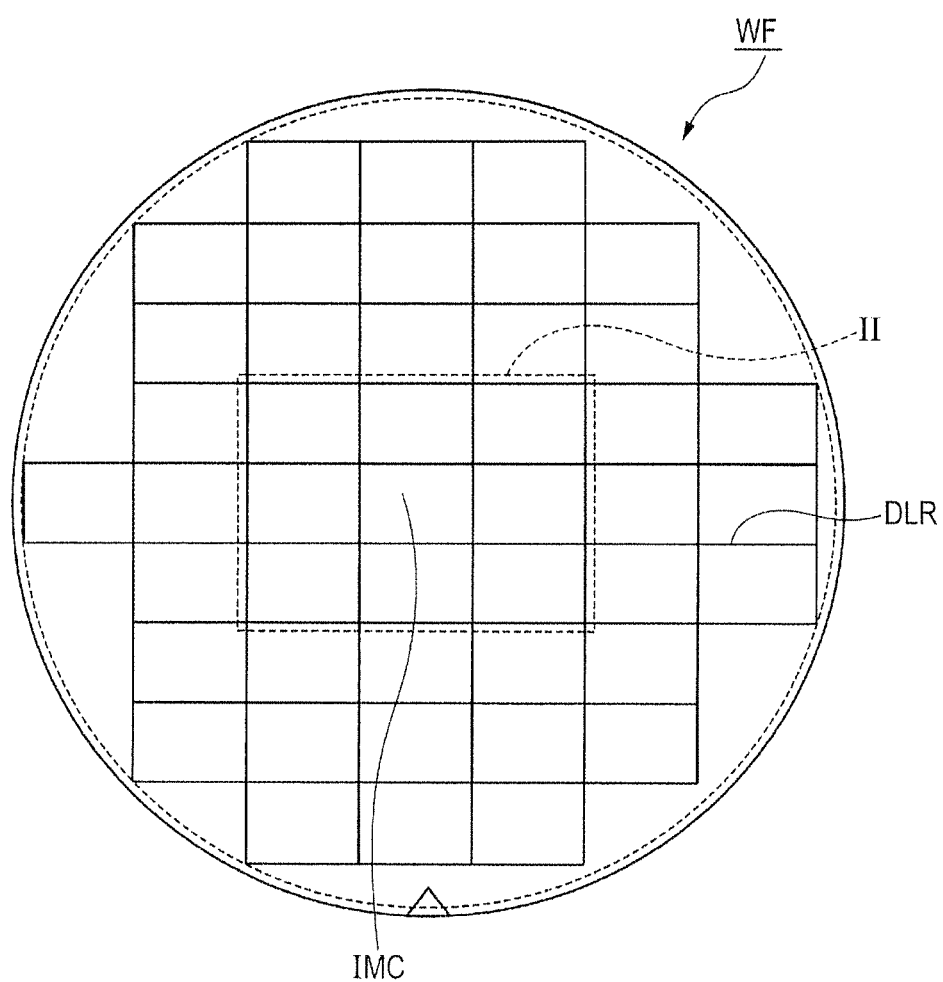
FIG. 1 is a schematic plan view showing a wafer state of a semiconductor device of one embodiment.

Referring to FIG. 1, in a semiconductor wafer WF, there are formed a plurality of CMOS image sensor chip regions IMC. The plurality of chip regions IMC have rectangular planar configurations, and are spaced apart from one another in an array.

Figure 2:
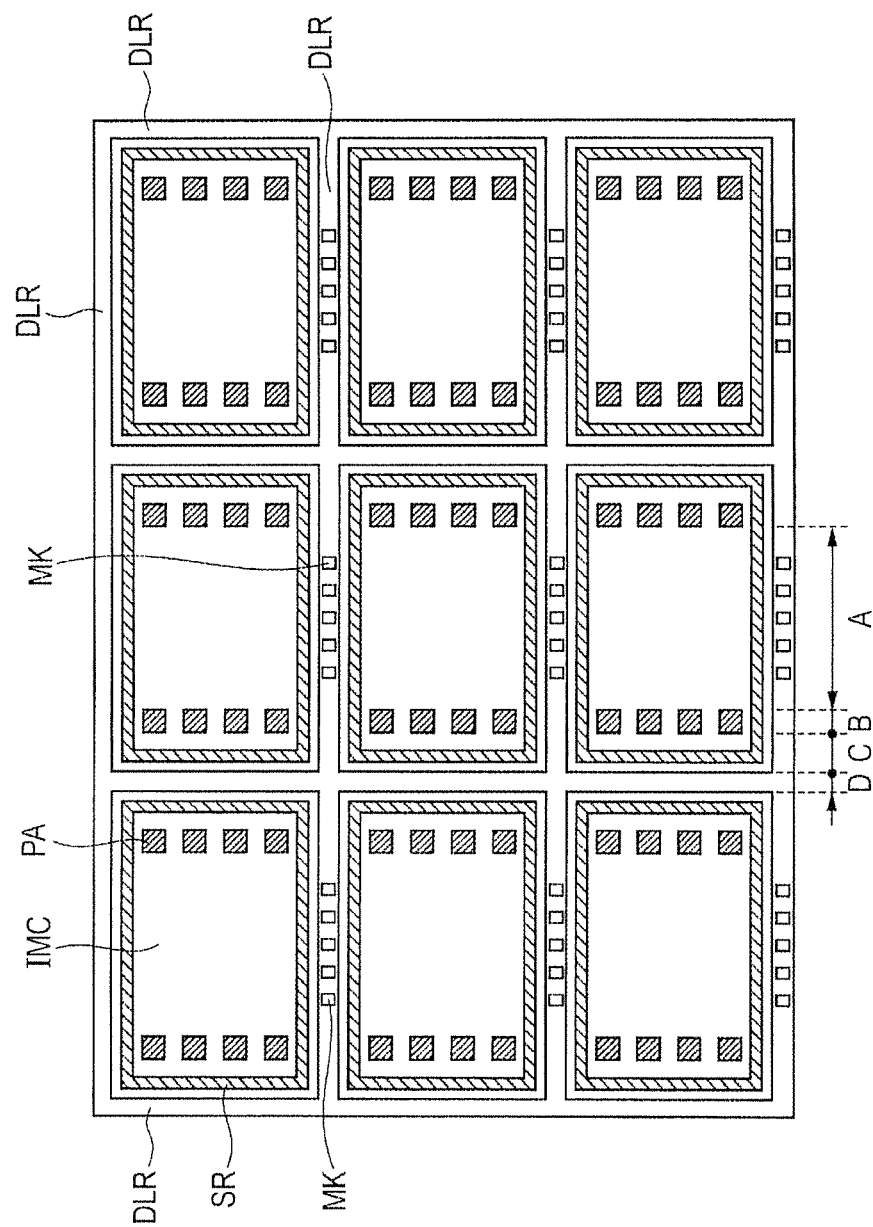
FIG. 2 is a schematic enlarged plan view of a region II surrounded by a dotted line in FIG. 1.

Referring to FIGS. 1 and 2, in each of the plurality of chip regions IMC, there is formed a solid-state image sensing device formed of a plurality of photoelectric conversion elements described later. The chip region IMC has a solid-state image sensing device region A situated at the central part thereof, a pad region B formed outside the solid-state image sensing device region A in plan view, and a seal ring region C formed in such a manner as to surround the solid-state image sensing device region A and the pad region B in plan view. In the pad region B, there are formed pad electrodes PA. In the seal ring region C, there is formed a seal ring SR.

In the semiconductor wafer WF, a dicing line region DLR is formed among the plurality of chip regions IMC. The semiconductor wafer WF is diced by the dicing line region DLR. As a result, the semiconductor wafer WF is divided into a plurality of semiconductor chips. The dicing line region DLR (dicing line region D) is arranged in such a manner as to surround each of the plurality of chip regions IMC.

In the dicing line region DLR, there are formed marks MK (alignment marks for forming color filters CFT, microlenses LNS, or the like, or alignment inspection marks or so-called BOX marks which are marks for inspecting misalignment) for use in formation of a semiconductor device such as a solid-state image sensing device.

Then, referring to FIGS. 3 and 4, a description will be given to the specific configuration of respective regions A to D shown in FIG. 2.

Figure 3:
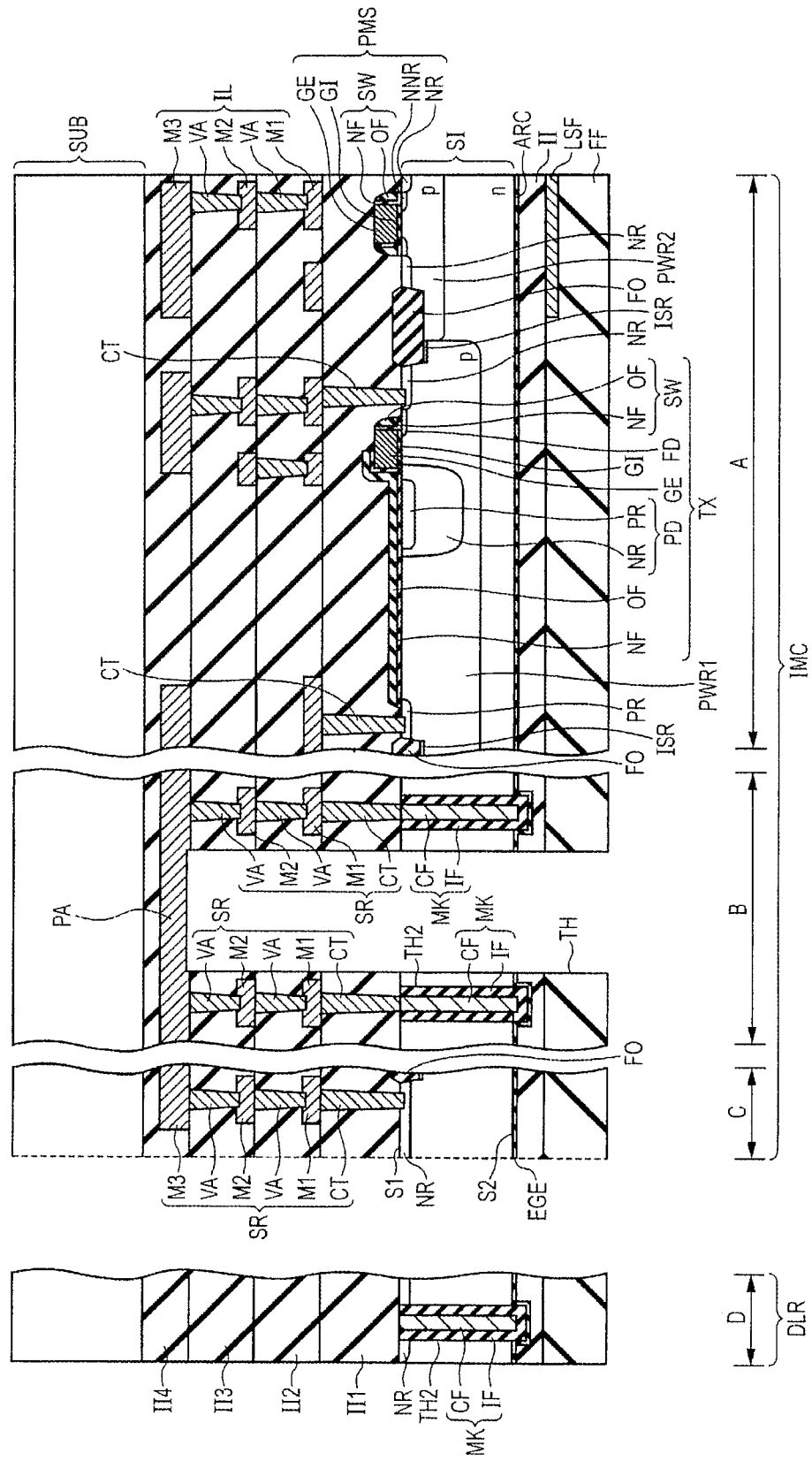
FIG. 3 is a schematic cross sectional view particularly showing the configuration of regions A, B, C, and D shown in FIG. 2 of a semiconductor device in accordance with First Embodiment.

Referring to FIG. 3, a semiconductor device including the solid-state image sensing device of the present embodiment formed therein is formed at a semiconductor substrate SI formed of, for example, silicon. The semiconductor substrate SI serves as a base for the semiconductor wafer WF of FIG. 1. In FIG. 3, the semiconductor substrate SI is assumed to be of an n type. However, the semiconductor substrate SI may be of a p type. The semiconductor substrate SI has one main surface S1, and the other main surface S2 opposite to one main surface. The semiconductor substrate SI is defined into regions A to D of FIG. 2 along the main surfaces S1 and S2. As a result, the regions A to D are formed in the semiconductor device.

In the solid-state image sensing device region A of the chip region IMC, a photodiode PD as a photoelectric conversion element is formed in the semiconductor substrate SI. The photodiode PD is formed of an n type impurity region NR and a p type impurity region PR. In FIG. 3, only one photodiode PD is shown. However, in actuality, in the solid-state image sensing device region A, there are formed a plurality of photodiodes PD. For example, a p type well region PWR1 including a p type impurity may be formed in the main surface S1 of the semiconductor substrate SI, and an n type impurity region NR may be formed in the main surface S1 of the semiconductor substrate SI in the p type well region PWR1. The n type impurity region NR forms a pn junction with the p type impurity region PR.

In the solid-state image sensing device region A, the photodiode PD is arranged in such a manner as to form a portion of a transfer transistor TX. The transfer transistor TX is formed as a so-called MIS (Metal Insulator Semiconductor) transistor, and has a function of converting the electric charge formed by photoelectric conversion when the photodiode PD receives light into a voltage (using a capacity region FD described later), and further transferring the voltage to other transistors and the like.

The transfer transistor TX has a pair of source/drain regions, a gate insulation film GI, and a gate electrode GE. The source region corresponds to the photodiode PD, and the drain region corresponds to the capacity region FD. The capacity region FD is formed as, for example, an n type impurity region. A pair of the source region PD and the capacity region FD are spaced apart from each other in the main surface S1 of the semiconductor substrate SI (e.g., in the p type well region PWR1). Incidentally, the region including, in addition to the capacity region FD, the n type impurity region NR adjacent thereto may be considered as a drain region. The n type impurity region NR is formed in order to be coupled with the upper layer wire. Over the main surface S1 of the semiconductor substrate SUB interposed between a pair of source/drain regions, a gate electrode GE is formed with the gate insulation film GI interposed therebetween.

Whereas, in the main surface S1 of the semiconductor substrate SUB in the p type well region PWR1, a p type impurity region PR is formed in order to be coupled with an upper layer wire.

An antireflection film formed of a lamination structure of a silicon nitride film NF and a silicon oxide film OF is formed over the main surface S1 of the semiconductor substrate SI in such a manner as to cover the photodiode PD. Each one end of the antireflection film NF and OF runs up over one side of the gate electrode GE. Further, as the residue of the antireflection film NF and OF, a sidewall insulation layer SW formed of the silicon nitride film NF and the silicon oxide film OF is formed at the other sidewall of the gate electrode GE. The order of lamination of the silicon nitride film NF and the silicon oxide film OF forming the antireflection film or the sidewall insulation layer may be inversely to the foregoing.

In the solid-state image sensing device region A, outside the transfer transistor TX including the photodiode PD, there are formed control elements for controlling the operations of a plurality of photodiodes PD. The control elements include, for example, a MIS transistor PMS. The MIS transistor PMS is formed at the main surface S1 of the semiconductor substrate SI. Incidentally, for example, a p type well region PWR2 including a p type impurity is formed in the main surface S1 of the semiconductor substrate SI. Thus, the constituent elements such as the source region of the MIS transistor PMS may be formed in the main surface S1 of the semiconductor substrate SI in the p type well region PWR2.

The MIS transistor PMS has a pair of, for example, n type source/drain regions NR and NNR, a gate insulation film GI, and a gate electrode GE. The n type impurity regions NNR forming a pair of source/drain regions are regions formed as so-called LDD (Lightly Doped Drain), and lower in n type impurity concentration than the n type impurity regions NR. A pair of source/drain regions are respectively spaced apart from each other at the main surface S1 of the semiconductor substrate SI.

Over the main surface S1 of the semiconductor substrate SI interposed between the pair of n type source/drain regions NR and NNR, a gate electrode GE is formed with a gate insulation film GI interposed therebetween. At each sidewall of the gate electrode GE, there is formed a sidewall insulation layer SW formed of a nitride film NF and an oxide film OF as the residue of the antireflection film.

The material for the gate electrodes GE of the transfer transistor TX and the MIS transistor PMS may be formed of, for example, an impurity-doped polycrystalline silicon, or may be formed of a metal such as titanium nitride (TiN).

The transfer transistor TX and the MIS transistor PMS are isolated from each other in plan view by a field oxide film FO formed at the main surface S1 of the semiconductor substrate SI. For example, a p type isolation region ISR may be arranged outside the filed oxide film FO in such a manner as to be in contact with the bottom of the field oxide film FO (the surface closest to the main surface S2 of the semiconductor substrate SI). The isolation region ISR has a function of strengthening the electric isolation action of the field oxide film FO.

Incidentally, the n type and the p type may be all inverted to the foregoing.

In the pad region B of the chip region IMC, there is formed a mark-like appearance part MK extending from one main surface S1 toward the other main surface S2 side of the semiconductor substrate SI. The mark-like appearance part MK is formed of a circumferential insulation film IF (insulation film) and an internal conductive film CF (conductive film).

More particularly, in the semiconductor substrate SI in the pad region B, a trench part TH2 is formed in such a manner as to extend from the main surface S1 toward the main surface S2 side in the semiconductor substrate SI. A circumferential insulation film IF is formed in such a manner as to entirely cover the wall surface of the inside of the trench part TH2, namely, the side surface of the inside of the trench part TH2. In the present embodiment, the circumferential insulation film IF is formed in such a manner as to cover not only the side surface but also the bottom surface of the inside of the trench part TH2. In the trench part TH2, an internal conductive film CF is formed inside the circumferential insulation film IF in such a manner as to be surrounded by the circumferential insulation film IF. Herein, as the circumferential insulation film IF, for example, a silicon oxide film, a silicon nitride film, or a silicon oxynitride film is preferably used. As the internal conductive film CF, for example, an impurity-doped polycrystalline silicon is preferably used. In the present embodiment, the circumferential insulation film IF and the internal conductive film CF in the trench part TH2 form the mark-like appearance part MK.

In the present embodiment, the mark-like appearance part MK (trench part TH2) is formed in such a manner as to penetrate through the semiconductor substrate SI from one main surface S1 to the other main surface S2 of the semiconductor substrate SI in the thickness direction, and further protrudes from the other main surface S2 toward the bottom side of the drawing.

In the seal ring region C of the chip region IMC, at one main surface S1 of the semiconductor substrate SI, there may be formed an n type impurity region NR and a field oxide film FO (similar in, for example, the solid-state image sensing device region A).

FIG. 3 shows a state in which the semiconductor wafer WF of FIGS. 1 and 2 are cut into individual chip regions IMC at the dicing line region DLR. Accordingly, in FIG. 3, the end of the seal ring region C which is the outermost part of the chip region IMC is exposed as an edge EGE. Thus, the chip region IMC (regions A to C) and the dicing line region DLR (region D) are shown apart from each other.

In the dicing line region D, the mark MK shown in the dicing line region DLR in FIG. 2 is formed in the semiconductor substrate SI. The mark MK has the same form as that of the mark-like appearance part. MK in the pad region B at least in the cross sectional view of FIG. 3, and is formed of a circumferential insulation film IF entirely covering both of the side surface and the bottom surface of the inside of a trench part TH2 extending in such a manner as to penetrate through in the semiconductor substrate SI from the main surface S1 to the main surface S2 (beyond the main surface S2) of the semiconductor substrate SI, and an internal conductive film CF in the inside thereof.

The mark MK in the dicing line region D is formed as an alignment mark part for forming a color filter CFT, a microlens LNS, and the like described later. Then, the circumferential insulation film IF and the internal conductive film CF forming the mark MK is formed as the same layer as the circumferential insulation film IF and the internal conductive film CF forming the mark-like appearance part MK. Accordingly, the mark MK has the same form as that of the mark-like appearance part MK in the pad region B.

Then, in the respective regions A to D, over the main surface S1 of the semiconductor substrate SI, an interlayer insulation film II1 is formed in such a manner as to cover the transfer transistor TX, the MIS transistor PMS, the mark-like appearance part MK, and the like. In the chip regions A, B, and C, over the interlayer insulation film II1, there is formed a patterned first-layer metal wire M1. The first-layer metal wire M1 is electrically coupled with, for example, the p type impurity region PR, the n type impurity region NR, or the internal conductive film CF via a contact conductive layer CT filling the inside of the contact hole of the interlayer insulation film II1.

In the respective regions A to D, an interlayer insulation film II2 is formed over the interlayer insulation film II1 in such a manner as to cover the metal wire M1. In the chip regions A, B, and C, over the interlayer insulation film II2, there is formed a patterned second-layer metal wire M2. The second-layer metal wire M2 is electrically coupled with the first-layer metal wire M1 through a conductive via layer VA filling the inside of the through hole of the interlayer insulation film II2.

In the respective regions A to D, an interlayer insulation film II3 is formed over the interlayer insulation film II2 in such a manner as to cover the metal wire M2. In the chip regions A, B, and C, over the interlayer insulation film II3, there is formed a patterned third-layer metal wire M3. The third-layer metal wire M3 is electrically coupled with the second-layer metal wire M2 through a conductive via layer VA filling the inside of the through hole in the interlayer insulation film II3.

The metal wire M3 is formed at the uppermost layer of a plurality of metal wires (the layer most distant from the main surface S1 of the semiconductor substrate SI). Accordingly, the metal wire M3 is preferably formed thicker than the metal wires M1 and M2.

In the respective regions A to D, over the interlayer insulation film II3, an interlayer insulation film II4 is formed in such a manner as to cover the metal wire M3. To the uppermost surface of the interlayer insulation film II4 (the surface most distant from the main surface S1 of the semiconductor substrate SI), there is bonded a support substrate SUB formed of, for example, silicon. Incidentally, although not shown, bonding of the interlayer insulation film II4 and the support substrate SUB is preferably performed by a junction layer formed of, for example, a silicon oxide film.

In the foregoing description, the interlayer insulation films II1, II2, II3, and II4 are each formed of, for example, a silicon oxide film. The metal wires M1, M2, M3, and M4 are each formed of a thin film of, for example, aluminum. The contact conductive layer CT is formed of a thin film of, for example, tungsten to be filled in the contact hole. The via layer VA is formed of a thin film of, for example, tungsten filling the inside of the interlayer insulation film.

As described up to this point, on the main surface S1 side of the semiconductor substrate SI in the chip region IMC, there is formed a wiring layer IL formed of the metal wires M1 to M3, the contact conductive layer CT, and the via layer VA. The wiring layer IL and (the transfer transistor TX including) the photodiode PD are electrically coupled with each other. This enables input/output of an electric signal between the transfer transistor TX including the photodiode PD and other internal circuits.

On the other hand, in the respective regions A to D, on the main surface S2 side of the semiconductor substrate SI (the bottom side of the main surface S2 in the drawing), an antireflection film ARC and an interlayer insulation film II are stacked in this order. Incidentally, in each region of the pad region B and the dicing line region DLR in which the mark (mark-like appearance part) MK is formed, when the mark MK protrudes from the main surface S2 toward the bottom side of the drawing, the antireflection film ARC may protrude (be curved) toward the bottom side of FIG. 3 in such a manner as to follow this.

The antireflection film ARC is formed of a material having a refractive index value of the intermediate value between the refractive index of a silicon single crystal and the refractive index of a silicon oxide film, such as a silicon nitride film or a metal oxide film. The interlayer insulation film II is formed of, for example, a silicon oxide film.

For example, unless the antireflection film ARC is arranged, the semiconductor substrate SI formed of silicon and the interlayer insulation film II formed of a silicon oxide film are stacked in such a manner as to be in contact with each other. For this reason, the difference in refractive index therebetween causes the light incident upon the region to be reflected at a high ratio. However, between the semiconductor substrate SI and the interlayer insulation film II, there is the antireflection film ARC formed of a material having a refractive index of the intermediate value between those of the silicon oxide film and a silicon single crystal, such as a silicon nitride film. As a result, the reflection ratio can be reduced. For this reason, a desirable light can be made incident upon the photodiode PD with a high efficiency.

Over the interlayer insulation film II (on the bottom side of FIG. 3), particularly, in a region of the region A overlapping the region where the MIS transistor PMS is formed, a light shielding film LSF is formed. A planarization film FF is formed in such a manner as to cover the light shielding film LSF. The light shielding film LSF is formed particularly for suppressing intrusion of light into the MIS transistor PMS, and is formed of a thin film of a material having a light shielding property against a light applied to the photodiode, such as a thin film of aluminum or tungsten.

The planarization film FF is formed in the following manner: a coating type silicon oxide film such as SOG (Spin On Glass) is coated in such a manner as to cover the light shielding film LSF and the interlayer insulation film II, and the resulting coating is rotated. The top surface (the surface on the bottom side of the drawing) of the planarization film FF after formation by the rotation is reduced in unevenness, and is planarized.

Figure 5:
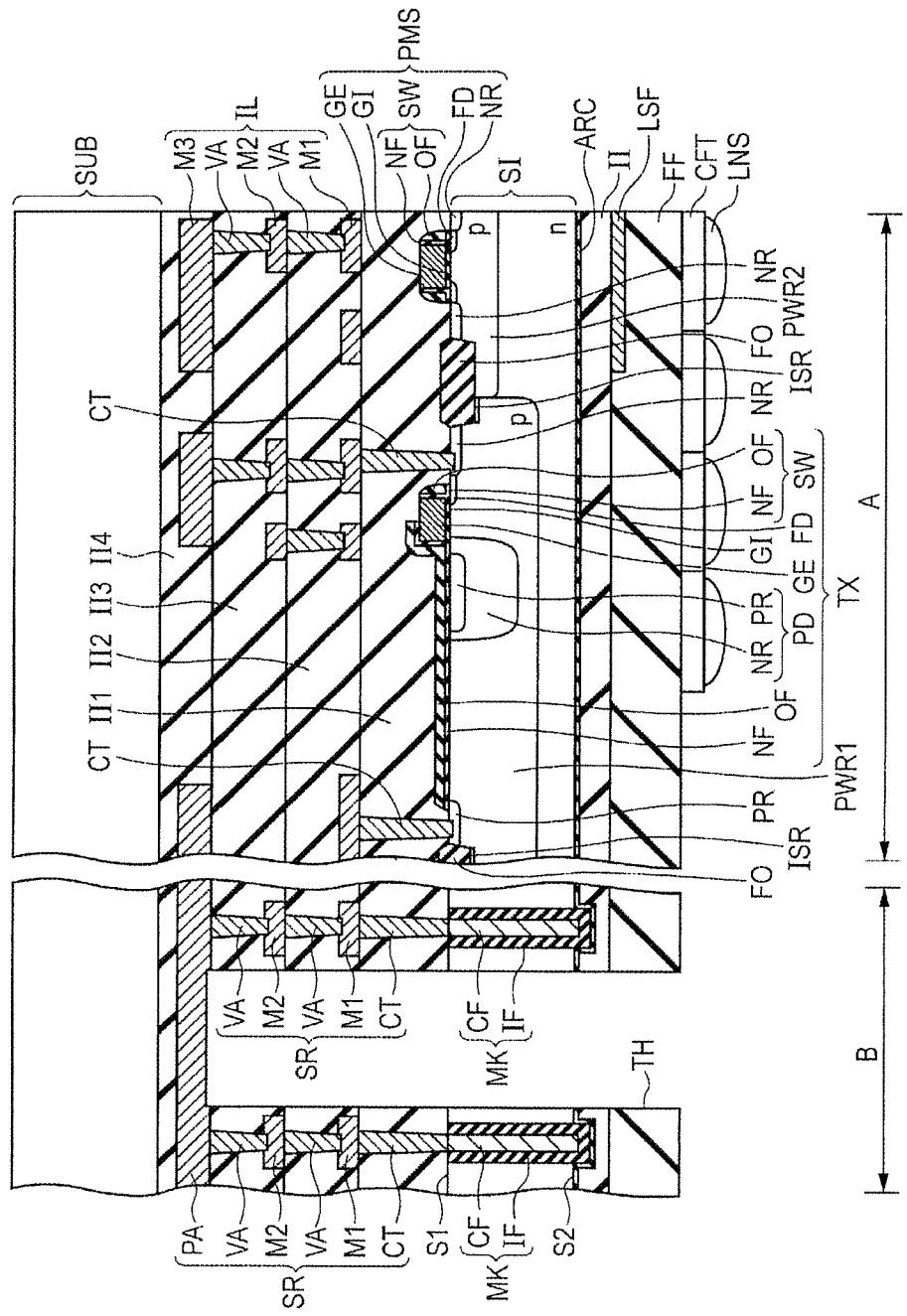
FIG. 5 is a schematic cross sectional view simply showing the configuration of the regions A and B shown in FIG. 2 of the semiconductor device in accordance with First Embodiment.

Particularly, in a region overlapping the region of the region A where the photodiode PD is formed, over the surface planarized by the planarization film FF, although not shown in FIG. 3, there are formed color filters CFT and microlenses LNS (see FIG. 5). Namely, the CMOS image sensor of the present embodiment is of a so-called back-side illumination type in which light is applied to the photodiode PD not from the front surface side (the main surface S1 side of the semiconductor substrate SI) on which the wiring layer IL for exchanging electric signals with the photodiode PD is formed, but from the back surface side (the main surface S2 side of the semiconductor substrate SI) on the opposite side thereof.

Herein, referring to FIGS. 3 and 4, the pad region B will be described in more details.

In the pad region B, for example, as the same layer as the metal wire M3 at the uppermost layer (the layer most distant from the main surface S1 of the semiconductor substrate SI) in the solid-state image sensing device region A, there is formed a pad electrode PA. The pad electrode PA is arranged at a position overlapping the mark-like appearance part MK in plan view on the main surface S1 side of the semiconductor substrate SI.

The pad electrode PA is (electrically) coupled with the internal conductive film CF of the mark-like appearance part MK by the coupling part SR formed of the contact conductive layer CT, the metal wires M1 and M2, and the via layer VA formed in the region B as the same layer as, for example, the contact conductive layer CT, the metal wires M1 and M2, and the via layer VA which are at least parts of the wiring layer IL in the region A.

Figure 4:
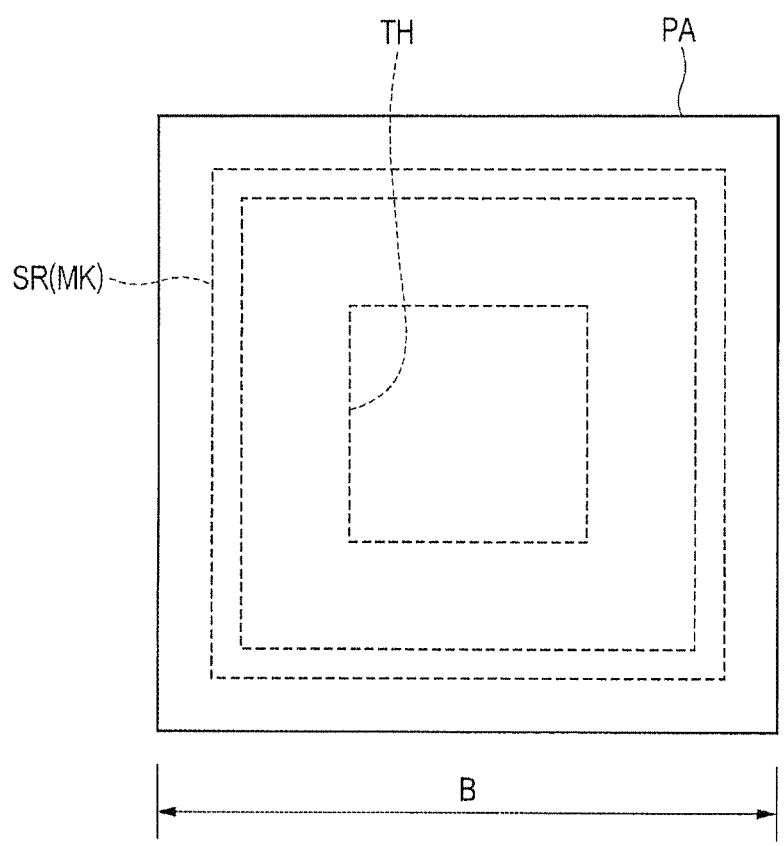
FIG. 4 is a schematic plan view simply showing the configuration of a pad region B of FIG. 3.

Referring to FIGS. 3 and 4, in the pad region B, the coupling part SR is formed at a position roughly overlapping the mark-like appearance part MK in plan view. The regions SR and MK are each formed in, for example, a rectangular shape in such a manner as to surround the central part of the pad region B in plan view in a relatively outer region in the pad region B. Then, at the central part of the pad region B, there is formed an opening TH extending from the surface of the planarization film FF on the bottom side of the drawing (from the other main surface S2 side of the semiconductor substrate SI) in the vertical direction of the drawing, and reaching the pad electrode PA. Namely, at least a part of the surface of the pad electrode PA on the main surface S2 side (bottom side) of the semiconductor substrate SI is exposed from the opening TH reaching the pad electrode PA from the surface of the planarization film FF on the bottom side of the drawing (from the other main surface S2 side of the semiconductor substrate SI). Through the exposed portion of the pad electrode PA, an electric signal can be extracted, or an electric potential can be applied to the pad electrode PA.

From the description up to this point, in the pad region B, the mark-like appearance part MK and the coupling part SR are each arranged in such a manner as to rectangularly surround the outer circumference of the opening TH in plan view. As shown in FIG. 4, in the pad region B of the present embodiment, the mark-like appearance part MK and the coupling part SR are arranged in such a manner as to entirely surround the outer circumference of the opening TH in plan view. Namely, the mark-like appearance part MK and the coupling part SR are arranged in such a manner as to rectangularly surround the outer circumference of the opening TH by one round.

On the other hand, the mark MK in the dicing line region D has the same form as that of the mark-like appearance part MK in the pad region B as far as seen in the cross sectional view of FIG. 3, but is not necessarily required to have a rectangularly circulating shape like the mark-like appearance part MK in plan view.

Whereas, referring to FIGS. 2 and 3, a seal ring SR is formed in the seal ring region C at the outermost part in the chip region IMC in such a manner as to externally surround the regions A and B (the photodiode PD and the pad electrode PA), for example, rectangularly. The seal ring SR in the seal ring region C is formed as the same layer as the contact conductive layer CT, the metal wires M1 and M2, and the via layer VA of the coupling part SR in the pad region B, and the metal wire M3 in the pad region B. Accordingly, the seal ring SR in the seal ring region C basically has the same form as that of the coupling part SR in the pad region B. However, herein, the coupling part SR in the region B is defined as the one excluding the pad electrode PA, and the seal ring SR in the region C is defined as the one also including the metal wire M3 which is the same layer as the pad electrode PA.

The seal ring SR formed in the seal ring region C has a function of suppressing the intrusion of moisture from the edge EGE into the inside of the chip region IMC (semiconductor chip) cut at the dicing line region D.

Up to this point, the configuration of the semiconductor device of the present embodiment was described. Referring to FIG. 5, hereinafter, although basically the same as FIGS. 3 and 4, a schematic cross sectional view showing the configuration of FIG. 3 in a more simplified form will be used for description. Namely, a description will be mainly given to a plurality of photodiodes PD formed in the solid-state image sensing device region A, and the pad regions B.

Then, referring to FIGS. 6 to 18, a description will be given to a method for manufacturing the semiconductor device of the present embodiment described up to this point (see FIG. 5). However, for convenience of description, while the regions A, B, and D are shown in FIGS. 6 to 10, only the regions A and B are shown in FIGS. 11 to 18.

Figure 6:
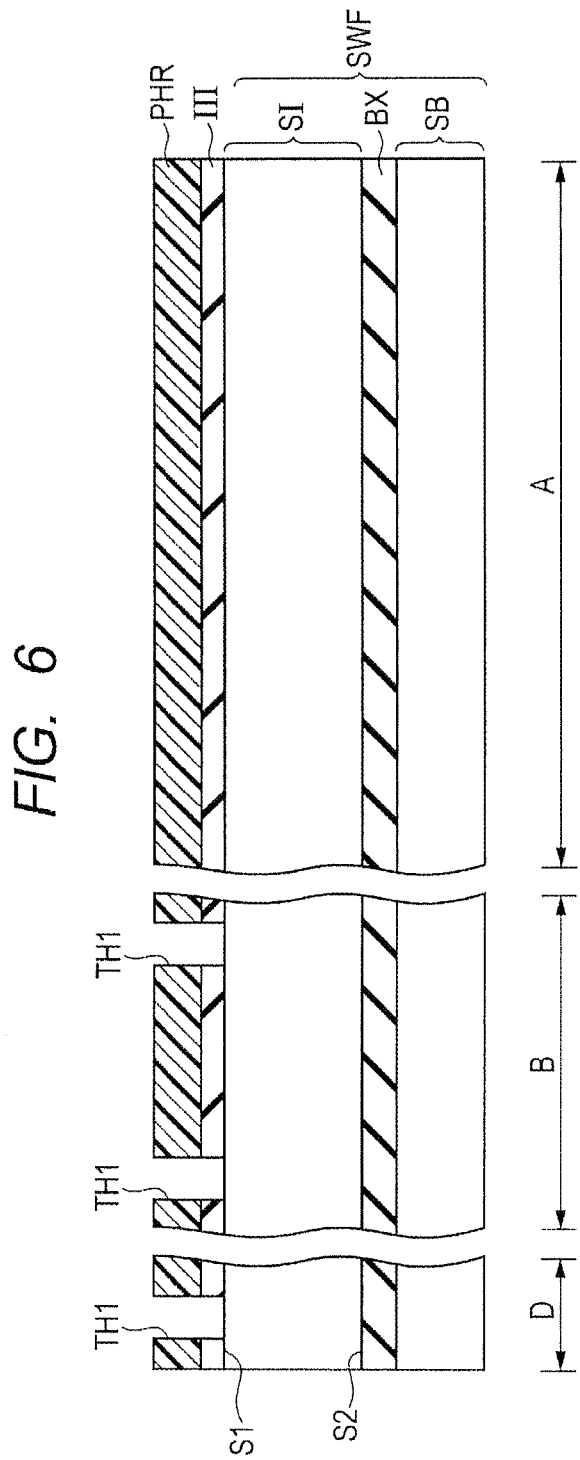
FIG. 6 is a schematic cross sectional view showing a first step of a method for manufacturing a semiconductor device in accordance with First Embodiment.

Referring to FIG. 6, first, there is provided a semiconductor substrate SI having one main surface S1 and the other main surface S2. At this step, there is preferably provided a SOI wafer SWF as a so-called SOI (Silicon on Insulator) substrate in which an insulation film layer BX formed in such a manner as to extend along the main surface S1, and formed of, for example, a silicon oxide film is buried in the inside of the semiconductor substrate SI. However, herein, for convenience of description, the semiconductor substrate on the upper side of the insulation film layer BX in FIG. 6 is referred to as the semiconductor substrate SI shown in FIG. 3 or the like; and the semiconductor substrate on the lower side of the insulation film layer BX in FIG. 6 is referred to as the substrate SB. Accordingly, the substrate SB is formed of the same material as that for the semiconductor substrate SI. Further, the main surface of the semiconductor substrate SI in contact with the insulation film layer BX is referred to as the other main surface S2 similar to the main surface S2 of FIG. 3 or the like.

Then, using, for example, a CVD (Chemical Vapor Deposition) method, over the main surface S1 of the SOI wafer SWF, there is formed a silicon oxide film III. Over the silicon oxide film III, there is applied a photoresist PHR as a photoconductor. By a general photomechanical process technology, the photoresist PHR is patterned in such a manner as to have openings in a region overlapping the region of, particularly, the regions B and D where the mark (mark-like appearance part) MK is to be formed in plan view. Using the patterned photoresist PHR as a mask, the silicon oxide film III is etched. As a result, in the region overlapping the region where the mark (mark-like appearance part) MK is to be formed in plan view, there is formed a trench part TH1.

Incidentally, as described above, the region in the dicing line region D where the marks MK are to be formed is not necessarily required to have a circulating rectangular shape as the region where the mark-like appearance parts MK are to be formed. However, for convenience, the opening to be formed in the region is also expressed as the trench part TH1 as with the opening in the pad region B.

Figure 7:
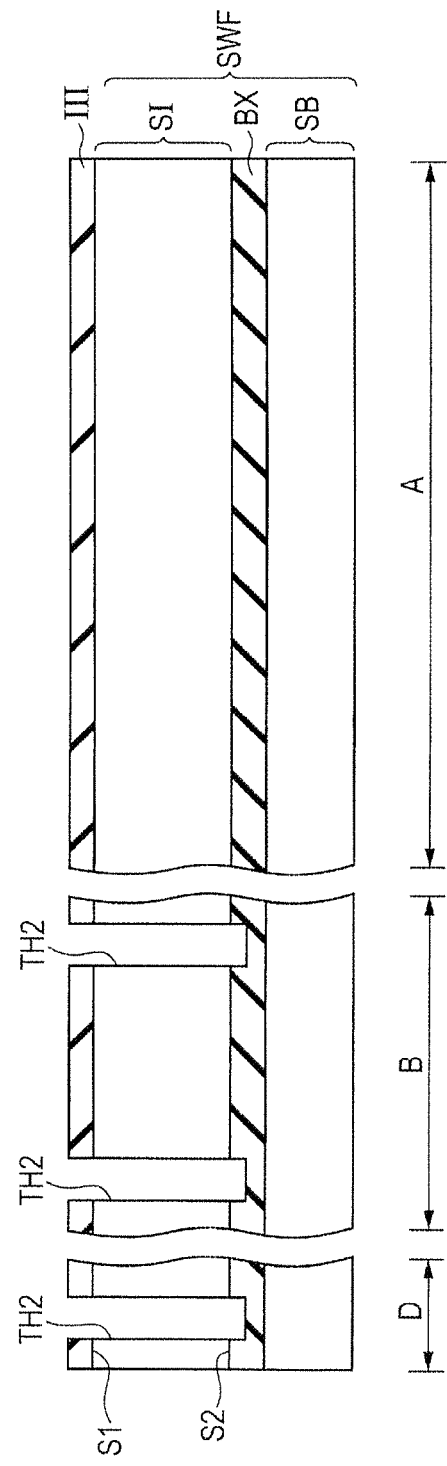
FIG. 7 is a schematic cross sectional view showing a second step of the method for manufacturing a semiconductor device in accordance with First Embodiment.

Referring to FIG. 7, the photoresist PHR is removed by general ashing or the like. Then, using the pattern of the formed silicon oxide film III as a mask, by a general etching technology, trench parts TH2 extending from the one main surface S1 to the other main surface S2 of the semiconductor substrate SI of the SOI wafer SWF are formed immediately under the trench parts TH1 in the regions B and D. At this step, the trench part TH2 is preferably formed in such a manner as to extend beyond the other main surface S2 and to overetch a part (e.g., a depth of about several tens nanometers) of the insulation film layer BX immediately thereunder.

As described up to this point, in the present embodiment, the trench part TH2 (second trench part) for forming the mark-like appearance part MK in the pad region B, and the trench part TH2 (first trench part) for forming the mark MK in the dicing line region D are formed at the same time. As a result, the trench part TH2 (second trench part) for forming the mark-like appearance part MK in the pad region B, and the trench part TH2 (first trench part) for forming the mark MK in the dicing line region D are both formed to the same depth (the depth such that a part of the insulation film layer BX is overetched).

Figure 8:
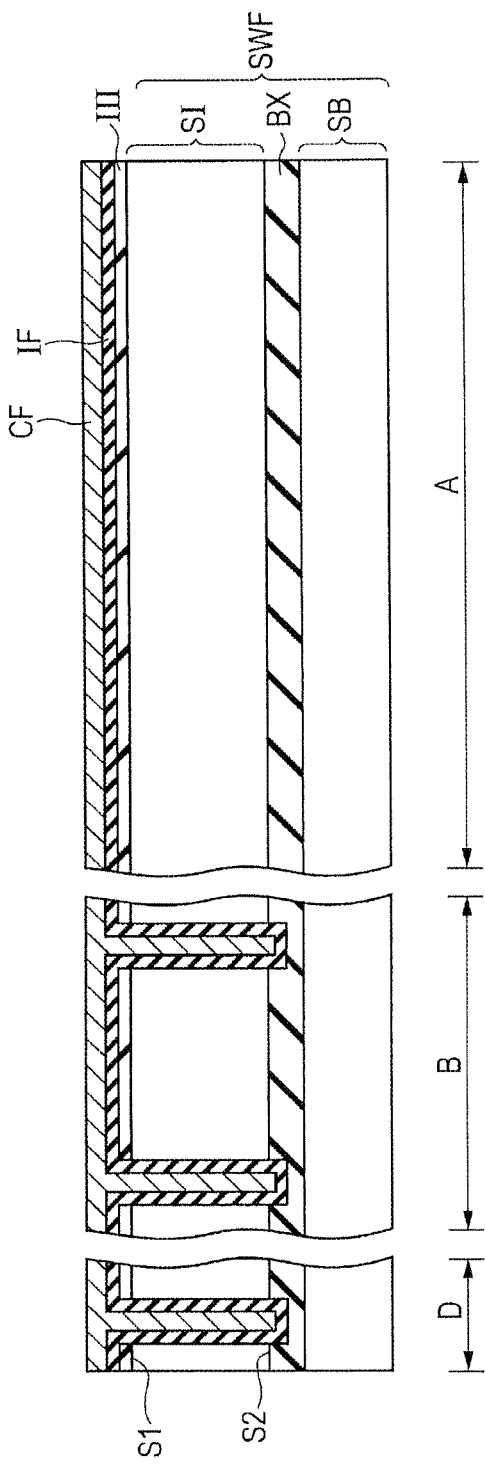
FIG. 8 is a schematic cross sectional view showing a third step of the method for manufacturing a semiconductor device in accordance with First Embodiment.

Referring to FIG. 8, a circumferential insulation film IF is formed by, for example, a CVD method, over the pattern of the silicon oxide film III in such a manner as to cover the entire side surface and the bottom surface of the trench part TH2. Then, an internal conductive film CF is formed by, for example, a CVD method in such a manner as to cover the top surface of the circumferential insulation film IF. The circumferential insulation film IF and the internal conductive film CF fill the inside of the trench part TH2.

Figure 9:
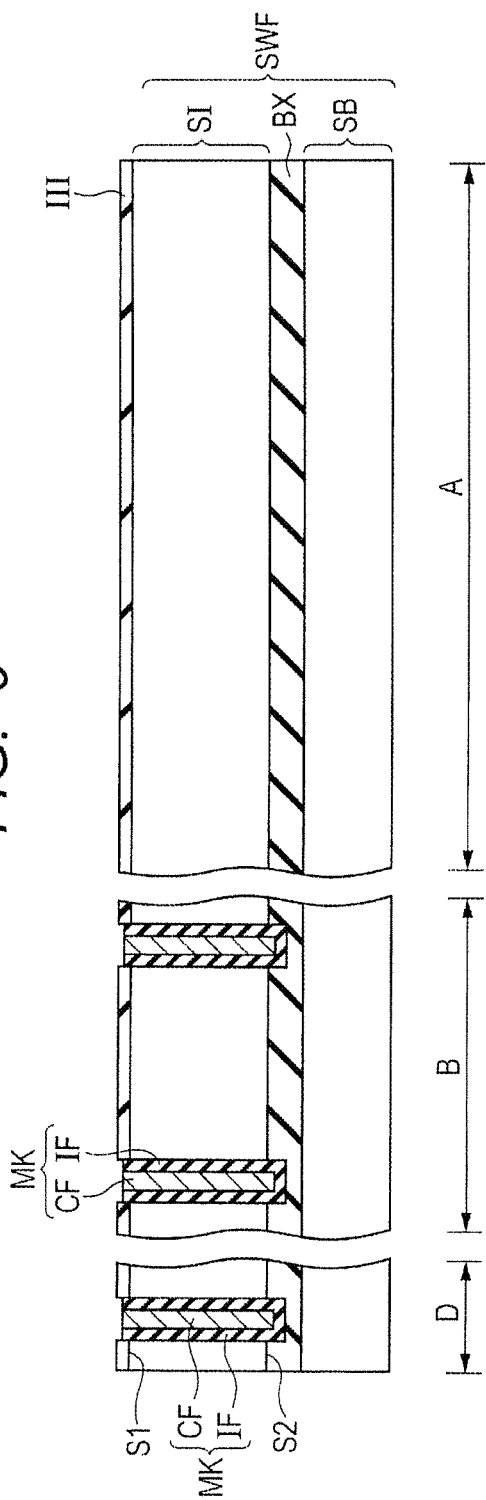
FIG. 9 is a schematic cross sectional view showing a fourth step of the method for manufacturing a semiconductor device in accordance with First Embodiment.

Referring to FIG. 9, by a chemical mechanical polishing method called CMP (Chemical Mechanical Polishing), the circumferential insulation film IF and the internal conductive film CF over the pattern of the silicon oxide film III are removed Thus, polishing is performed so that the surface from which the circumferential insulation film IF and the internal conductive film CF have been removed becomes flattened As a result, in the trench parts TH2, there are formed the mark MK and the mark-like appearance part MK formed of the circumferential insulation film IF and the internal conductive film CF.

In the present embodiment, the mark MK and the mark-like appearance part MK extend in such a manner as to penetrate through the semiconductor substrate SI from the main surface Si to the main surface S2 of the semiconductor substrate SI, and extend in such a manner as to protrude beyond the main surface S2 to the bottom side of the drawing.

Figure 10:
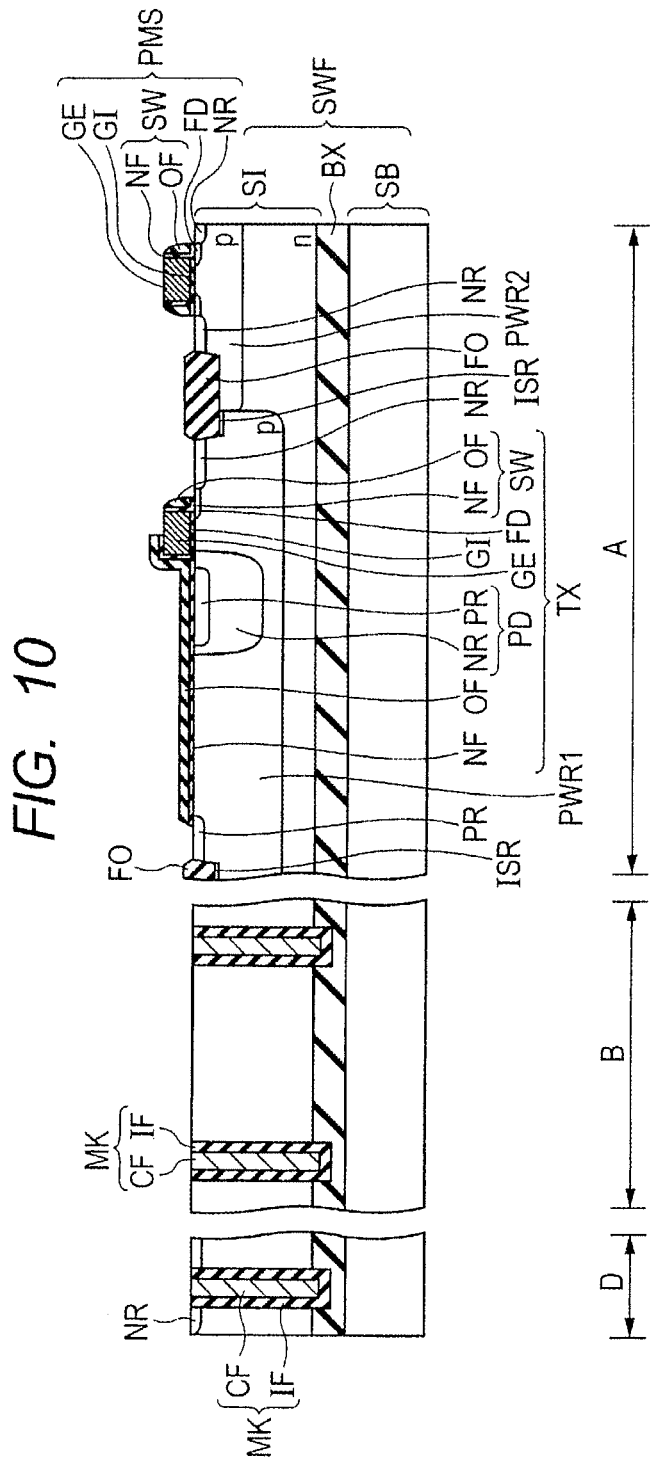
FIG. 10 is a schematic cross sectional view showing a fifth step of the method for manufacturing a semiconductor device in accordance with First Embodiment.

Referring to FIG. 10, then, using a generally known MIS transistor manufacturing technology, in the semiconductor substrate SI in the solid-state image sensing device region A, there are formed the photodiode PD, the capacity region FD, the gate insulation film GI, the gate electrode GE, the field oxide film FO, and the like. As a result, a plurality of transfer transistors TX are formed.

As described up to this point, in the present embodiment, the mark-like appearance part MK is formed before the photodiode PD is formed Further, the mark-like appearance part MK and the mark MK are each formed by the formation of the internal conductive film CF formed of, for example, an impurity-doped polycrystalline silicon inside the circumferential insulation film IF in the trench part TH2.

Figure 11:
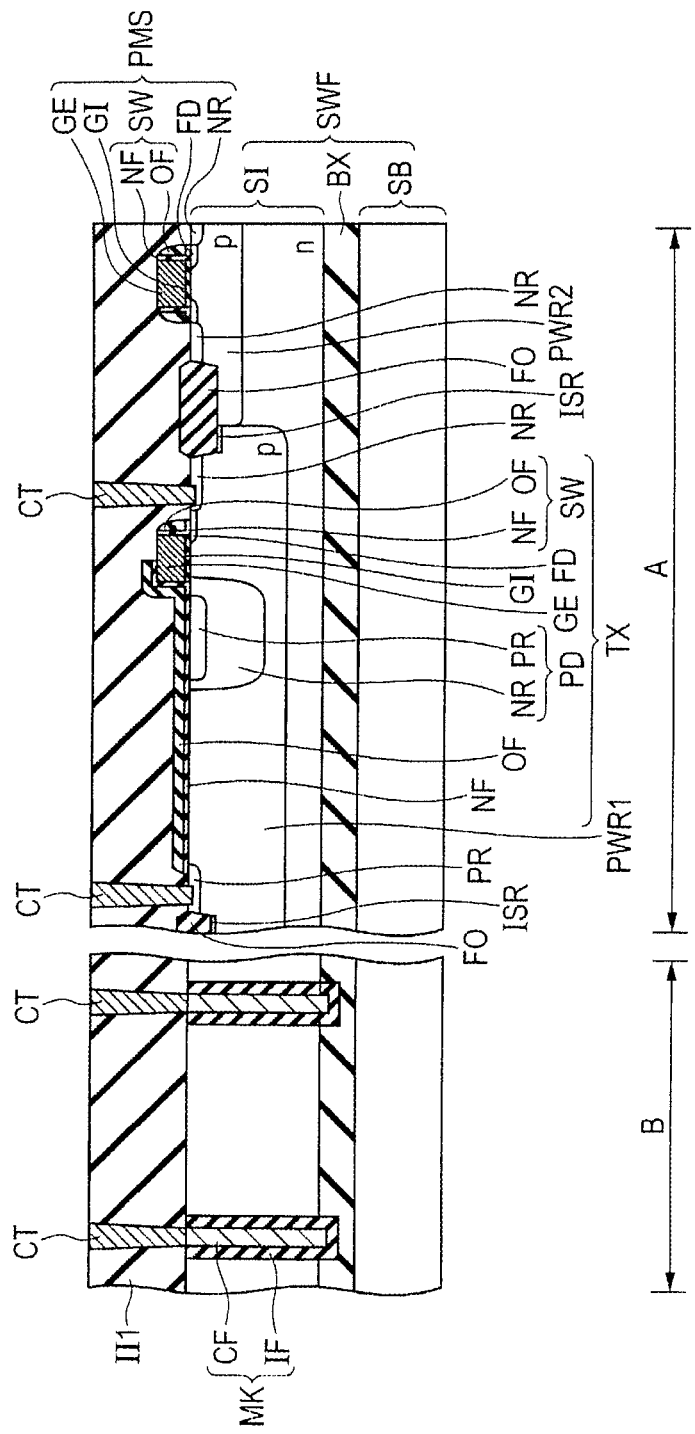
FIG. 11 is a schematic cross sectional view showing a sixth step of the method for manufacturing a semiconductor device in accordance with First Embodiment.

Referring to FIG. 11, both in the regions A and B, an interlayer insulation film II1 is formed by, for example, a CVD method, over the main surface S1 of the semiconductor substrate SI in such a manner as to cover the transfer transistor TX. Then, the interlayer insulation film ill is polished by CMP so that the top surface becomes flattened Further, by a general photomechanical process technology and an etching technology, contact holes are formed in the interlayer insulation film II1 in such a manner as to reach the capacity region FD (the n type impurity region as the drain region of the transfer transistor TX) and the internal conductive film CF of the mark-like appearance part MK. Then, a conductive film formed of, for example, tungsten is filled in the inside of each contact hole. In the treatment, for example, a CVD method is used, and also over the interlayer insulation film II1, there is formed a thin film of tungsten. The thin film of tungsten over the interlayer insulation film II1 is removed by CMP. By the steps up to this point, a contact conductive layer CT is formed in the contact hole.

Figure 12:
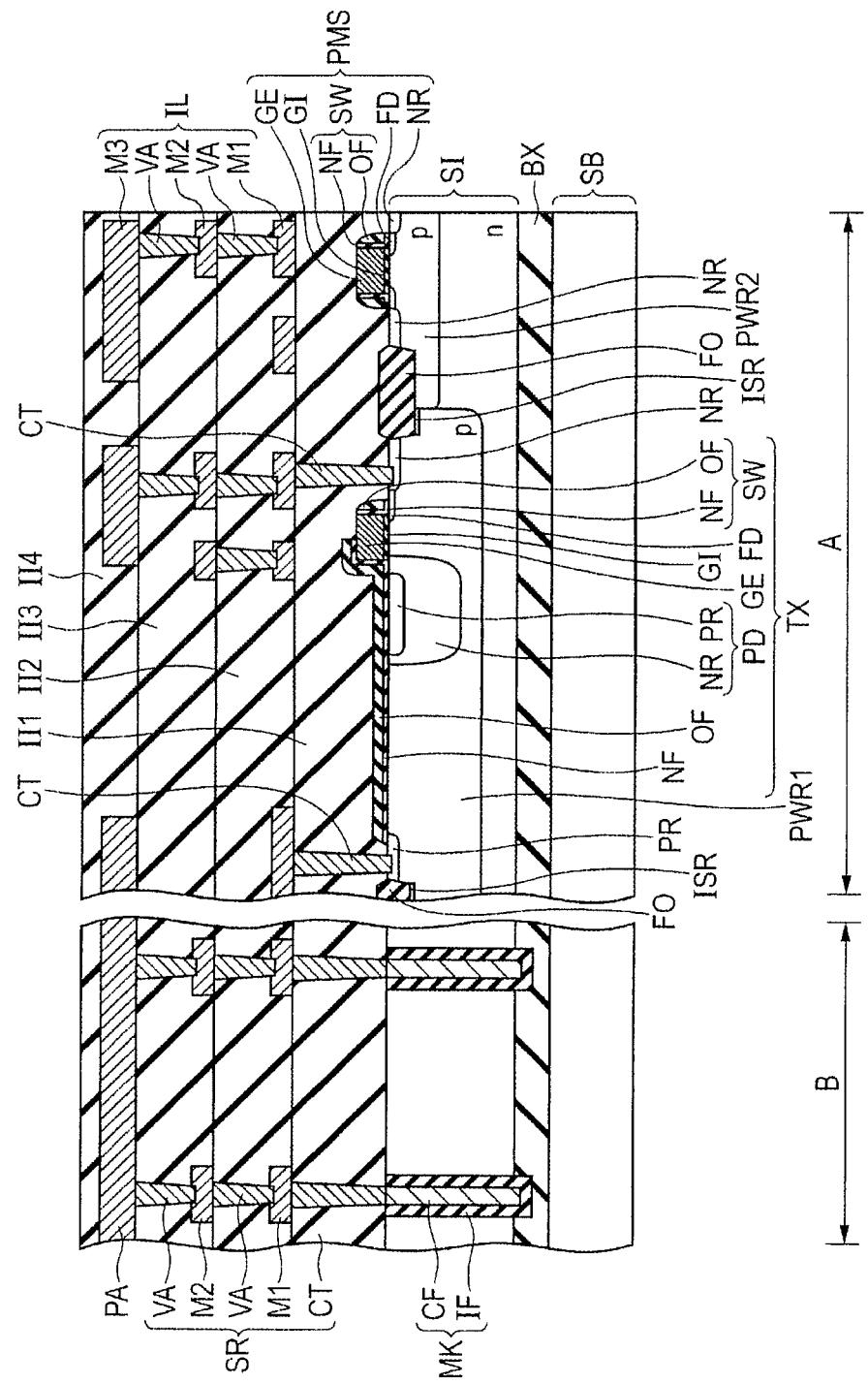
FIG. 12 is a schematic cross sectional view showing a seventh step of the method for manufacturing a semiconductor device in accordance with First Embodiment.

Referring to FIG. 12, over the interlayer insulation film II1, a thin film formed of, for example, aluminum or copper is formed by, for example, sputtering. Then, by a general photomechanical process technology and an etching technology, in respective regions A and B, a metal wire M1 is formed in such a manner as to cover the contact conductive layer CT.

Then, although a detailed description is omitted, on the one main surface S1 side of the semiconductor substrate SI, in the same manner as with the formation of the interlayer insulation film II1, the contact conductive layer CT, and the metal wire M1, there are formed interlayer insulation films II2, II3, and II4, a via layer VA, metal wires M1 to M3, and a pad electrode PA (the via layer VA is formed in the same procedure as with the contact conductive layer CT). Therefore, the same constituent elements in respective regions A and B are formed by the same treatment at the same time (the metal wire M3 in the region A and the pad electrode PA in the region B are the same). Namely, at least a part of the step of forming the coupling part SR in the region B is performed simultaneously with the step of forming the wiring layer IL in the region A. As a result, the metal wires M1 and M2 of the coupling part SR and the pad electrode PA (at least a part of the coupling part) is formed in such a manner as to include the same layer as the metal wires M1 to M3 forming the wiring layer IL (at least a part of the metal wires) electrically coupled with the photodiode PD in the region A.

Incidentally, the contact conductive layer CT and the via layer VA may be formed of, other than the tungsten, for example, titanium, titanium nitride, or copper. Further, in the foregoing description, over the main surface S1 of the semiconductor substrate SI, three layers of the interlayer insulation films II2, II3, and II4 are formed. However, the number of layers to be formed of the interlayer insulation film is not limited thereto.

As a result, in the region A, there is formed the wiring layer IL. Whereas, in the region B, at the position overlapping the mark-like appearance part MK, there is formed the pad electrode PA, and there is formed the coupling part SR coupling the pad electrode PA and the mark-like appearance part MK. Incidentally, the coupling part SR and the mark-like appearance part MK are preferably formed in such a manner as to overlap the relatively outer region of the pad electrode PA in plan view.

Incidentally, although not shown, the metal wires M1 to M3, the via layer VA, and the contact conductive layer CT forming the seal ring SR in the seal ring region C are also formed simultaneously with and as the same layer as the wiring layer IL in the solid-state image sensing device region A, and the metal wires M1 to M3, the via layer VA, and the like forming the coupling part SR in the pad region B.

Figure 13:
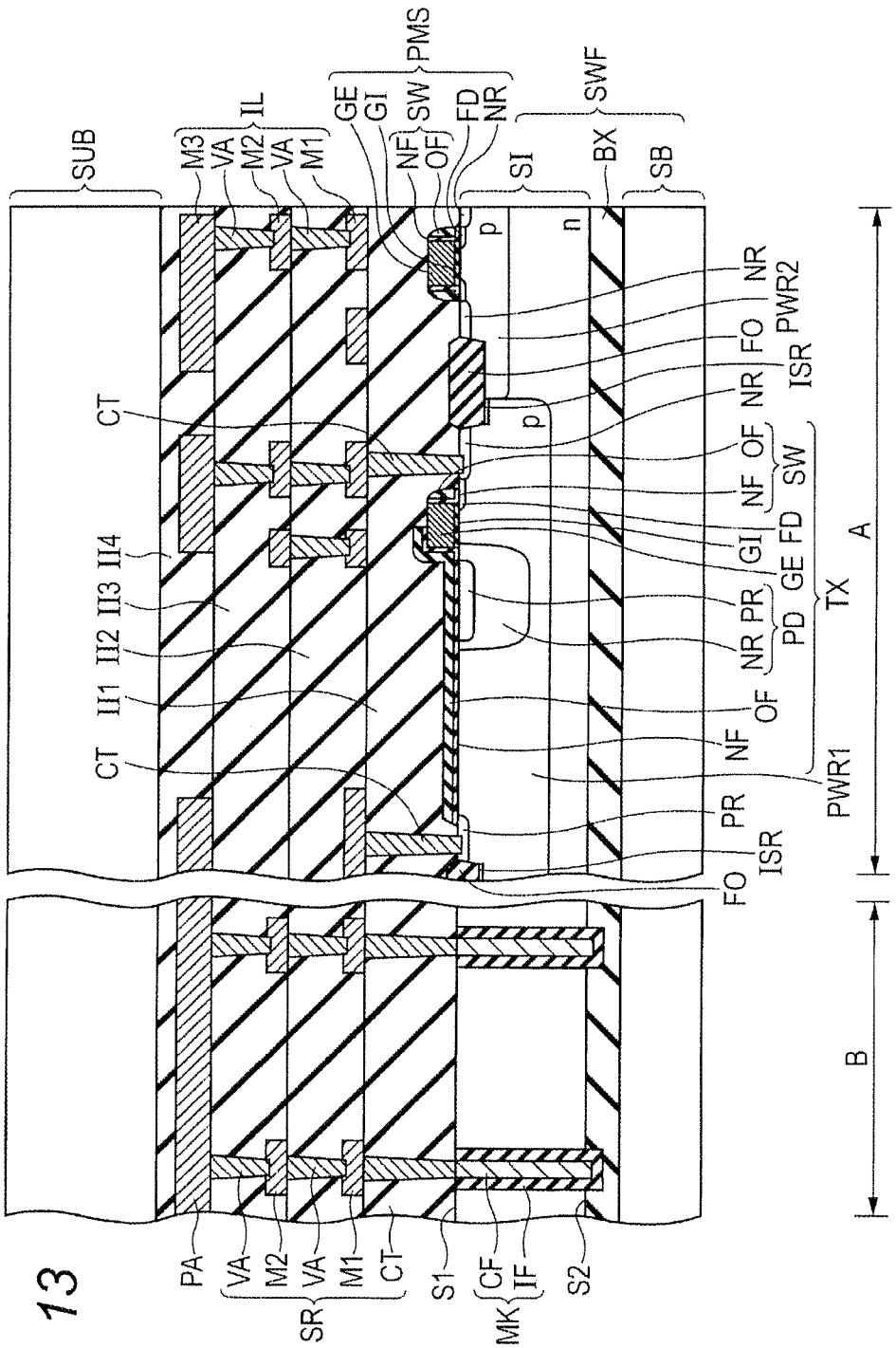
FIG. 13 is a schematic cross sectional view showing an eighth step of the method for manufacturing a semiconductor device in accordance with First Embodiment.

Referring to FIG. 13, over the top surface of the interlayer insulation film II4 polished so as to become flattened at the top surface by CMP, an adhesion layer formed of, for example, a silicon oxide film not shown is formed by, for example, a CVD method.

Further, there is provided a support substrate SUB formed of, for example, silicon including an n type impurity, distinct from the SOI wafer SWF. Over one main surface of the support substrate SUB, an adhesion layer formed of, for example, a silicon oxide film, not shown is formed by, for example, a CVD method Then, with the adhesion layer over the top surface of the interlayer insulation film II4 and the adhesion layer over the main surface of the support substrate SUB in contact with each other in such a manner as to face each other, both are bonded by a general bonding technology.

Figure 14:
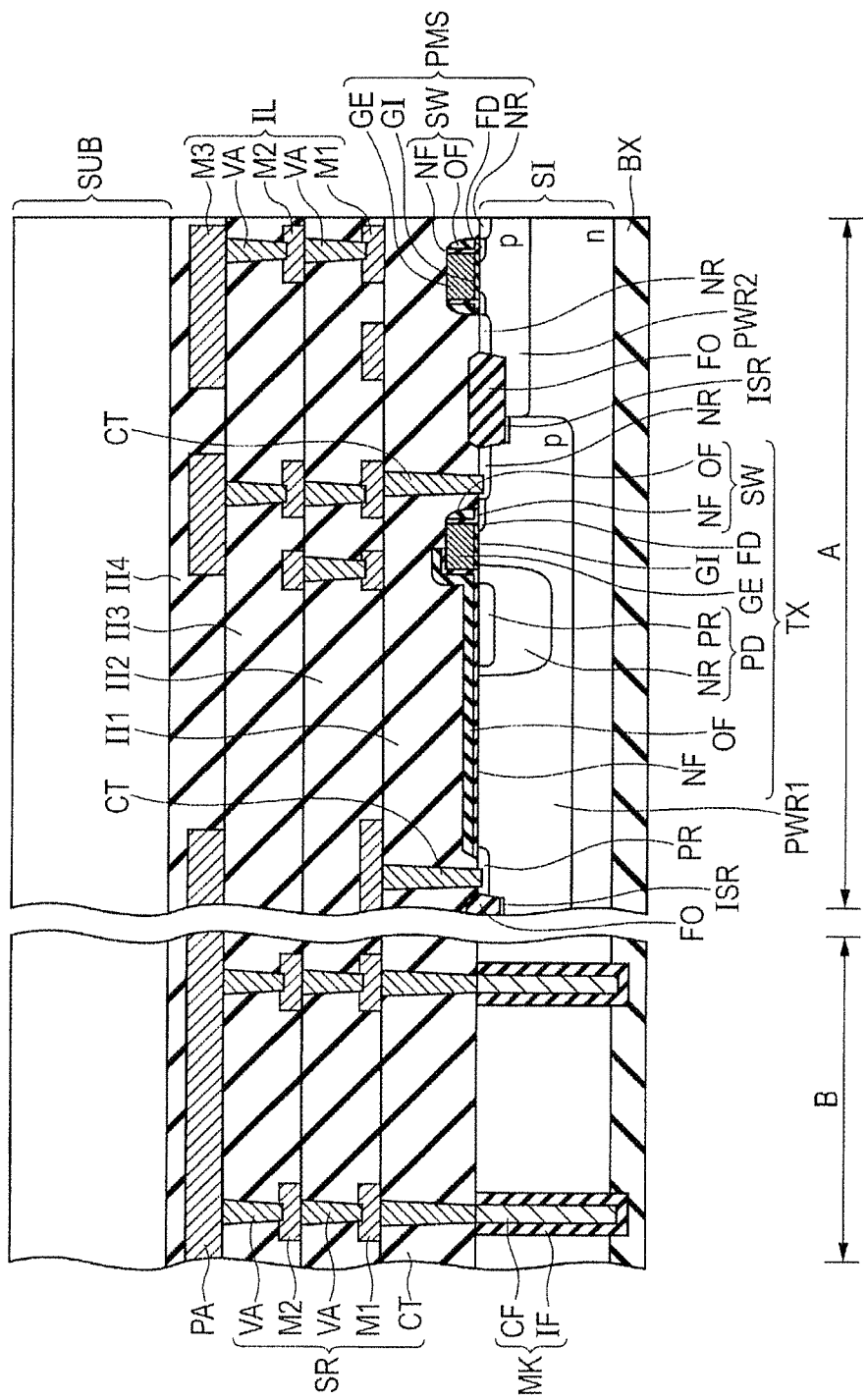
FIG. 14 is a schematic cross sectional view showing a ninth step of the method for manufacturing a semiconductor device in accordance with First Embodiment.

Referring to FIG. 14, polishing is performed by, for example, CMP in such a manner as to expose at least the top surface of the insulation film layer BX. As a result, the substrate SB is removed Then, in order to remove the remains of the substrate SB, general wet etching is performed using, for example, an alkali solution, thereby to almost fully remove the substrate SB. This results in exposure of the surface of the insulation film layer BX with a high flatness. At this step, the insulation film layer BX functions as an etching stopper.

Figure 15:
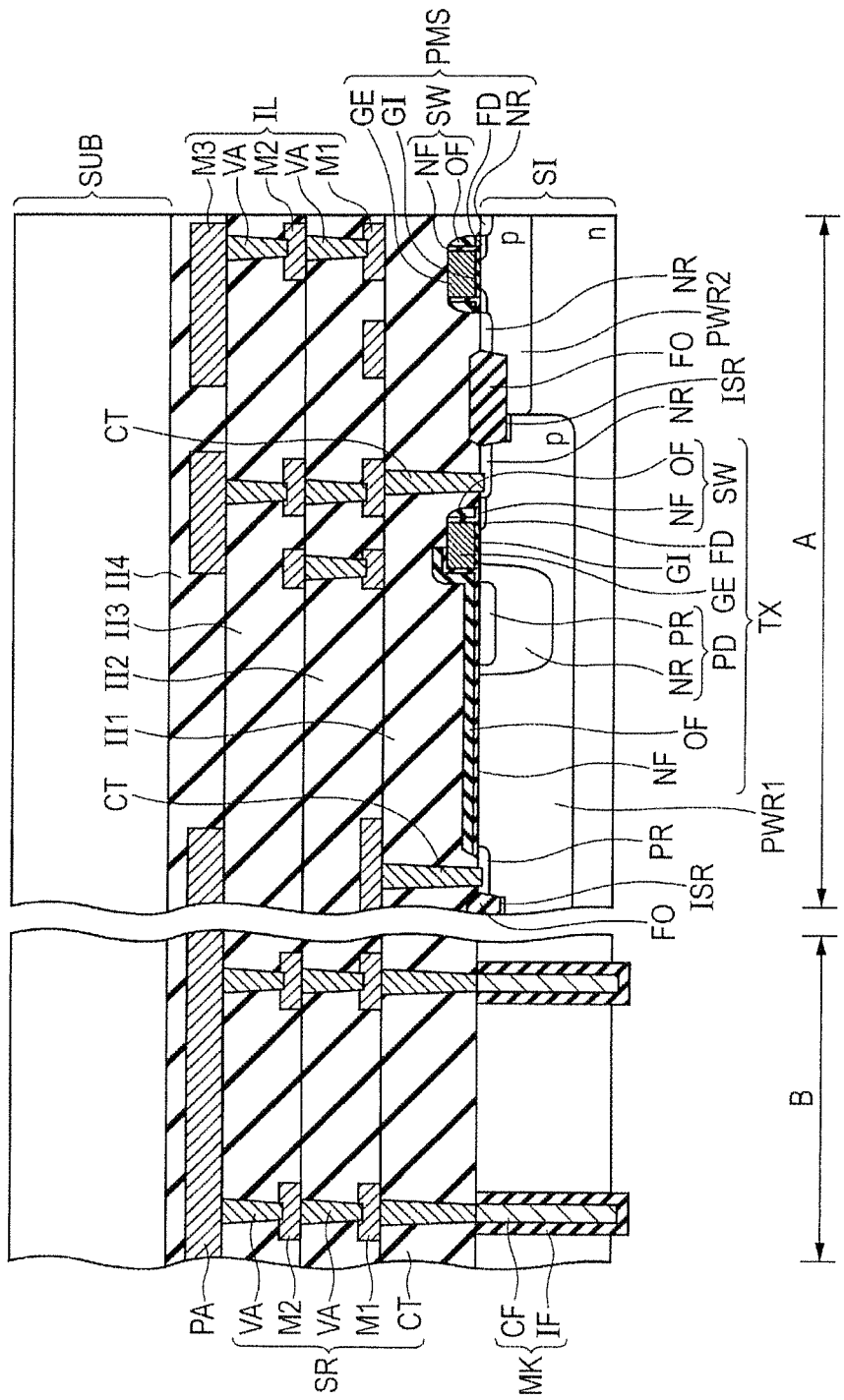
FIG. 15 is a schematic cross sectional view showing a tenth step of the method for manufacturing a semiconductor device in accordance with First Embodiment.

Referring to FIG. 15, polishing by, for example, CMP is performed until at least the bottom surface of the mark-like appearance part MK in the pad region B is exposed. As a result, the insulation film layer BX formed of a silicon oxide film is removed. Then, in order to remove the remains of the insulation film layer BX, general wet etching is performed using, for example, a hydrofluoric acid type chemical solution. Incidentally, as shown in FIG. 15, the insulation film layer BX may be fully removed until the semiconductor substrate SI is exposed However, it is also acceptable as follows: the insulation film layer BX is removed until the bottom surface of the mark-like appearance part MK is exposed, so that the insulation film layer BX reduced in thickness remains. Further, although not shown, also in the dicing line region D, as in the pad region B, the insulation film layer BX is removed until at least the bottom surface of the mark MK is exposed.

Figure 16:
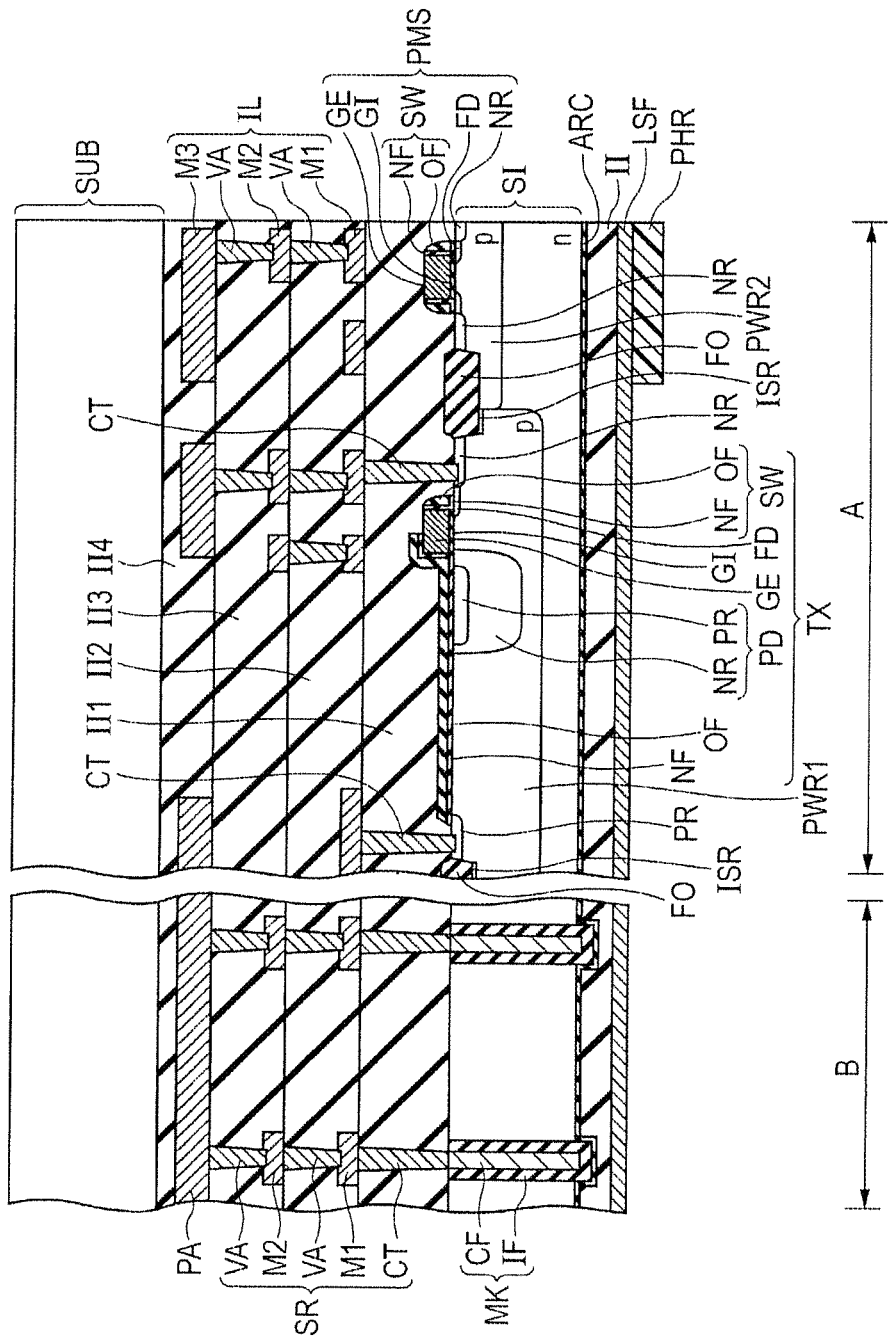
FIG. 16 is a schematic cross sectional view showing an eleventh step of the method for manufacturing a semiconductor device in accordance with First Embodiment.

Referring to FIG. 16, the antireflection film ARC, the interlayer insulation film II, and the light shielding film LSF are stacked in this order over the semiconductor substrate SI (or the insulation film layer BX reduced in thickness) in such a manner as to cover the bottom surface of the mark-like appearance part MK exposed in the step of FIG. 15. Incidentally, although not shown, first, a thin silicon oxide film may be formed before the formation of the antireflection film ARC.

Then, by a general photomechanical process technology, there is formed a pattern of the photoresist PHR for a pattern of the light shielding film LSF to be formed in, particularly, a region not overlapping the photodiode PD in plan view.

Figure 17:
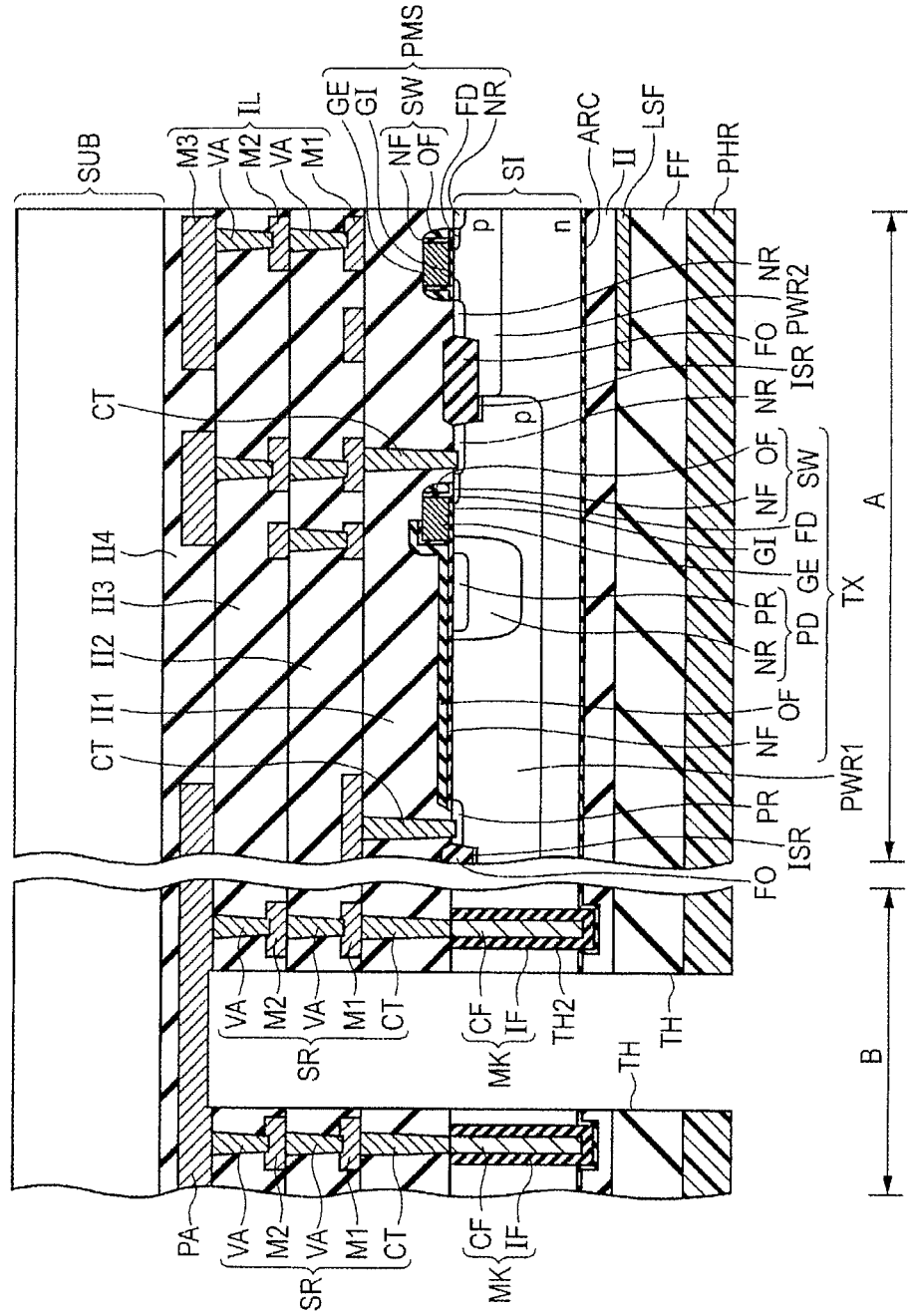
FIG. 17 is a schematic cross sectional view showing a twelfth step of the method for manufacturing a semiconductor device in accordance with First Embodiment.

Referring to FIG. 17, first, by a general etching technology using the pattern of the photoresist PHR, the pattern of the light shielding film LSF is formed After removal of the photoresist PHR, a planarization film FF is formed over the interlayer insulation film II in such a manner as to cover the light shielding film LSF.

Then, over the planarization film FF, the photoresist PHR is applied. By a general photomechanical process technology and an etching technology, there is formed an opening TH penetrating from the planarization film FF through the interlayer insulation film II, the antireflection film ARC, the semiconductor substrate SI, and the interlayer insulation films II1 to II3, and reaching a part of the surface of the pad electrode PA in such a manner as to expose at least a part of the surface of the pad electrode PA on the other main surface S2 side (the bottom side of the drawing). The opening TH is formed in the inside of the mark-like appearance part MK and the coupling part SR. Conversely, the mark-like appearance part MK and the coupling part SR are formed in such a manner as to cover at least a part of the outer circumference of the opening TH in plan view.

Figure 18:
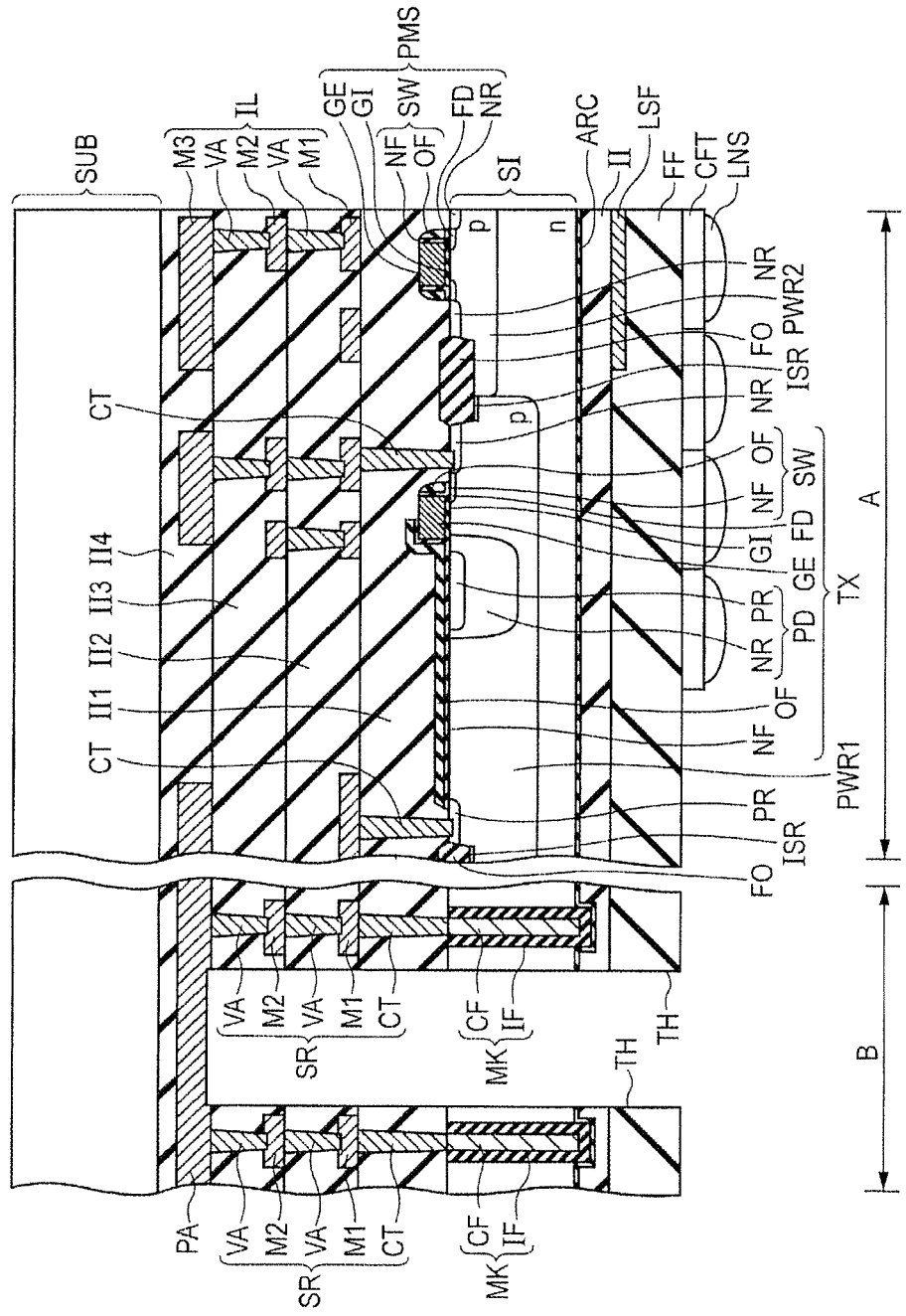
FIG. 18 is a schematic cross sectional view showing a thirteenth step of the method for manufacturing a semiconductor device in accordance with First Embodiment.

Referring to FIG. 18, at the top surface (e.g., the region overlapping the photodiode PD in plan view) of the planarization film FF in the region A, there are formed color filters CFT and microlenses LNS. The positions at which these are formed are adjusted by visually identifying, for example, the mark MK in the dicing line region D (or the mark-like appearance part MK in the pad region B) from above the planarization film FF.

Then, referring to FIGS. 19 and 20, a description will be given to the advantageous effects of the present embodiment.

Figure 19:
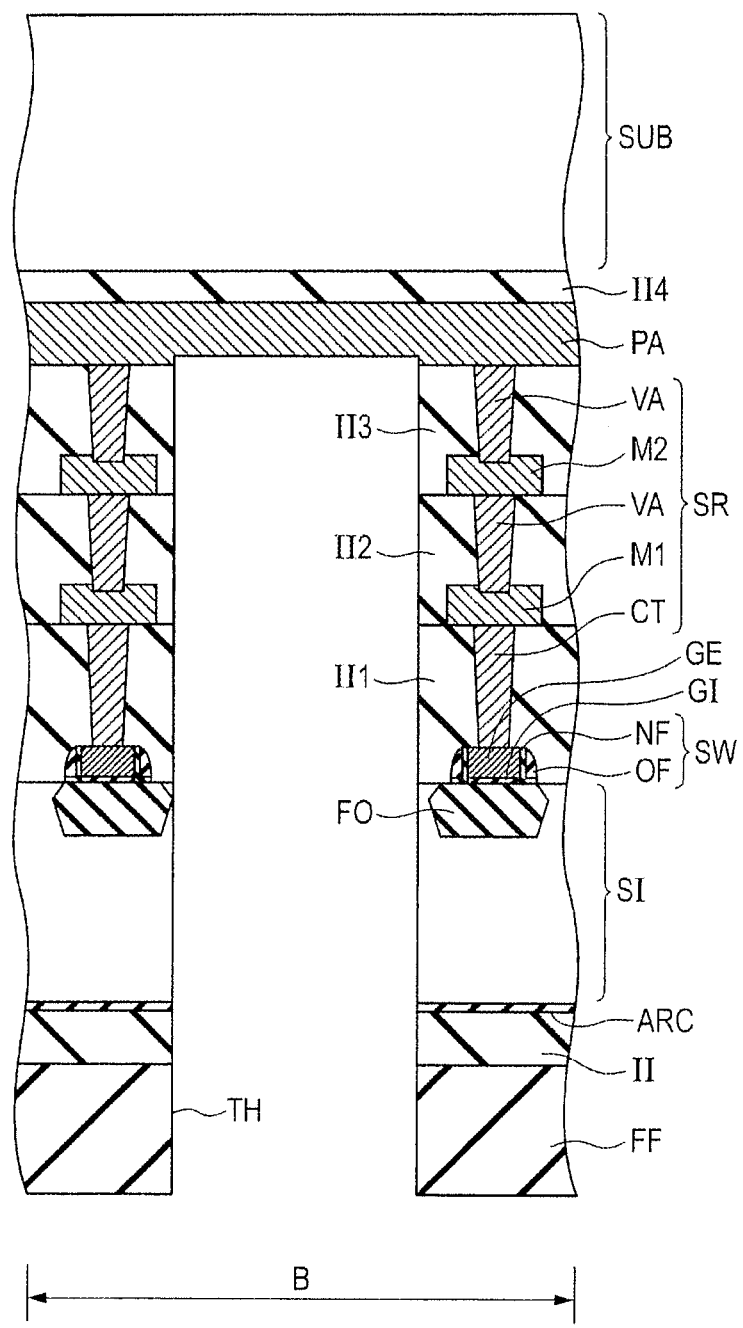
FIG. 19 is a schematic cross sectional view simply showing the configuration of a pad region B of Comparative Example.

Referring to FIG. 19, in Comparative Example, in the pad region B, (the coupling part SR coupled with) the pad electrode PA, and the semiconductor substrate SI (fixed at ground potential) are electrically insulated by a field oxide film FO arranged between the coupling part SR and the semiconductor substrate SI. An electric signal from the pad electrode PA is transferred to the gate electrode GE of the MIS transistor through the coupling part SR.

The field oxide film FO is low in moisture resistance. Accordingly, even when the seal ring SR in the seal ring region C can suppress the intrusion of moisture from the edge EGE to the inside of the chip region IMC, the moisture may pass along the field oxide film FO through the opening TH, to intrude into the inside of the photodiode PD or the like of the semiconductor substrate SI with ease. The phenomenon becomes more likely to occur, particularly, for example, when the distance from the left-hand side end to the right-hand side end of the field oxide film FO of FIG. 19 is short.

Figure 20:
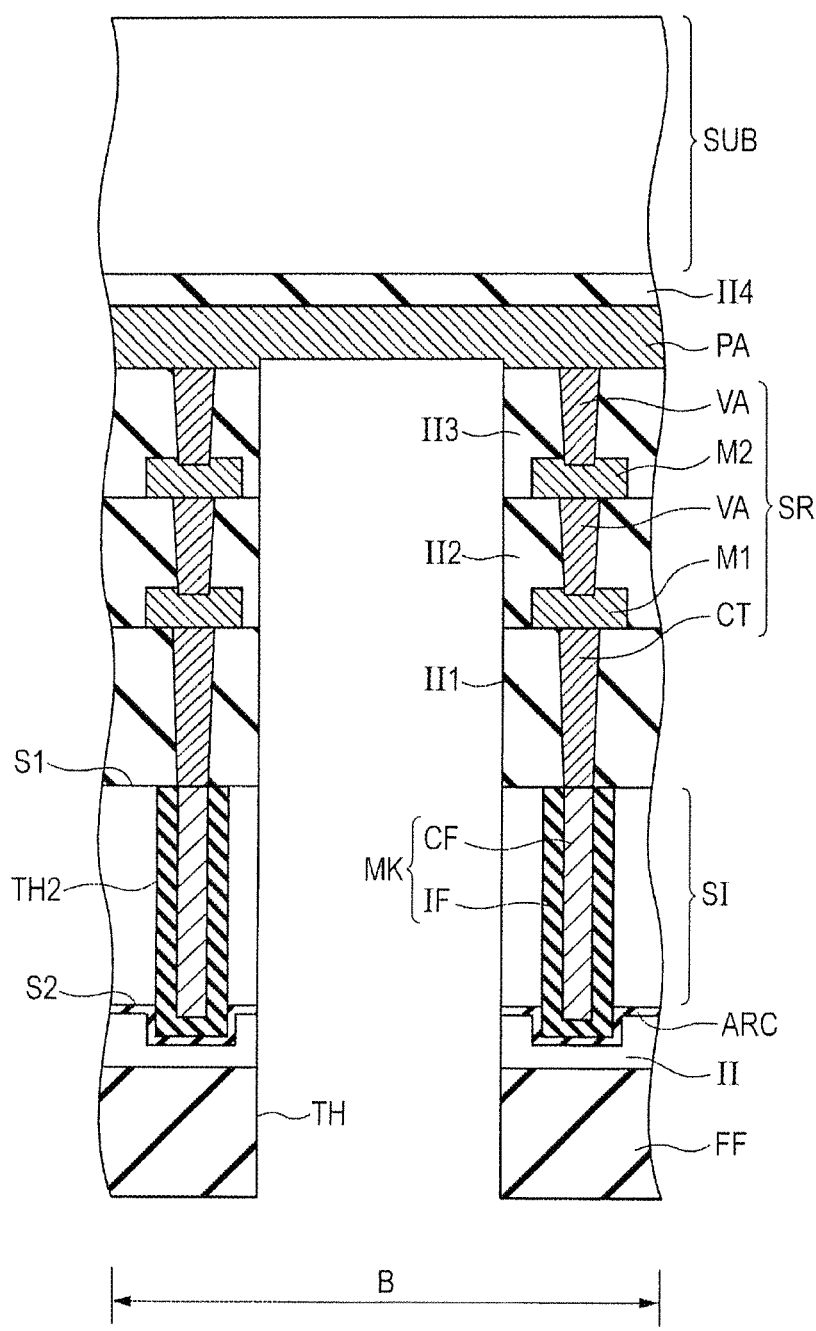
FIG. 20 is a schematic cross sectional view simply showing the configuration of a pad region B of First Embodiment.

Referring to FIG. 20, thus, in the present embodiment, the electrical insulation between the coupling part SR coupled to the pad electrode PA and the semiconductor substrate SI is implemented by the mark-like appearance part MK including the insulation film IF covering the entire side surface and the bottom surface of the trench part TH2. In this case, for example, the moisture to enter the inside of the semiconductor substrate SI through the opening TH does not intrude into the semiconductor substrate SI, unless the moisture travels at the insulation film IF in such a manner as to run one round along the side surface of the trench part TH in the mark-like appearance part MK. Further, in the coupling part SR, the conductive metal wires M1 to M3 and the via layer VA can suppress intrusion of the moisture. From the description up to this point, the present embodiment can more enhance the effect of suppressing intrusion of the moisture into the semiconductor substrate SI through the opening TH of the pad electrode PA by the coupling part SR and the mark-like appearance part MK as compared with the case using the field oxide film FO of FIG. 19.

In the mark-like appearance part MK of the present embodiment, the circumferential insulation film IF is formed in such a manner as to entirely cover the side surface and the bottom surface of the trench part TH2. However, even when the circumferential insulation film IF is formed in such a manner as to entirely cover only the side surface, there is formed the path for moisture with at least a length equivalent to the depth of the trench part TH2 (generally larger than the width of the field oxide film FO). For this reason, as compared with at least the field oxide film FO, the effect of suppressing the intrusion of moisture is more enhanced Accordingly, it is possible to ensure the high reliability of the semiconductor device.

Namely, in the present embodiment, the intrusion of moisture from the edge EGE into the inside in the chip region IMC is suppressed by the seal ring SR in the seal ring region C. In addition, the intrusion of moisture through the opening TH of the pad electrode PA is suppressed by the coupling part SR and the mark-like appearance part MK in the pad region B. For this reason, it is possible to suppress the intrusion of moisture into the inside of the semiconductor device with more reliability.

Further, the mark-like appearance part MK has a configuration including the conductive film CF inside the insulation film IF in the trench part TH2. The conductive film CF is higher in water resistance than the insulation film IF. This further enhances the effect of blocking the moisture to intrude into the semiconductor substrate SI through the opening TH at the mark-like appearance part MK as described above. The presence of the conductive film CF makes it impossible for the moisture to intrude into the mark-like appearance part MK of FIG. 20 sideways. For this reason, for example, in the configuration of FIG. 20, moisture cannot intrude into the semiconductor device until the moisture runs one round along the circumferential insulation film IF covering the entire side surface and the bottom surface of the trench part TH2. The mark-like appearance part MK having such a circumferential insulation film IF and an internal conductive film CF, and the coupling part SR are arranged in such a manner as to surround the entire outer circumference of the opening TH in plan view. This still further enhances the effect of suppressing the intrusion of moisture into the inside through the opening TH by the mark-like appearance part MK and the like.

The mark-like appearance part MK is formed in such a manner as to penetrate through the semiconductor substrate SI from the one main surface S1 to the other main surface S2 of the semiconductor substrate SI. For this reason, the mark-like appearance part MK becomes possible to be used as an alignment mark as seen from the other main surface S2 side of the semiconductor substrate SI as with the mark MK in the dicing line region D (similarly penetrating through the semiconductor substrate SI). Accordingly, the mark-like appearance part MK can combine the function as an alignment mark with the function of ensuring the insulation property of the pad electrode PA from the semiconductor substrate SI.

The shape of the mark-like appearance part MK penetrating through the semiconductor substrate SI becomes formable by the formation of the mark-like appearance part MK and the mark MK as an alignment mark in the dicing line region D as the same layer at the same time. Further, by forming the mark MK and the mark-like appearance part MK at the same time as described above, it is possible to form the mark-like appearance part MK using the existing step (the step of forming the mark MK), (without adding another step). This leads to the step reduction and the cost reduction.

Further, at least a part (such as the metal wires M1 and M2) of the coupling part SR in the pad region B are formed in such a manner as to include the same layer as at least a part (such as the metal wires M1 and M2) of the wiring layer IL in the solid-state image sensing device region A. For this reason, it is possible to form the coupling part SR using the existing step (the step of forming the wiring layer IL), (without adding another step). This leads to the step reduction and the cost reduction.

Further, in the present embodiment, the mark-like appearance part MK is formed before the photodiode PD. Accordingly, the number of steps can be more reduced than in the case of the reverse order thereof.

Further, in the present embodiment, for example, as compared with the case where the mark-like appearance part MK is not formed in the pad region B, the area to be etched is more increased when the trench parts TH2 for forming the mark-like appearance part MK and the mark MK are formed at the same time. For this reason, the controllability of etching is improved.

Second Embodiment

First, referring to FIG. 21, a description will be given to the configuration of, particularly, the solid-state image sensing device region A and the pad region B of a semiconductor device of the present embodiment.

Figure 21:
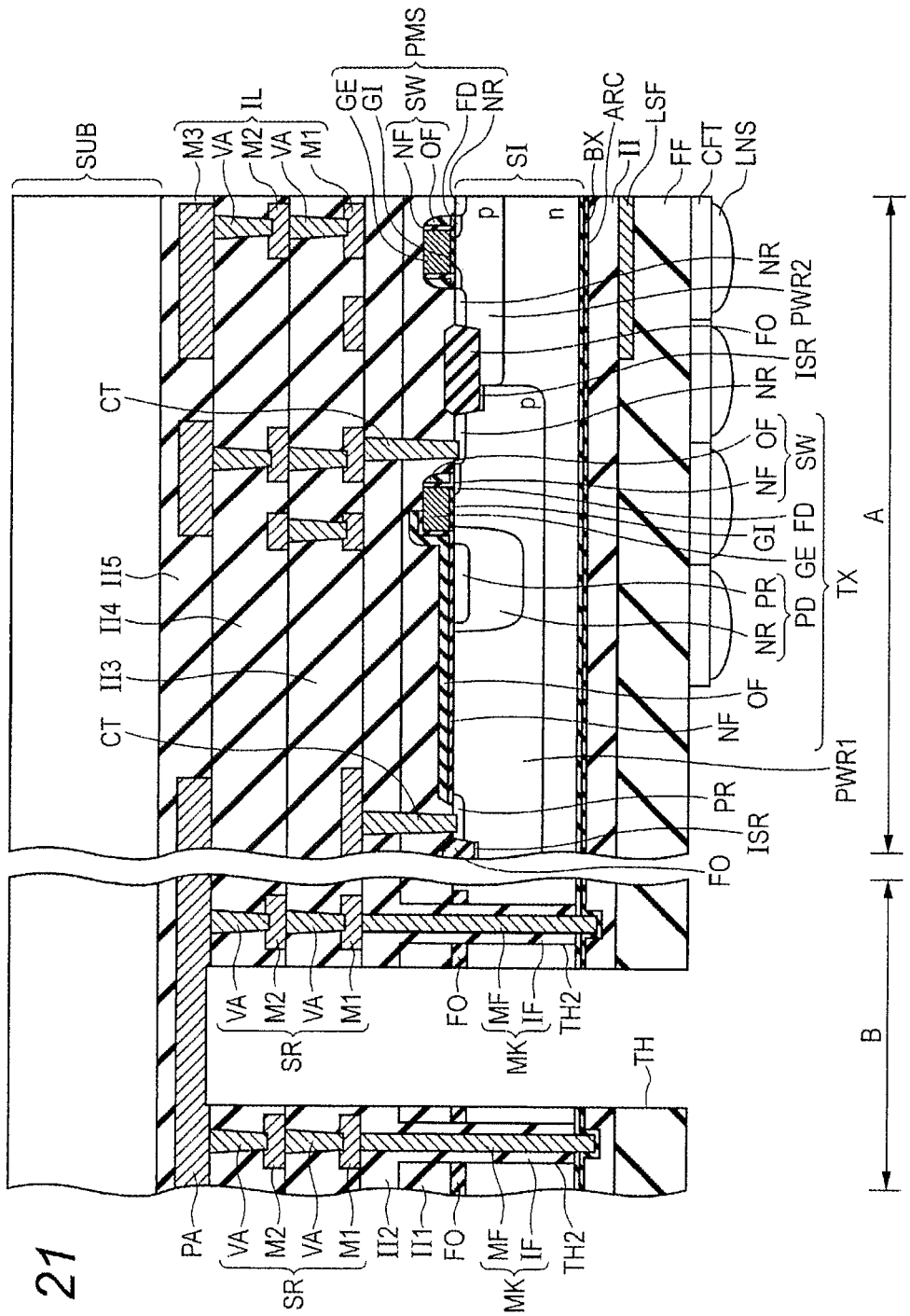
FIG. 21 is a schematic cross sectional view simply showing the configuration of the regions A and B shown in FIG. 2 of a semiconductor device in accordance with Second Embodiment.

Referring to FIG. 21, the present embodiment is mainly different in configuration of the mark-like appearance part MK in the pad region B from First Embodiment.

Specifically, the mark-like appearance part MK is formed of a circumferential insulation film IF (insulation film) and an internal metal film MF (conductive film) in the trench part TH2. The internal metal film MF is formed as the same layer as the contact conductive layer CT in the solid-state image sensing device region A, and is formed of, for example, a thin film of tungsten which is a metal material.

Over the main surface S1 of the semiconductor substrate SI, interlayer insulation films II1 and II2 are stacked in this order. The internal metal film MF (and a contact conductive layer CT which is the same layer as this) penetrate(s) through the interlayer insulation film II2 and the interlayer insulation film II1. The internal metal film MF further penetrates through the semiconductor substrate SI from the main surface S1 to the main surface S2 of the semiconductor substrate SI in the thickness direction, and further protrudes from the main surface S2 toward the bottom side of the drawing.

The circumferential insulation film IF is formed as the same layer as the interlayer insulation film II2 in such a manner as to entirely cover the inside of the interlayer insulation film II1 and the side surface of the trench part TH2 extending from the main surface S1 to the main surface S2 of the semiconductor substrate SI. However, the circumferential insulation film IF may also be formed in such a manner as to cover even the bottom surface of the trench part TH2.

In FIG. 21, the internal metal film MF extends not only in the trench part TH2 but also further in the region at the same layer as the interlayer insulation film II2, and further to the lower side of the drawing than the main surface S2 of the semiconductor substrate SI. In the present embodiment, it may be considered that the internal metal film MF outside the trench part TH2 inclusive forms the mark-like appearance part MK. Alternatively, it may be considered that only the internal metal film MF in the trench part TH2 forms the mark-like appearance part MK.

In the present embodiment, in respective regions A and B, over the interlayer insulation film II2, there is formed a metal wire M1; over the interlayer insulation film II3, there is formed a metal wire M2; and over the interlayer insulation film II4, there are formed a metal wire M3 and a pad electrode PA. A via layer VA is formed in such a manner as to couple the respective metal wires M1 to M3. Namely, the metal wires M1 to M3 of the present embodiment are arranged at higher layers than the metal wires M1 to M3 of First Embodiment, respectively, each by one layer of the interlayer insulation film. Alternatively, a field oxide film FO may be formed in the main surface Si of the semiconductor substrate SI in the region B.

Also in the present embodiment, as in First Embodiment, the opening TH in the pad region B is formed in such a manner as to extend from the surface of the planarization film FF on the bottom side of the drawing (from the other main surface S2 side of the semiconductor substrate SI) in the vertical direction of the drawing, and to reach the pad electrode PA. The mark-like appearance part MK and the coupling part SR in the pad region B are arranged in such a manner as to rectangularly surround the entire outer circumference of the opening TH in plan view.

Incidentally, although not shown, the seal ring region C of the present embodiment has basically the same configuration as that of the seal ring region C of First Embodiment (see FIG. 3) (except that the metal wires M1 to M3 are arranged at higher layers, respectively, each by one layer of the interlayer insulation film). Whereas, the dicing line region D of the present embodiment has basically the same configuration as that of the dicing line region D of First Embodiment (see FIG. 3) (except that the metal wires M1 to M3 are arranged at higher layers, respectively, each by one layer of the interlayer insulation film). However, in the dicing line region D, the mark MK has the same form (the circumferential insulation film IF and the internal metal film MF in the trench part TH2) as that of the mark-like appearance part MK in the pad region B. A field oxide film FO is formed in the main surface S1 of the semiconductor substrate SI.

Incidentally, other configurations of the present embodiment than these are almost the same as the configurations of First Embodiment. For this reason, the same elements are given the same reference numerals and signs, and a description thereon will not be repeated.

Then, referring to FIGS. 22 to 30, a description will be given to a method for manufacturing the semiconductor device of the present embodiment (see FIG. 21) described up to this point. However, for convenience of description, in FIGS. 22 to 27, the regions A, B, and D are shown. In contrast, in FIGS. 28 to 30, only the regions A and B are shown.

Figure 22:
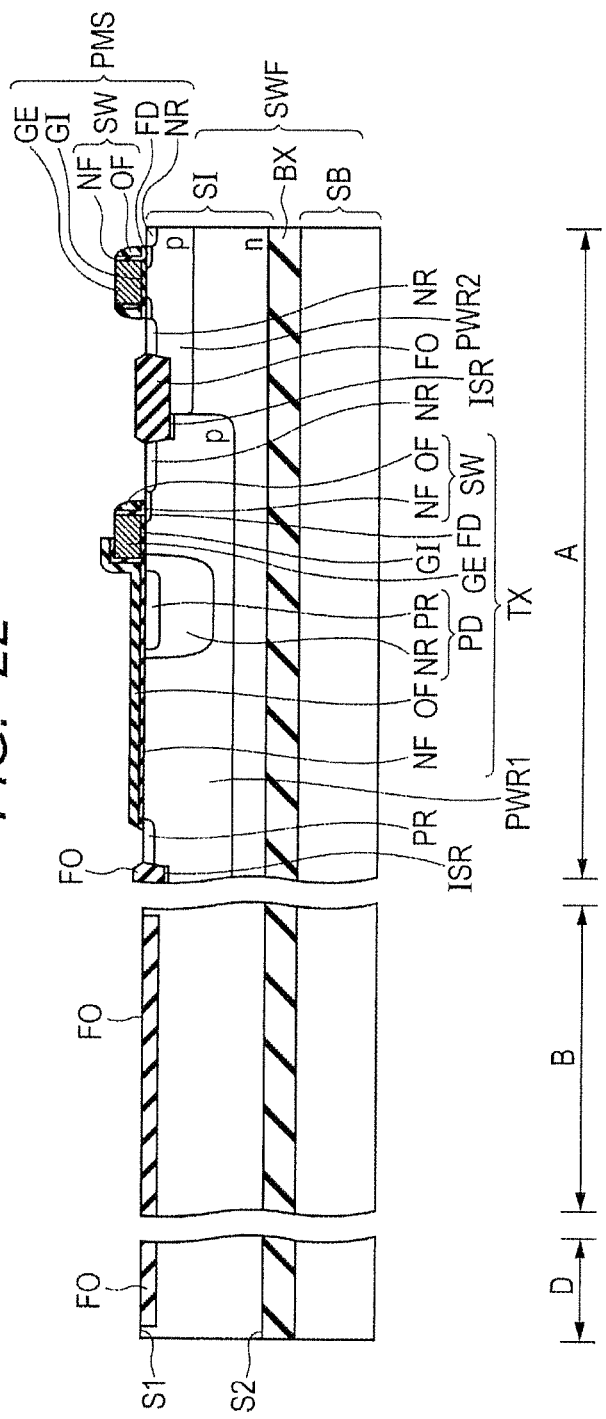
FIG. 22 is a schematic cross sectional view showing a first step of a method for manufacturing a semiconductor device in accordance with Second Embodiment.

Referring to FIG. 22, as with First Embodiment (see FIG. 6), there is provided a SOI wafer SWF having one main surface S1 and the other main surface S2, and including a semiconductor substrate SI and an insulation film layer BX. In the semiconductor substrate SI in the solid-state image sensing device region A, as with First Embodiment, there are formed a photodiode PD, a capacity region FD, a gate insulation film GI, a gate electrode GE, a field oxide film FO, and the like. As a result, a plurality of transfer transistors TX are formed At this step, also in the regions B and D, particularly, in a region overlapping the mark-like appearance part MK, the coupling part SR, and the opening TH in plan view, a field oxide film FO is formed at the main surface S1 of the semiconductor substrate SI. The field oxide film FO in the pad region B is formed simultaneously with the field oxide film FO in the solid-state image sensing device region A.

Figure 23:
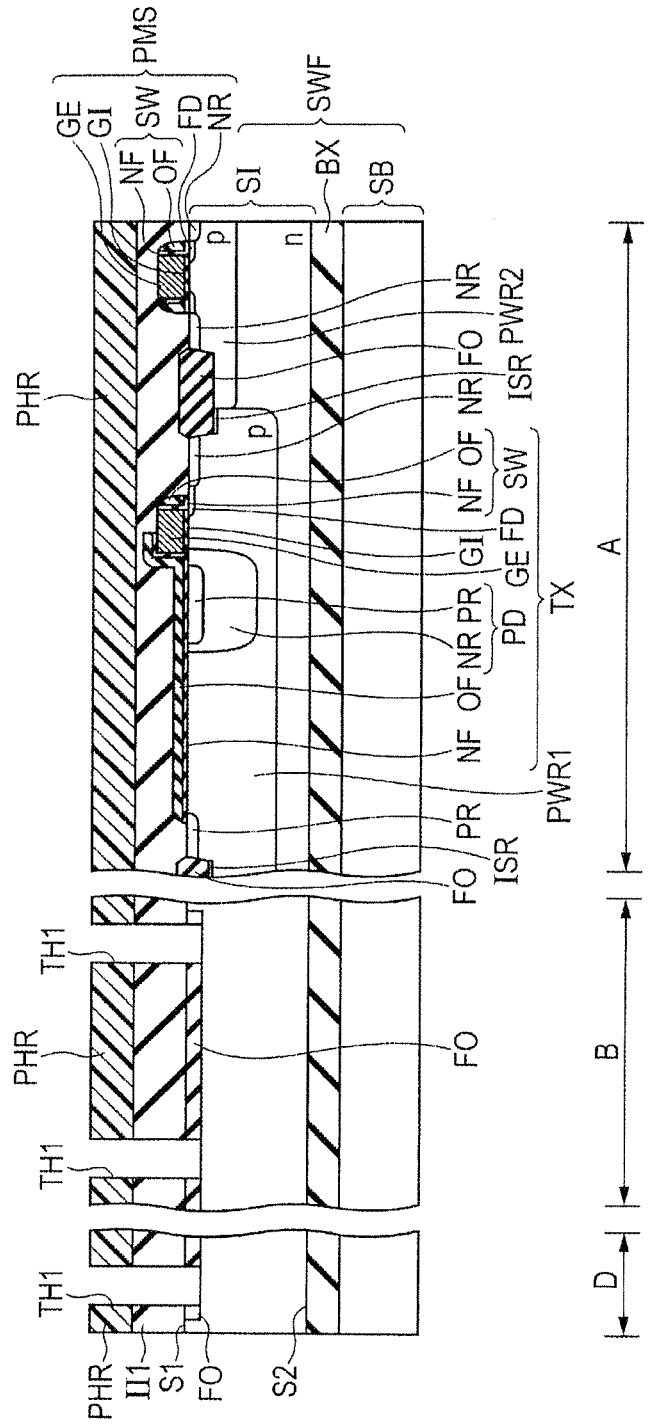
FIG. 23 is a schematic cross sectional view showing the second step of the method for manufacturing a semiconductor device in accordance with Second Embodiment.

Referring to FIG. 23, using, for example, a CVD method, an interlayer insulation film ill formed of, for example, a silicon oxide film is formed over the main surface S1 of the SOI wafer SWF in such a manner as to cover the transfer transistor TX. Then, the interlayer insulation film ill is polished by CMP so as to become flattened at the top surface.

Then, over the interlayer insulation film Ill, there is applied a photoresist PHR as a photoconductor. By a general photomechanical process technology, the photoresist PHR is patterned in such a manner as to have openings in a region overlapping the region of, particularly, the regions B and D where the mark (mark-like appearance part) MK is to be formed in plan view. Using the patterned photoresist PHR as a mask, the interlayer insulation film II1 is etched. As a result, in the region overlapping the region where the mark (mark-like appearance part) MK is to be formed in plan view, there is formed a trench part TH1. Incidentally, the trench part TH1 may be formed in such a manner as to reach the field oxide film FO on the main surface S2 side of the interlayer insulation film II1 (the bottom side of the drawing).

Figure 24:
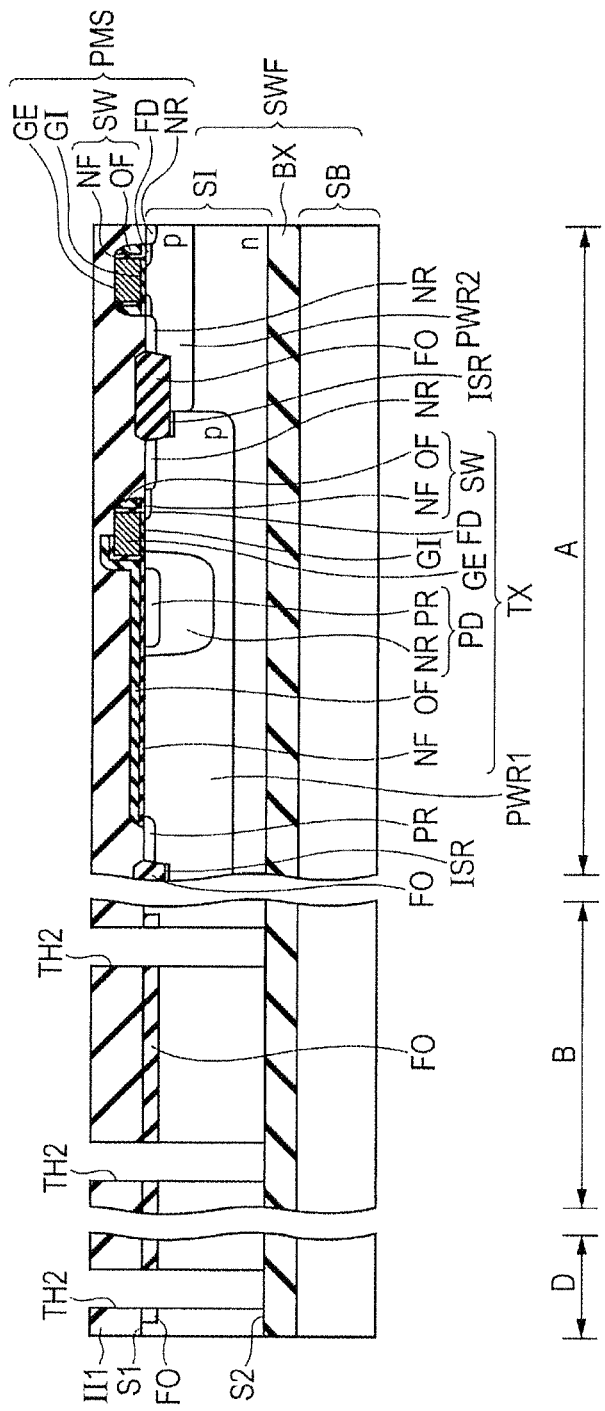
FIG. 24 is a schematic cross sectional view showing a third step of the method for manufacturing a semiconductor device in accordance with Second Embodiment.

Referring to FIG. 24, the photoresist PHR is removed by general ashing or the like. Then, using the pattern of the formed silicon oxide film III as a mask, by a general etching technology, trench parts TH2 extending from the one main surface Si to the other main surface S2 of the semiconductor substrate SI of the SOI wafer SWF are formed immediately under the trench parts TH1 in the regions B and D. In the present embodiment, etching for forming the trench parts TH2 is preferably terminated at the main surface S2 (with the insulation film layer BX as an etching stopper). This enables a plurality of trench parts TH2 to be precisely controlled so as to be almost uniform in depth in the vertical direction of the drawing therebetween.

Figure 25:
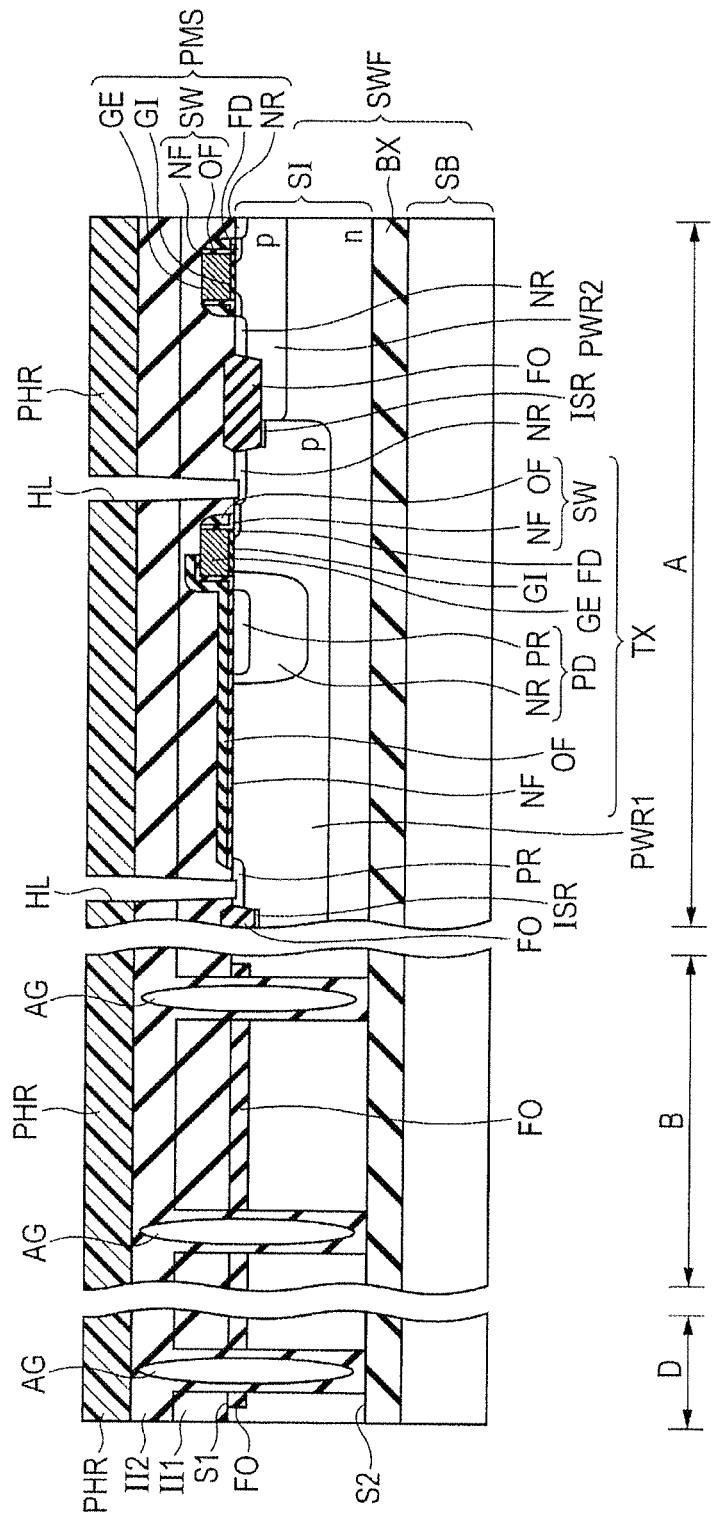
FIG. 25 is a schematic cross sectional view showing a fourth step of the method for manufacturing a semiconductor device in accordance with Second Embodiment.

Referring to FIG. 25, an interlayer insulation film II2 formed of, for example, a silicon oxide film is formed using, for example, a CVD method over the interlayer insulation film II1 in such a manner as to cover the side surface of the trench part TH2. The interlayer insulation film II2 covers at least the entire side surface of the trench part TH2, and may partially or entirely cover the bottom surface. Incidentally, in the inside of the trench part TH2, the interlayer insulation film II2 may be not filled, thereby to form a void called air gap AG.

Then, the interlayer insulation film II2 is polished by CMP so as to become flattened at the top surface. Over the interlayer insulation film II2, there is applied a photoresist PHR. By a general photomechanical process technology and an etching technology, in the solid-state image sensing device region A, there is formed a hole HL for forming a contact conductive layer CT for performing input/output of an electric signal with the transfer transistor TX. The hole HL is formed in such a manner as to penetrate through the interlayer insulation films II2 and II1, and to reach the main surface S1 of the semiconductor substrate SI (e.g., the capacity region FD as a drain region).

Figure 26:
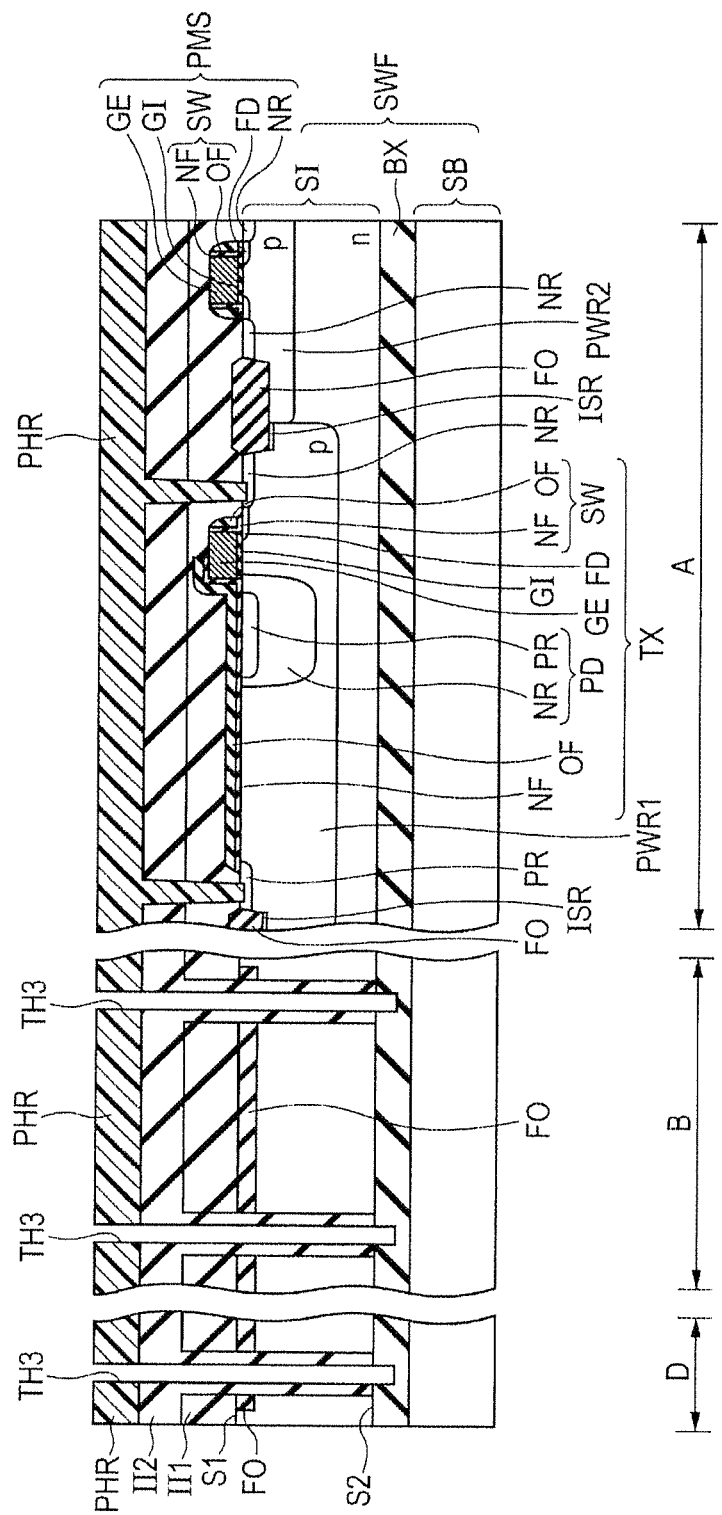
FIG. 26 is a schematic cross sectional view showing a fifth step of the method for manufacturing a semiconductor device in accordance with Second Embodiment.

Referring to FIG. 26, the photoresist PHR of the step of FIG. 25 is removed Then, over the interlayer insulation film II2, a photoresist PHR is applied again. By a general photomechanical process technology, in the trench part TH2, there is formed a trench part TH3 extending in such a manner as to penetrate through the interlayer insulation films II2 and II1, and the semiconductor substrate SI, and to reach the inside of the insulation film layer BX. Namely, the bottom of the trench part TH3 is preferably formed in such a manner that the insulation film layer BX is overetched partially (e.g., to a depth of about several tens nanometers). The trench part TH3 is formed by forming a cavity part in the trench part TH2 in such a manner as to include the air gap AG formed in the trench part TH2 in the step of FIG. 25. After the treatment, an interlayer insulation film II2 is preferably formed in such a manner as to cover entirely the side surface in the trench part TH2.

Figure 27:
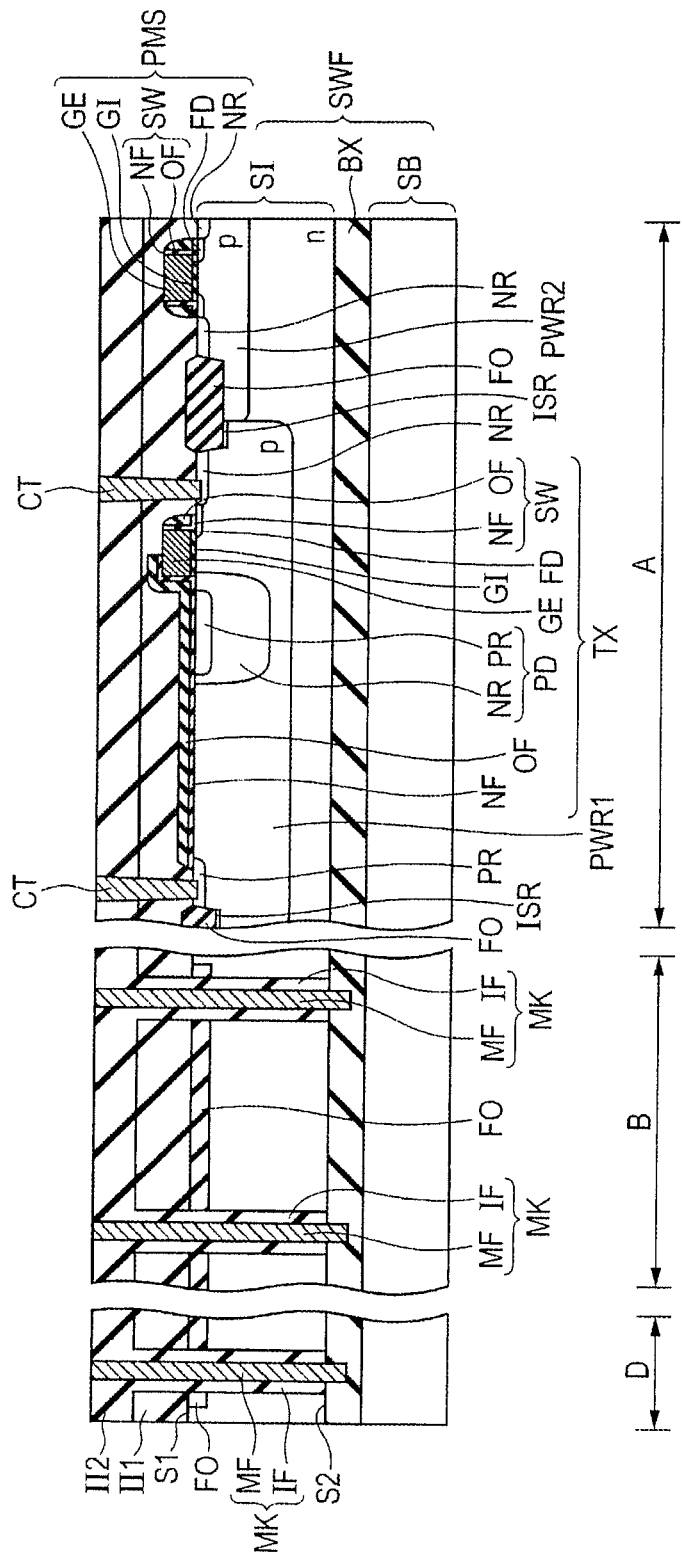
FIG. 27 is a schematic cross sectional view showing a sixth step of the method for manufacturing a semiconductor device in accordance with Second Embodiment.

Referring to FIG. 27, after removing the photoresist PHR of the step of FIG. 26, by, for example, a CVD method, a thin film of, for example, tungsten is formed over the interlayer insulation film II2 in such a manner as to fill both the inside of the trench part TH3 and the inside of the hole HL at the same time. Then, the thin film of tungsten over the interlayer insulation film II2 is removed by CMP.

As a result, the thin film of tungsten in the trench part TH3 is arranged inside the interlayer insulation film II2 covering the side surface of the trench part TH2 in the trench part TH2 as the internal metal film MF in the trench part TH2. Further, the thin film of tungsten in the hole HL is formed as the contact conductive layer CT in the solid-state image sensing device region A.

From the description up to this point, with the interlayer insulation film II2 in the trench part TH2 as the circumferential insulation film IF, and with the thin film of tungsten inside the circumferential insulation film IF as the internal metal film MF, these are formed at the same time. The circumferential insulation film IF and the internal metal film MF form the mark-like appearance part MK (region B) and the mark MK (region D) in the trench part TH2.

In the manner described up to this point, in the present embodiment, the mark-like appearance part MK is formed after the photodiode PD is formed. Further, the mark-like appearance part MK and the mark MK are each formed in the following manner: in the trench part TH2, the internal metal film MF formed of, for example, tungsten is formed inside the circumferential insulation film IF.

Figure 28:
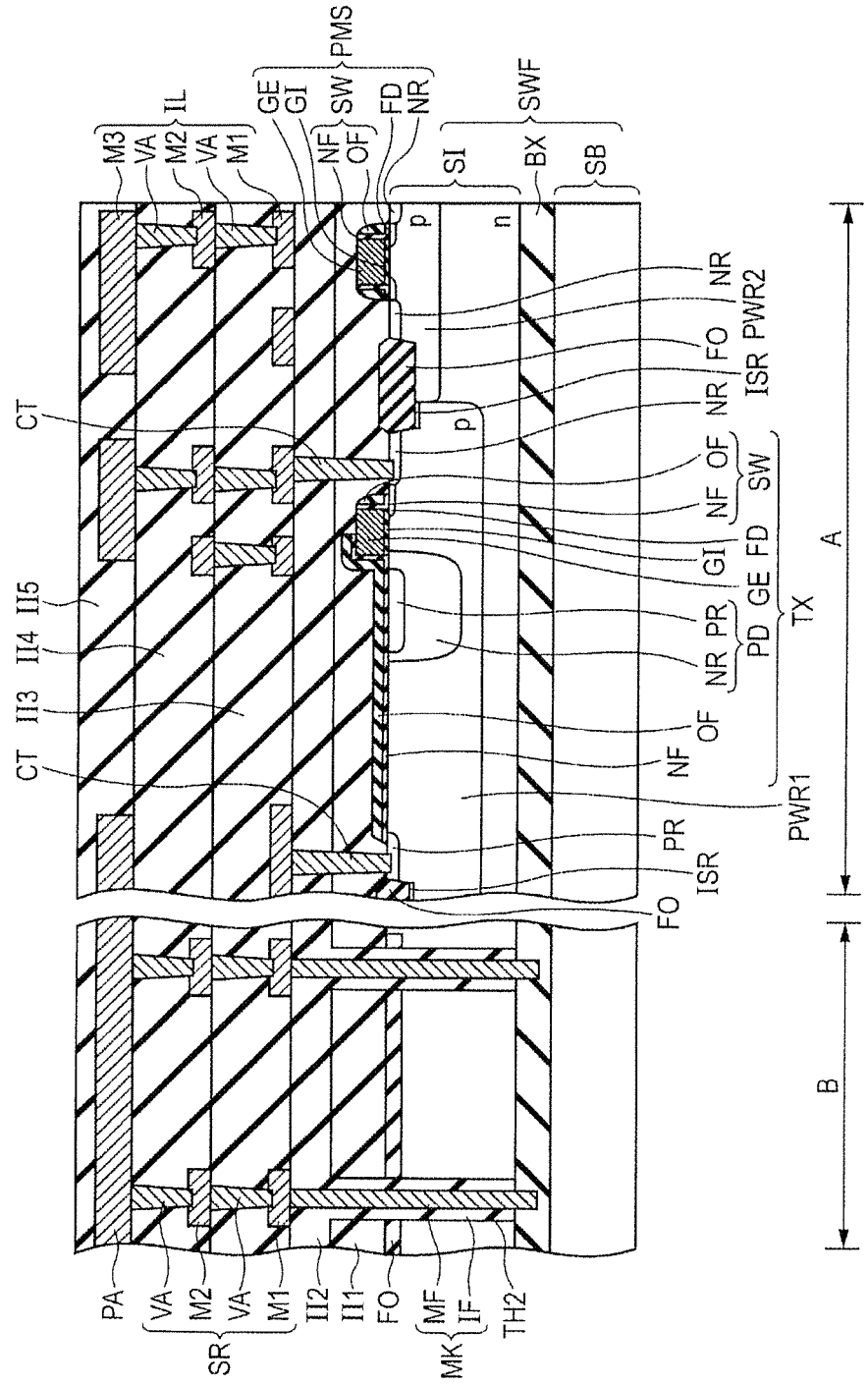
FIG. 28 is a schematic cross sectional view showing a seventh step of the method for manufacturing a semiconductor device in accordance with Second Embodiment.

Referring to FIG. 28, over the interlayer insulation film II2, a thin film of, for example, aluminum or copper is formed by, for example, sputtering. Then, by a general photomechanical process technology and an etching technology, in respective regions A and B, a metal wire M1 is formed in such a manner as to cover the contact conductive layer CT.

Then, in the same manner as in the step of FIG. 12, there are formed interlayer insulation films II3, II4, and II5, a via layer VA, metal wires M2 and M3, and a pad electrode PA. Accordingly, the same constituent elements in respective regions A and B are formed by the same treatment at the same time (the metal wire M3 in the region A and the pad electrode PA in the region B are the same). As a result, in the same manner as in the step of FIG. 12, in the region A, there is formed a wiring layer IL, and in the region B, there are formed a coupling part SR and a pad electrode PA.

Figure 29:
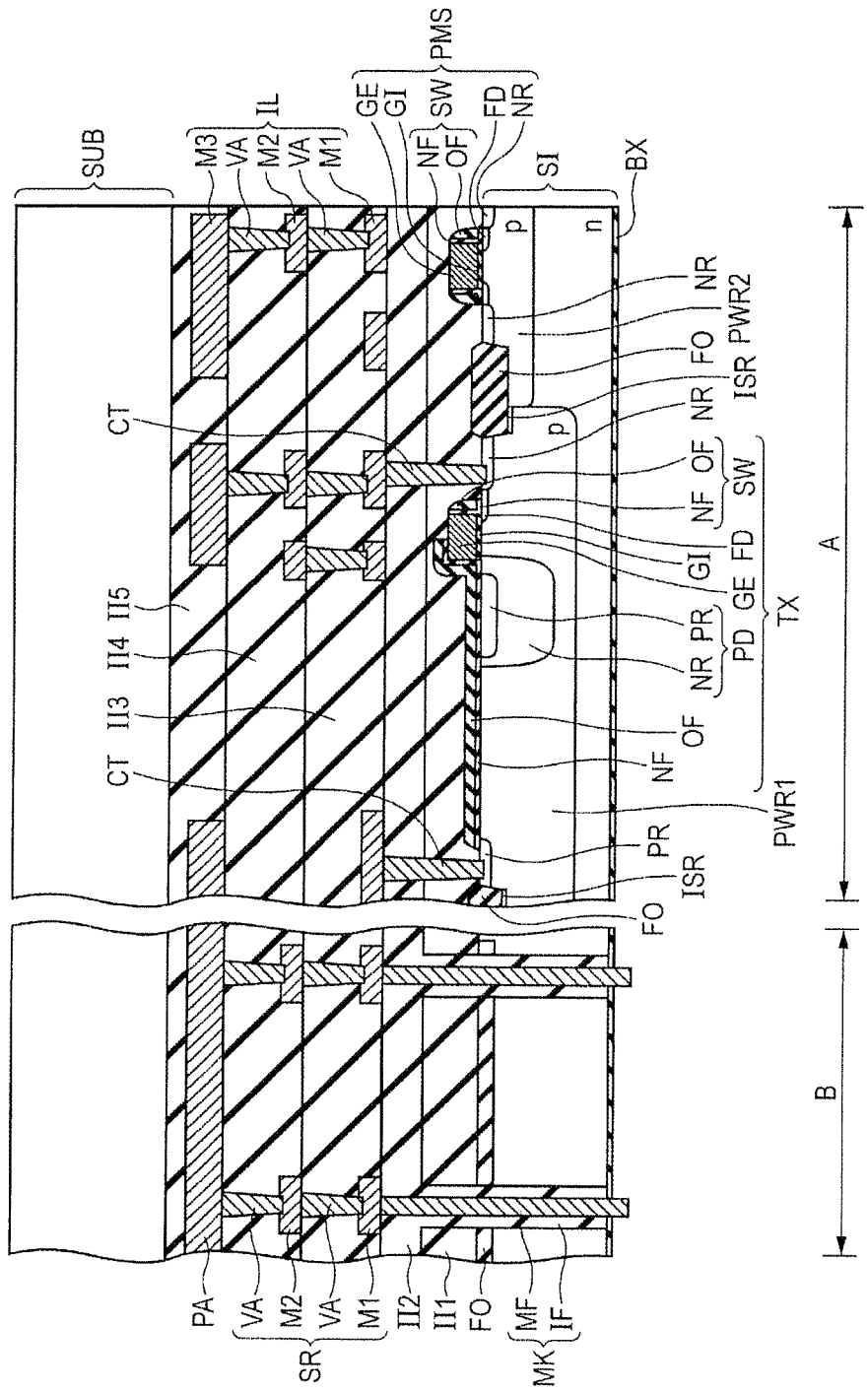
FIG. 29 is a schematic cross sectional view showing an eighth step of the method for manufacturing a semiconductor device in accordance with Second Embodiment.

Referring to FIG. 29, the same treatments as those in connection with FIGS. 13 to 15 are performed. Incidentally, in FIG. 29, the insulation film layer BX is partially removed in such a manner as to be reduced in thickness until the bottom surface of the mark-like appearance part MK is exposed. However, the insulation film layer BX may be fully removed until the semiconductor substrate SI is exposed.

Figure 30:
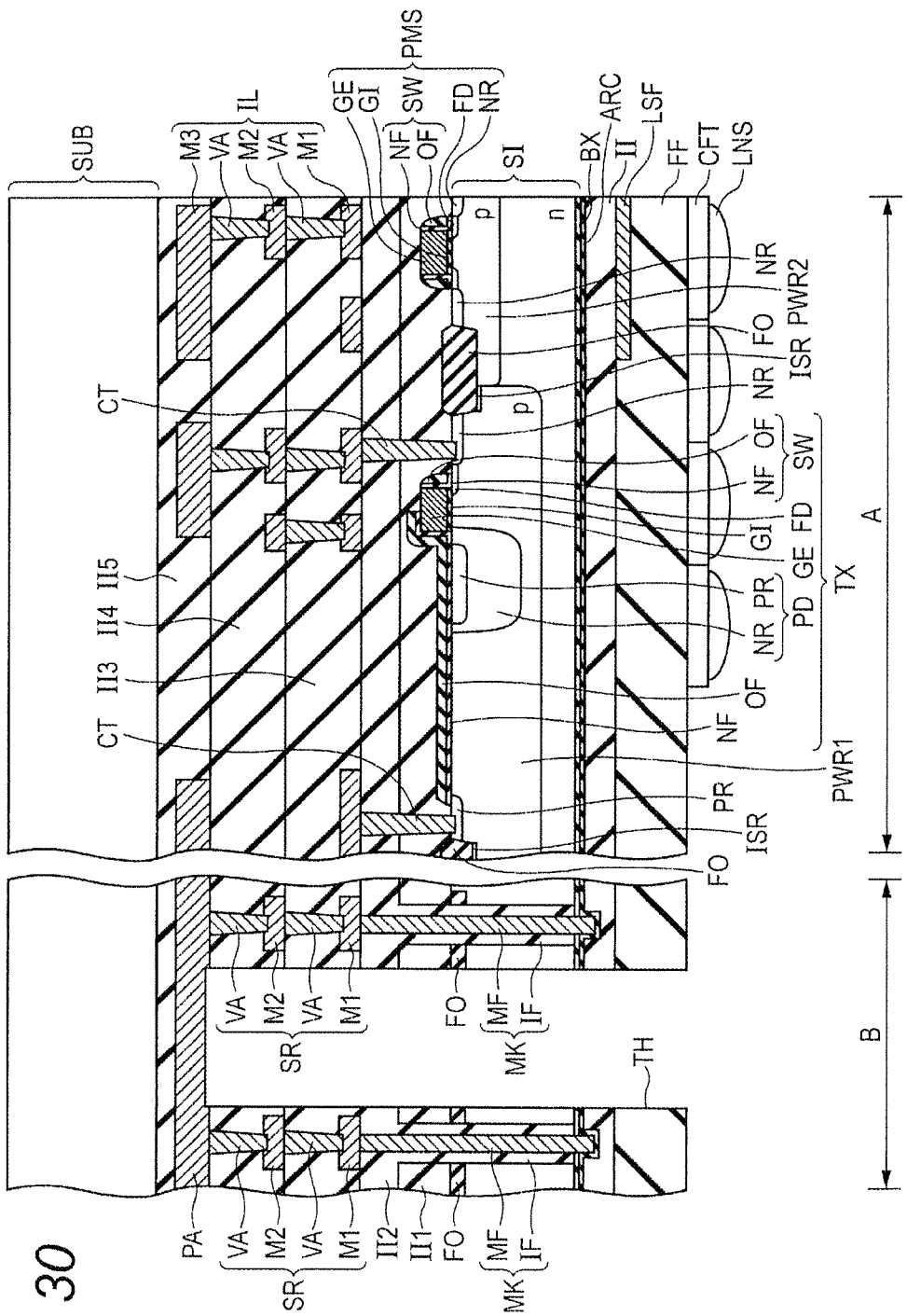
FIG. 30 is a schematic cross sectional view showing a ninth step of the method for manufacturing a semiconductor device in accordance with Second Embodiment.

Referring to FIG. 30, the same treatments as those in connection with FIGS. 16 to 18 are performed, thereby to form an opening TH in the pad region B.

Incidentally, other manufacturing methods of the present embodiment than these are almost the same as the manufacturing method of First Embodiment, and hence a description thereon will not be repeated.

Then, a description will be given to the advantageous effect of the present embodiment. The present embodiment has, in addition to the advantageous effect of First Embodiment, the following advantageous effect.

In the present embodiment, simultaneously with the step of forming a thin film of tungsten which is a metal material for forming the contact conductive layer CT in the solid-state image sensing device region A, there is formed a thin film of tungsten which is a metal material forming the internal metal film MF forming the mark-like appearance part MK (mark MK). Therefore, it is possible to form the mark-like appearance part MK using the existing step (the step of forming the contact conductive layer CT), (without adding another step). This leads to the step reduction and the cost reduction.

Further, in the present embodiment, after the formation of the photodiode PD, there is formed the mark (mark-like appearance part) MK. At the time of formation of the photodiode PD, a high-temperature heat treatment is required. However, after the formation of the photodiode PD, the mark MK is formed. This prevents the mark MK from being subjected to the heat treatment. This can reduce the possibility that the mark MK undergoes a defect such as deformation by a thermal stress, thereby to reduce the alignment control.

Third Embodiment

First, referring to FIG. 31, a description will be given to, particularly, the configuration of the solid-state image sensing device region A and the pad region B of a semiconductor device of the present embodiment.

Figure 31:
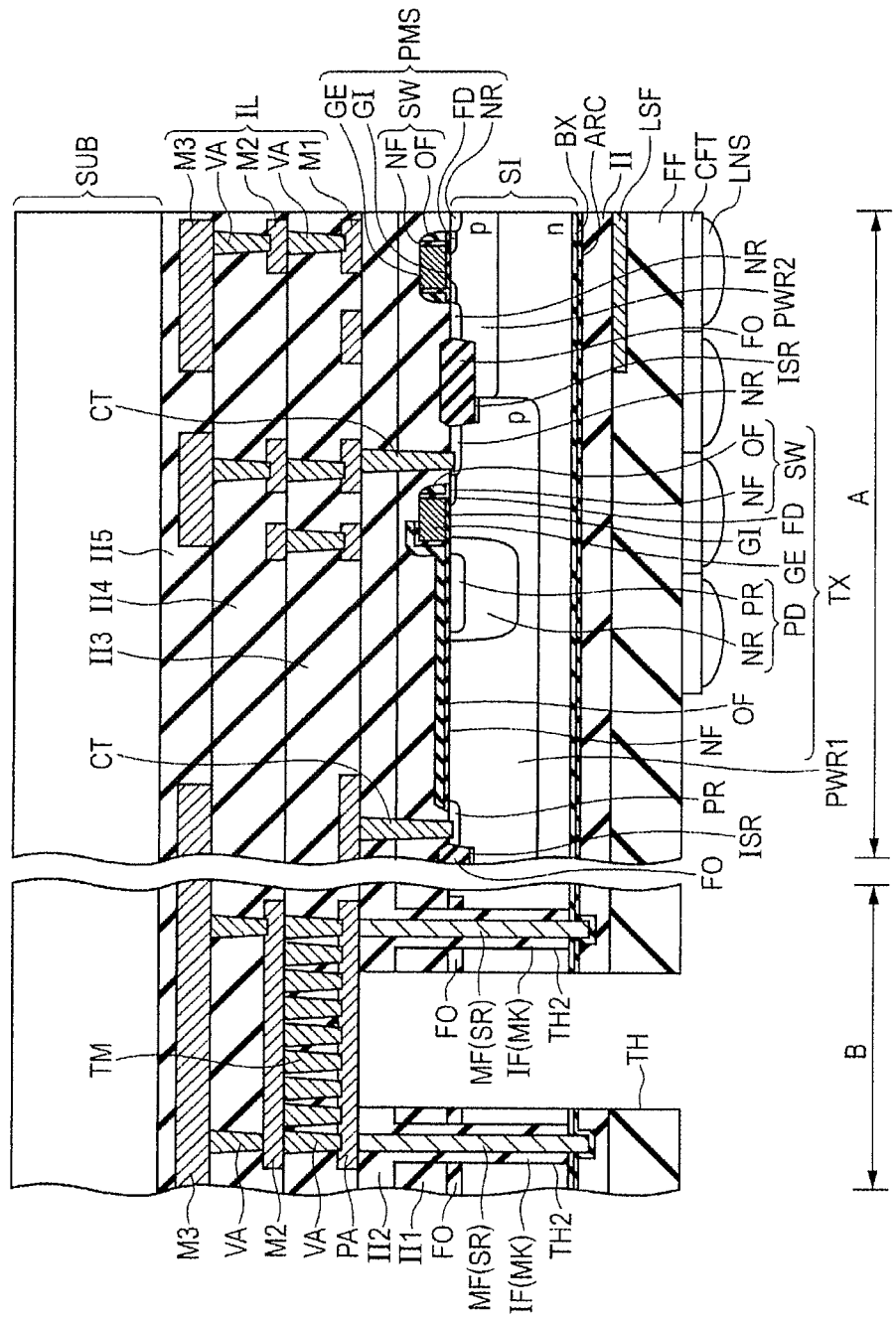
FIG. 31 is a schematic cross sectional view simply showing the configuration of the regions A and B shown in FIG. 2 of a semiconductor device in accordance with a first example of Third Embodiment.

Referring to FIG. 31, a first example of the present embodiment is mainly different in position of the pad electrode PA from Second Embodiment.

Specifically, the pad electrode PA is formed as the same layer as the lowermost layer in the solid-state image sensing device region A. In this regard, the present embodiment is different from First and Second Embodiments in which the pad electrode PA is formed as the same layer as the metal wire M3 at the uppermost layer in the solid-state image sensing device region A.

Thus, the pad electrode PA is not necessarily required to be formed as the same layer as the metal wire M3 of the uppermost stacked layer (the layer most distant from the main surface S1 of the semiconductor substrate SI), and may be formed as the same layer as the metal wires M1 and M2 other than the uppermost layer.

Incidentally, generally, the metal wire M3 at the uppermost layer is formed thicker than the metal wires M1 and M2 at other layers. Conversely, the metal wires M1 and M2 are formed thinner than the metal wire M3 mainly from the viewpoint of more miniaturizing the whole semiconductor device.

For this reason, the pad electrode PA formed as the same layer as the thin the metal wires M1 and M2 is thinner than the pad electrode PA formed as the same layer as the metal wire M3. At the surface of the pad electrode PA (from the main surface S2 side, namely, the bottom side of the drawing), there is set a probe for measuring the semiconductor device, or the like. When the pad electrode PA is thin, at this step, the tip of the probe may cause defects such as cracks in the pad electrode PA. Further, also when a treatment such as bonding is performed over the surface of the pad electrode PA, similarly, the tip of the bonding wire may cause defects such as cracks in the pad electrode PA.

Figure 32:
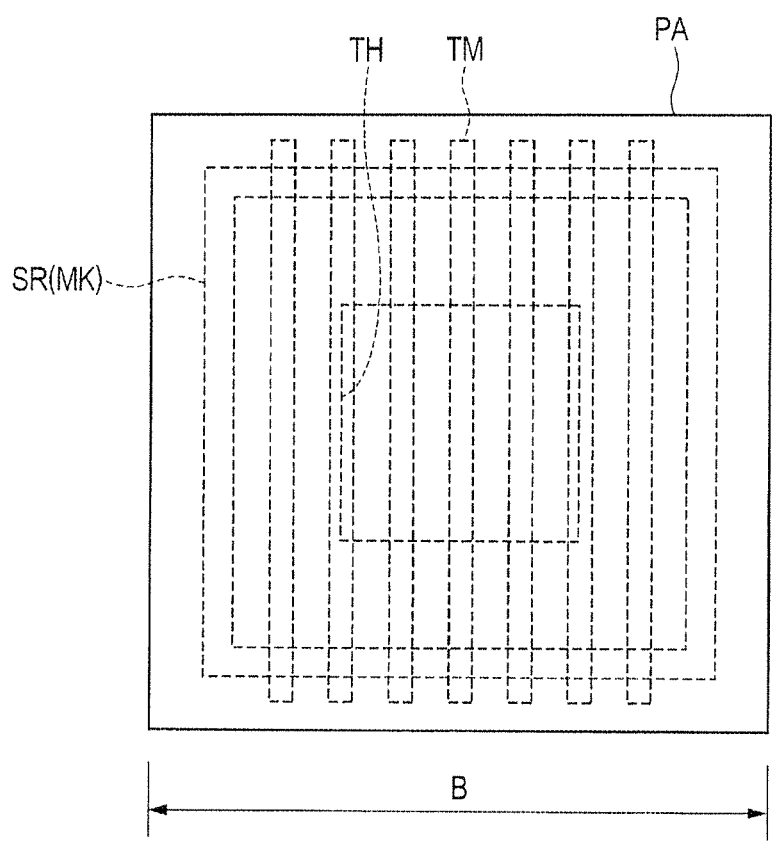
FIG. 32 is a schematic plan view simply showing the configuration of a pad region B of FIG. 31.

Thus, referring to FIGS. 31 and 32, on the main surface S1 side of the pad electrode PA (the top side of the drawing), a plurality of trench shaped wires TM are spaced apart from one another in such a manner as to be in contact with the top of the surface of the pad electrode PA on the main surface S1 side. The trench shaped wire TM extends in a thin rectangle in such a manner as to entirely overlap the opening TH in plan view in terms of, for example, the depth direction. The trench shaped wires TM are arranged in such a manner as to couple the metal wire M2 and the metal wire M1. For this reason, the trench shaped wire TM is formed of a thin film of, for example, tungsten as the same layer as the via layer VA arranged at the relatively outer part in the metal wire M1 in plan view (the same function as with the via layer VA of First or Second Embodiment).

The trench shaped wire TM is in contact with the surface of the metal wire M1 (pad electrode PA) on the main surface S1 side (top side), and thereby can enhance the strength of the metal wire M1 in the thickness direction.

Incidentally, the metal wire M2 and the metal wire M3 in the pad region B are coupled by the via layer VA as in First and Second Embodiments. Further, all the metal wires M1 to M3 in the pad region B each have almost the same planar area as that of the pad electrode M1 (PA).

The opening TH in the pad region B is formed in such a manner as to reach the pad electrode PA from the surface of the planarization film FF. The pad electrode PA is arranged on the lower side of the drawing than in other embodiments, and hence the opening TH is formed in such a manner as to be dug shallower by that much in the vertical direction than in other embodiments.

Incidentally, in a first example of the present embodiment, the mark-like appearance part MK in the pad region B is assumed to include only the circumferential insulation film IF (particularly in the trench part TH2). The internal metal film MF in the inside thereof (also including the outside of the trench part TH2) is assumed to correspond to the coupling part SR coupling the pad electrode PA and the mark-like appearance part MK in First and Second Embodiments.

Incidentally, other configurations of the present embodiment than these are almost the same as the configurations of Second Embodiment. For this reason, the same elements are given the same reference numerals and signs, and a description thereon will not be repeated.

Figure 33:
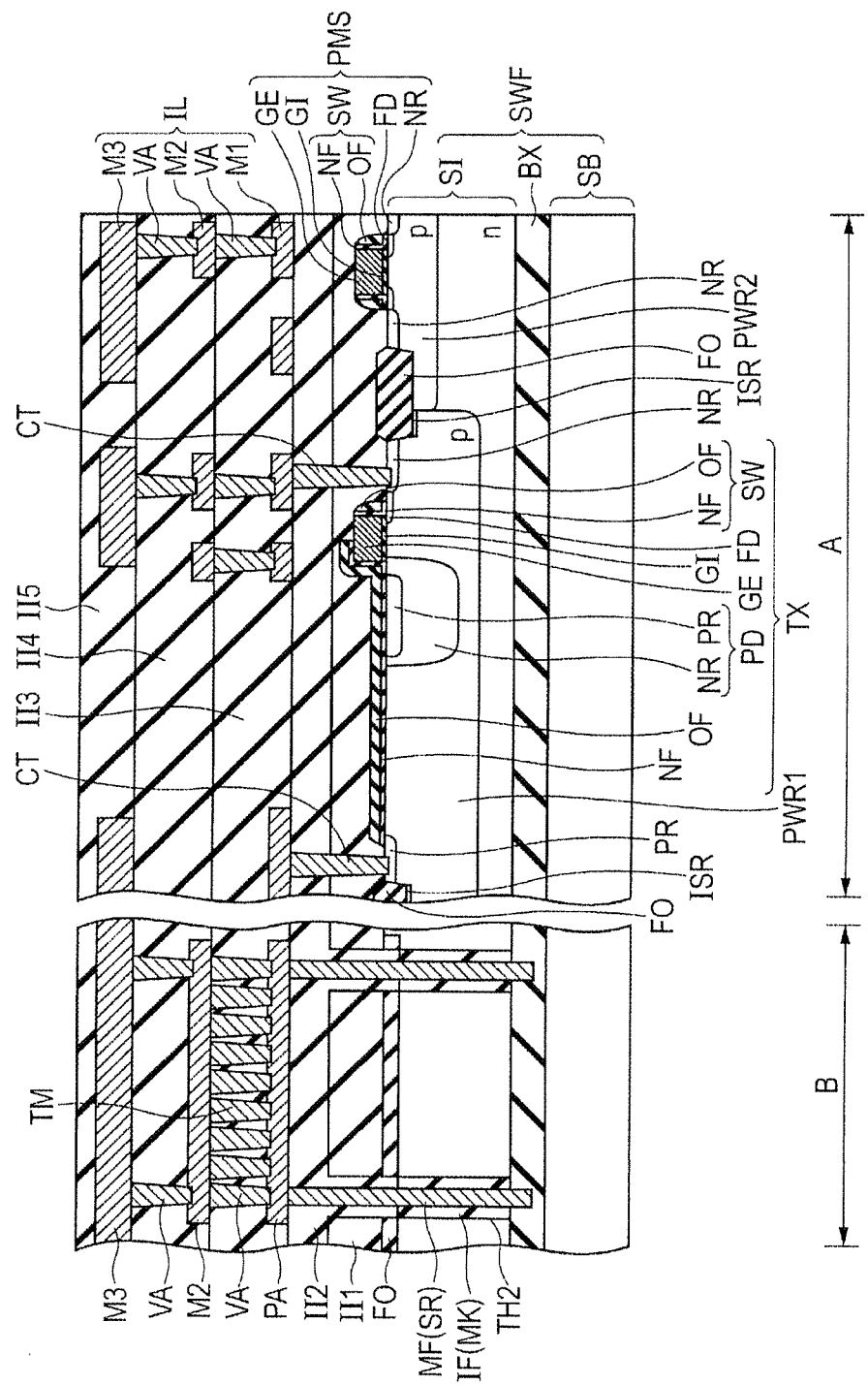
FIG. 33 is a schematic cross sectional view showing a first step of a method for manufacturing a semiconductor device in accordance with the first example of Third Embodiment.

Referring to FIG. 33, the manufacturing method of the first example of the present embodiment is basically the same as the manufacturing method of Second Embodiment. However, the pad electrode PA is formed as the same layer as the metal wire M1 (at the same time). Then, an interlayer insulation film II3 is formed over the interlayer insulation film II2 in such a manner as to cover the metal wire M1 (pad electrode PA). Then, in the interlayer insulation film II3, there are simultaneously formed holes for forming the via layer VA and the trench shaped wire TM. The holes are simultaneously filled with a conductive film of tungsten or the like. As a result, the via layer VA and the trench shaped wire TM are formed.

Then, by the same methods as those in respective embodiments, there are formed the metal wires M2 and M3, the via layer VA, and the interlayer insulation films II4 and II5.

Incidentally, other manufacturing methods of the present embodiment than these are almost the same as the manufacturing method of Second Embodiment. For this reason, a description thereon will not be repeated.

Figure 34:
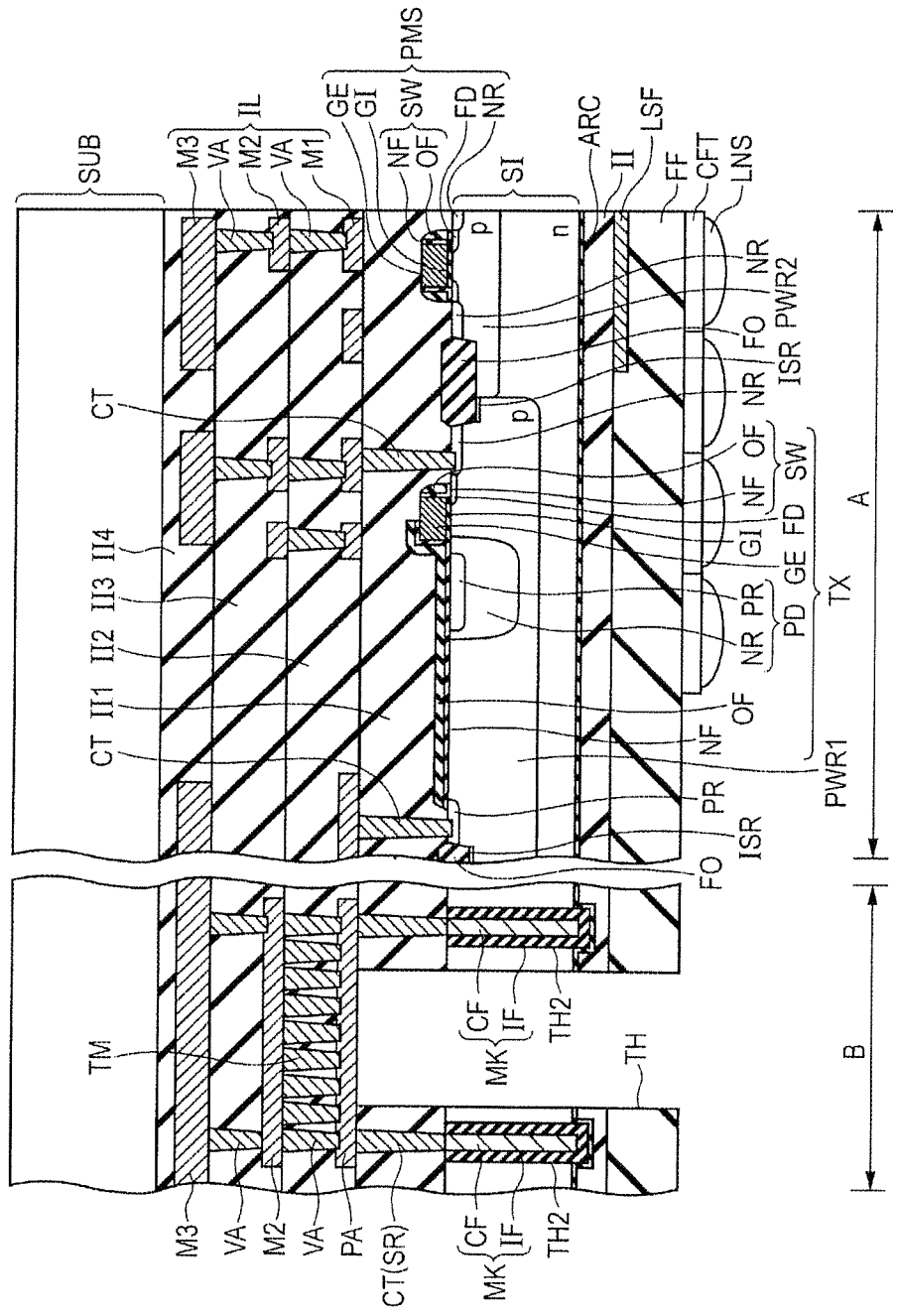
FIG. 34 is a schematic cross sectional view simply showing the configuration of the regions A and B shown in FIG. 2 of a semiconductor device in accordance with a second example of Third Embodiment.

Referring to FIG. 34, a second example of the present embodiment is obtained by applying the configuration of the pad region B of the first example of the present embodiment to the configuration of First Embodiment (see FIG. 5). Incidentally, in the second example of the present embodiment, the mark-like appearance part MK in the pad region B is, as with First Embodiment, formed of the circumferential insulation film IF and the internal conductive film CF in the trench part TH2. The contact conductive layer CT for coupling the mark-like appearance part MK and the pad electrode PA corresponds to the coupling part SR.

Figure 35:
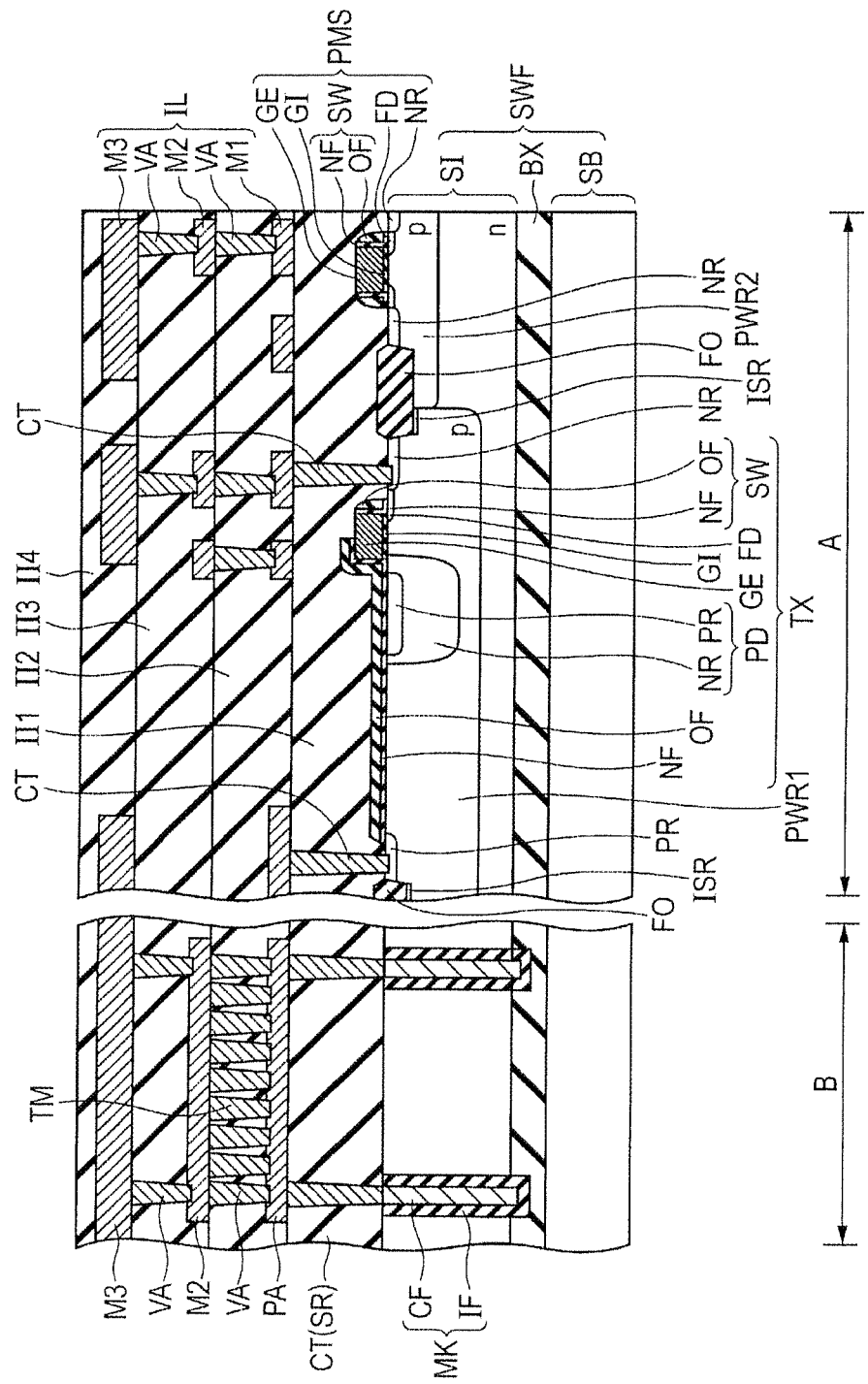
FIG. 35 is a schematic cross sectional view showing a first step of the method for manufacturing a semiconductor device in accordance with a second example of Third Embodiment.

Referring to FIG. 35, this shows one step of the manufacturing method of the second example of the present embodiment of FIG. 34 as with FIG. 33. Thus, the configuration of the present embodiment may be applied to the configuration of First Embodiment, or may be applied to the configuration of Second Embodiment.

The present embodiment has, in addition to the advantageous effects of First and Second Embodiments, the following advantageous effect.

In the present embodiment, the pad electrode PA is formed on the side closer to the semiconductor substrate SI (the layer on the lower side of the drawing), and the opening TH is formed shallower than in other embodiments. For this reason, the processing for forming the color filters CFT and the microlenses LNS becomes easier. This is due to the following: the opening TH is shallow; as a result, when the color filters CFT and the microlenses LNS are formed by a coating film, the coverage (the filling property to the step difference, and the film thickness uniformity of the coating film) is improved.

Further, even when the pad electrode PA is formed at the lower layer as the same layer as the metal wires M1 and M2 with a small thickness, the pad electrode PA is supported by the trench shaped wires TM in the thickness direction from the top side of the drawing. For this reason, it is possible to ensure the strength of the pad electrode PA in the thickness direction. Accordingly, it is possible to suppress the occurrence of cracks and the like, for example, when a probe is set on the pad electrode PA.

Fourth Embodiment

Figure 36:
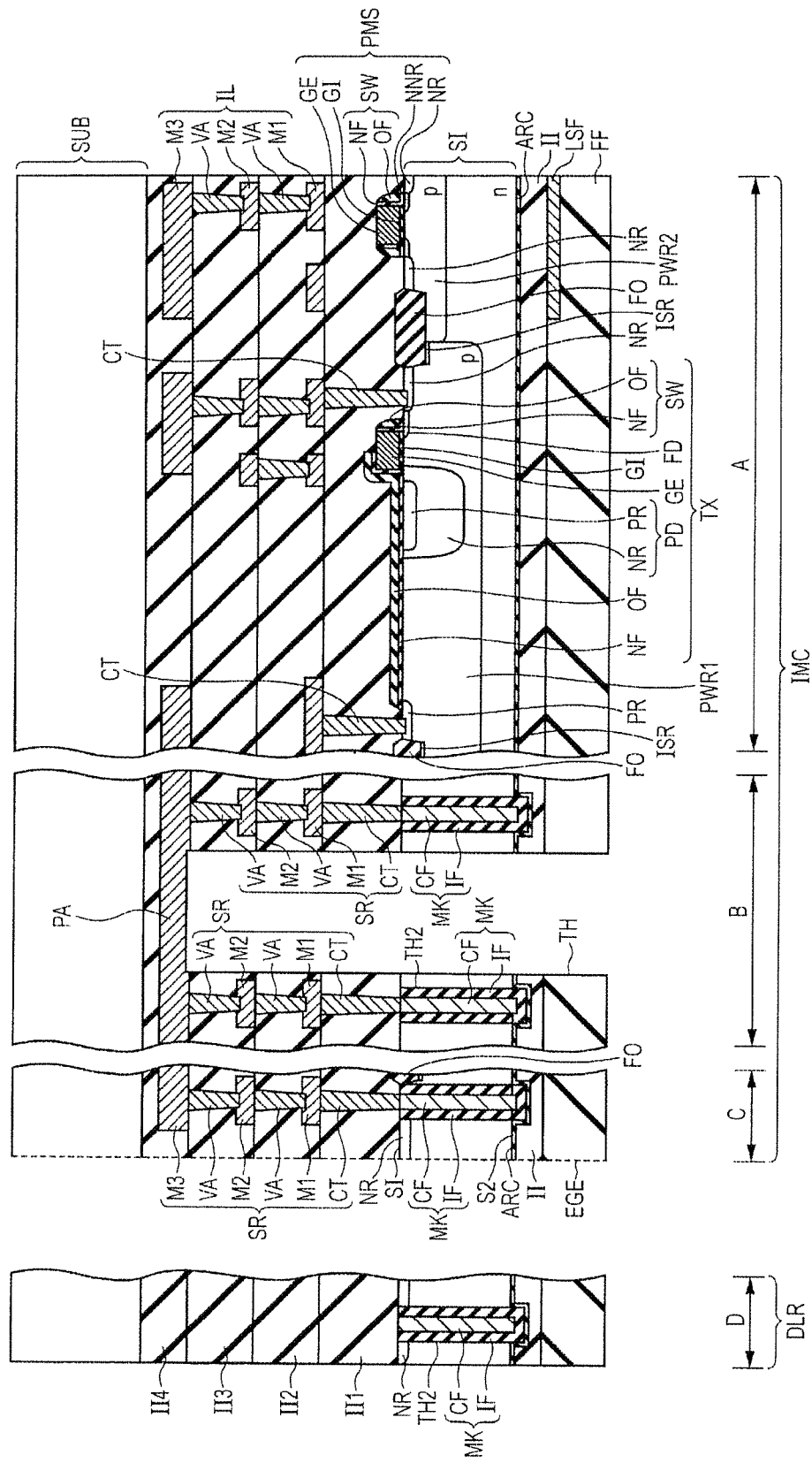
FIG. 36 is a schematic cross sectional view particularly showing the configuration of the regions A, B, C, and D shown in FIG. 2 of a semiconductor device in accordance with Fourth Embodiment.

Referring to FIG. 36, in the present embodiment, in addition to the pad region B, also in the seal ring region C, there is formed a mark-like appearance part MK extending in such a manner as to penetrate through the inside of the semiconductor substrate SI from the main surface S1 to the main surface S2 (beyond the main surface S2) of the semiconductor substrate SI (on the main surface S2 side of the seal ring SR (the bottom side of the drawing)).

The mark-like appearance part MK in the seal ring region C is formed as another mark-like appearance part having the same form as that of the mark-like appearance part MK in the pad region B. The mark-like appearance part MK in the seal ring region C is formed as the same layer as the circumferential insulation film IF and the internal conductive film CF forming the mark-like appearance part MK in the pad region B. The internal conductive film CF of the mark-like appearance part MK in the seal ring region C is coupled with the contact conductive layer CT of the seal ring SR.

Incidentally, other configurations of the present embodiment than these are almost the same as the configurations of First Embodiment. For this reason, the same elements are given the same reference numerals and signs, and a description thereon will not be repeated.

Then, referring to FIG. 37, a description will be given to a method for manufacturing the semiconductor device of the present embodiment described up to this point (see FIG. 36). For convenience of description, FIG. 37 shows all the regions A, B, C, and D.

Figure 37:
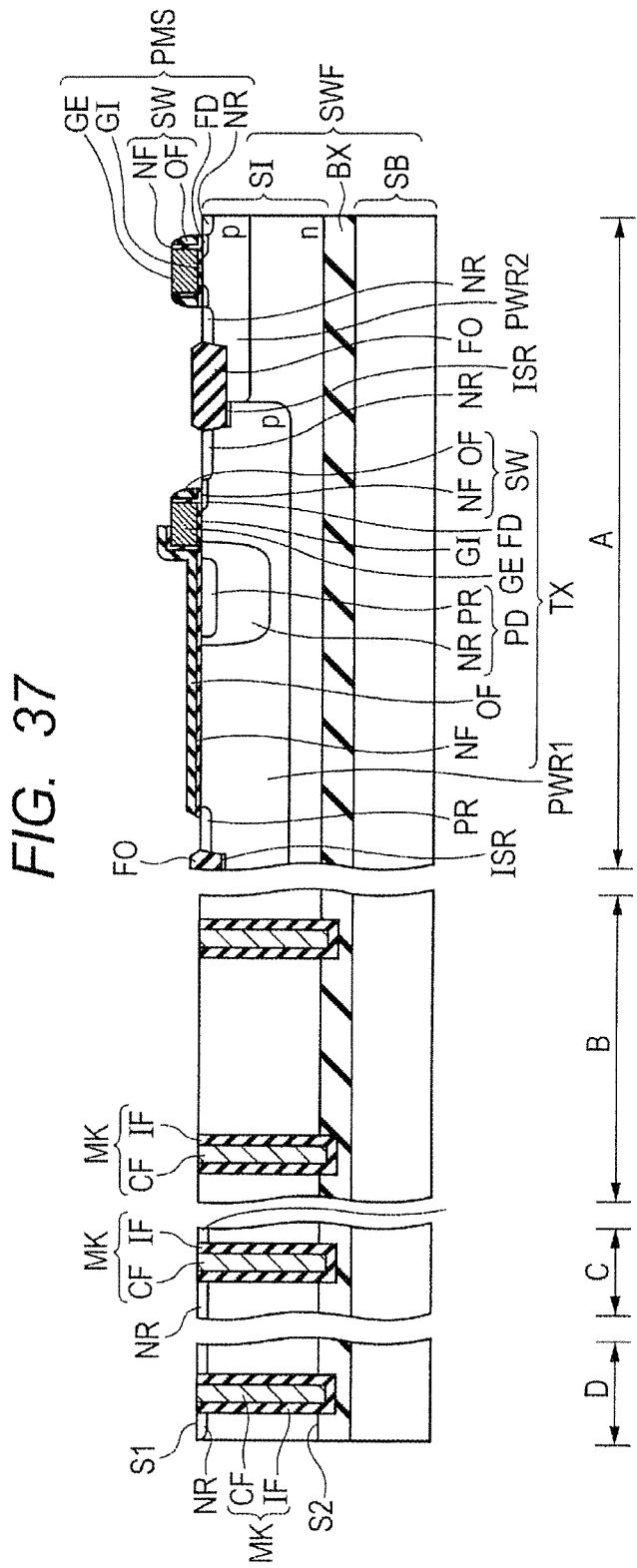
FIG. 37 is a schematic cross sectional view showing a first step of a method for manufacturing a semiconductor device in accordance with the first example of Fourth Embodiment.

Referring to FIG. 37, there are basically performed the same treatments as those in connection with, for example, FIGS. 6 to 10 of First Embodiment. However, herein, in addition to the regions B and D, also in the region C, a trench part TH2 is formed in the semiconductor substrate SI as in the region B. Thus, a mark-like appearance part MK (another mark-like appearance part) including a circumferential insulation film IF and an internal conductive film CF as the same layer as the mark-like appearance part MK in the region B is formed simultaneously with the mark-like appearance part MK in the region B.

Figure 38:
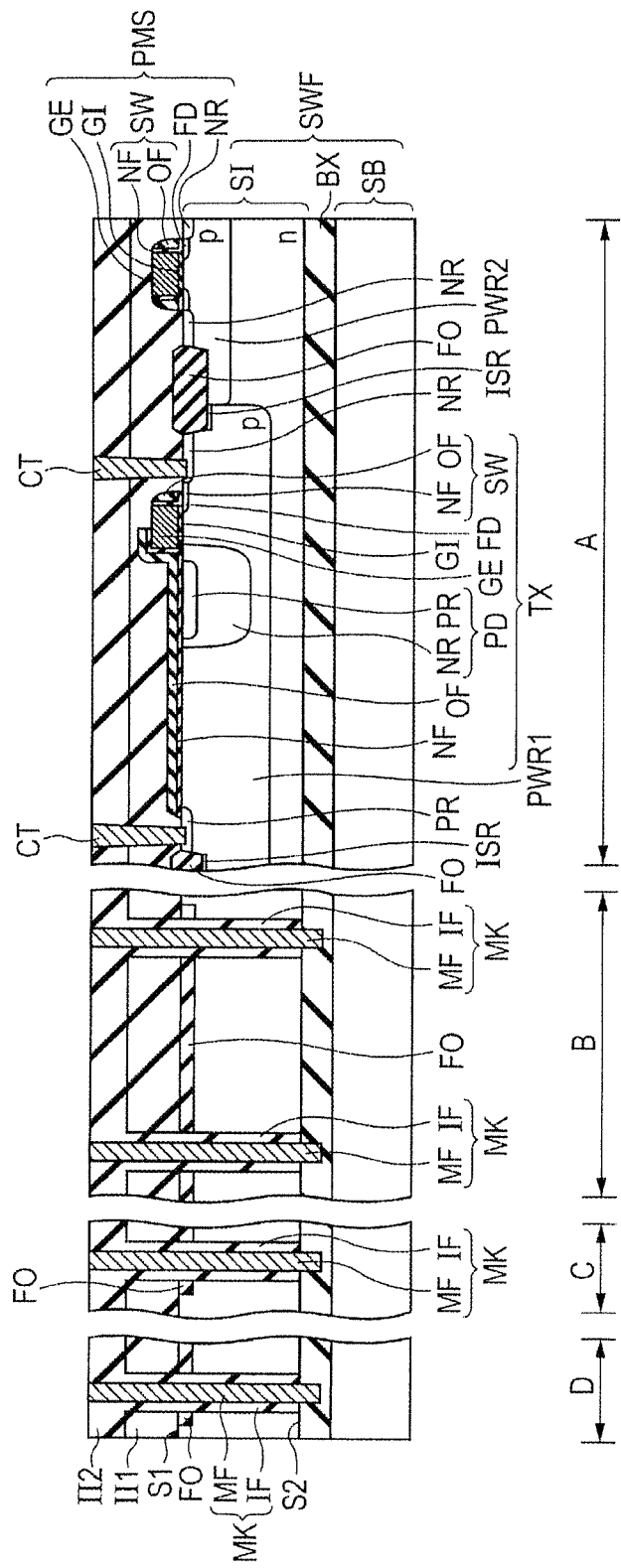
FIG. 38 is a schematic cross sectional view showing a first step of a method for manufacturing a semiconductor device in accordance with a second example of Fourth Embodiment.

FIGS. 36 and 37 each show an example in which the mark-like appearance part MK in the seal ring region C is applied to First Embodiment. However, the mark-like appearance part MK in the seal ring region C may be applied to the configuration of Second or Third Embodiment. Specifically, for example, referring to FIG. 38, this shows a step of forming (another) mark-like appearance part MK in the seal ring region C as the same layer as the mark-like appearance part MK in the pad region B of Second Embodiment (as in FIG. 37).

Subsequent steps are basically the same as those of FIGS. 11 to 18 of First Embodiment, and those of FIGS. 28 to 30 of Second Embodiment.

In the present embodiment, a trench part TH2 for forming the mark-like appearance part MK is also formed in the seal ring region C in addition to the pad region B and the dicing line region D. This results in a larger area of the region to be etched for forming the trench part TH2 than in First to Third Embodiments. This improves the controllability of etching for forming the trench part TH2.

Fifth Embodiment

Below, FIGS. 39 to 44 each show the configuration of the regions A, B, and D for convenience of description.

Figure 39:
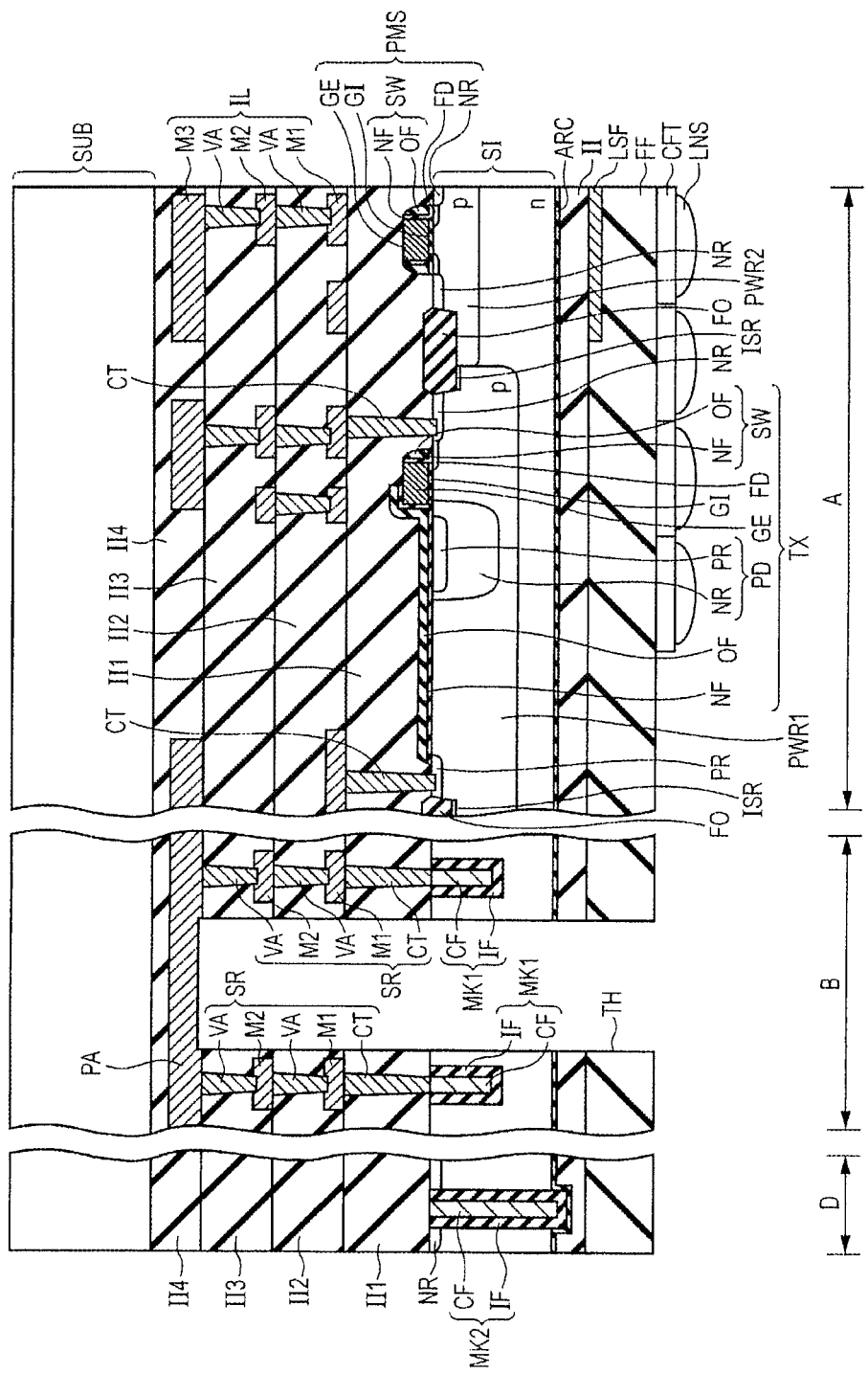
FIG. 39 is a schematic cross sectional view simply showing the configuration of the regions A, B, and D shown in FIG. 2 of a semiconductor device in accordance with a first example of Fifth Embodiment.

Referring to FIG. 39, the first example of the present embodiment basically has the same configuration as that of First Embodiment (see FIG. 5). However, the mark-like appearance part MK1 in the pad region B is formed shallower than the mark MK2 in the dicing line region D. Namely, the mark MK2 in the dicing line region D extends in such a manner as to penetrate through the semiconductor substrate SI from the main surface S1 to the main surface S2 of the semiconductor substrate SI. In contrast, the mark-like appearance part MK1 in the pad region B extends in the direction toward the main surface S2 from the main surface S1, but does not reach the main surface S2, and has a terminal in the semiconductor substrate SI.

In the respective embodiments, the trench part TH2 (second trench part) for forming the mark-like appearance part MK in the pad region B and the trench part TH2 (first trench part) for forming the mark MK (alignment mark part) in the dicing line region D are formed at the same time. In contrast, in the present embodiment, the trench part TH2 (second trench part) for forming the mark-like appearance part MK in the pad region B and the trench part TH2 (first trench part) for forming the mark MK in the dicing line region D are formed by different steps (at different timings). Either of the first trench part and the second trench part may be formed first.

When the mark-like appearance part MK1 in the pad region B is formed in such a manner as to have a different configuration from that of the mark MK2 in the dicing line region D as in FIG. 39 (particularly when the mark-like appearance part MK1 and the mark MK2 are different in depth of the trench part TH2 from each other), basically, the trench parts TH2 of the mark-like appearance part MK1 and the mark MK2 are formed by different steps. Then, other examples in which the trench parts TH2 of the mark-like appearance part MK1 and the mark MK2 are formed by different steps are shown in FIGS. 40 to 44.

Figure 40:
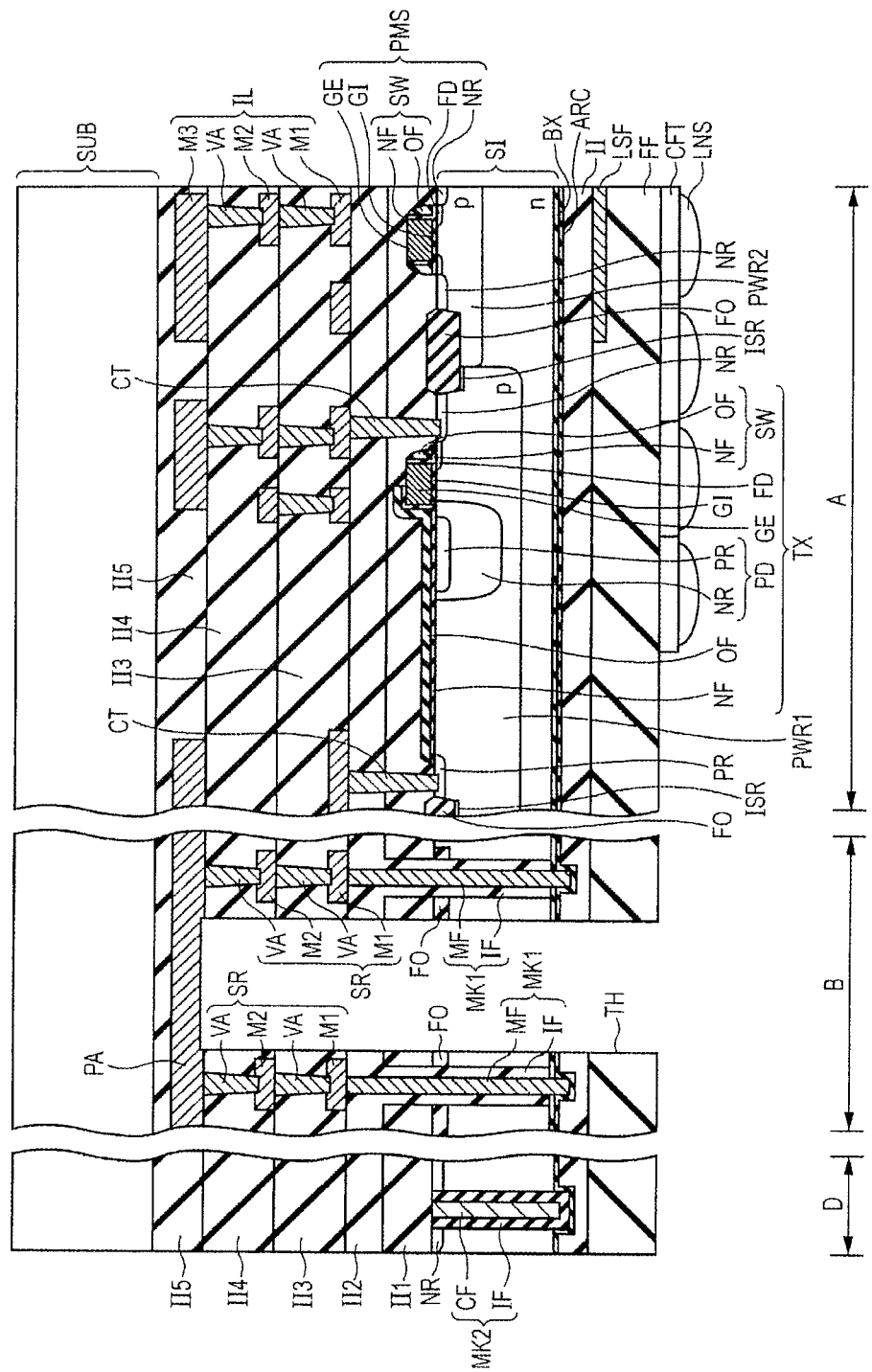
FIG. 40 is a schematic cross sectional view simply showing the configuration of the regions A, B, and D shown in FIG. 2 of a semiconductor device in accordance with a second example of Fifth Embodiment.

Referring to FIG. 40, in a second example of the present embodiment, the mark-like appearance part MK1 in the pad region B is the same as the mark-like appearance part MK of Second Embodiment. The mark MK2 in the dicing line region D is the same as the mark MK of First Embodiment.

Figure 41:
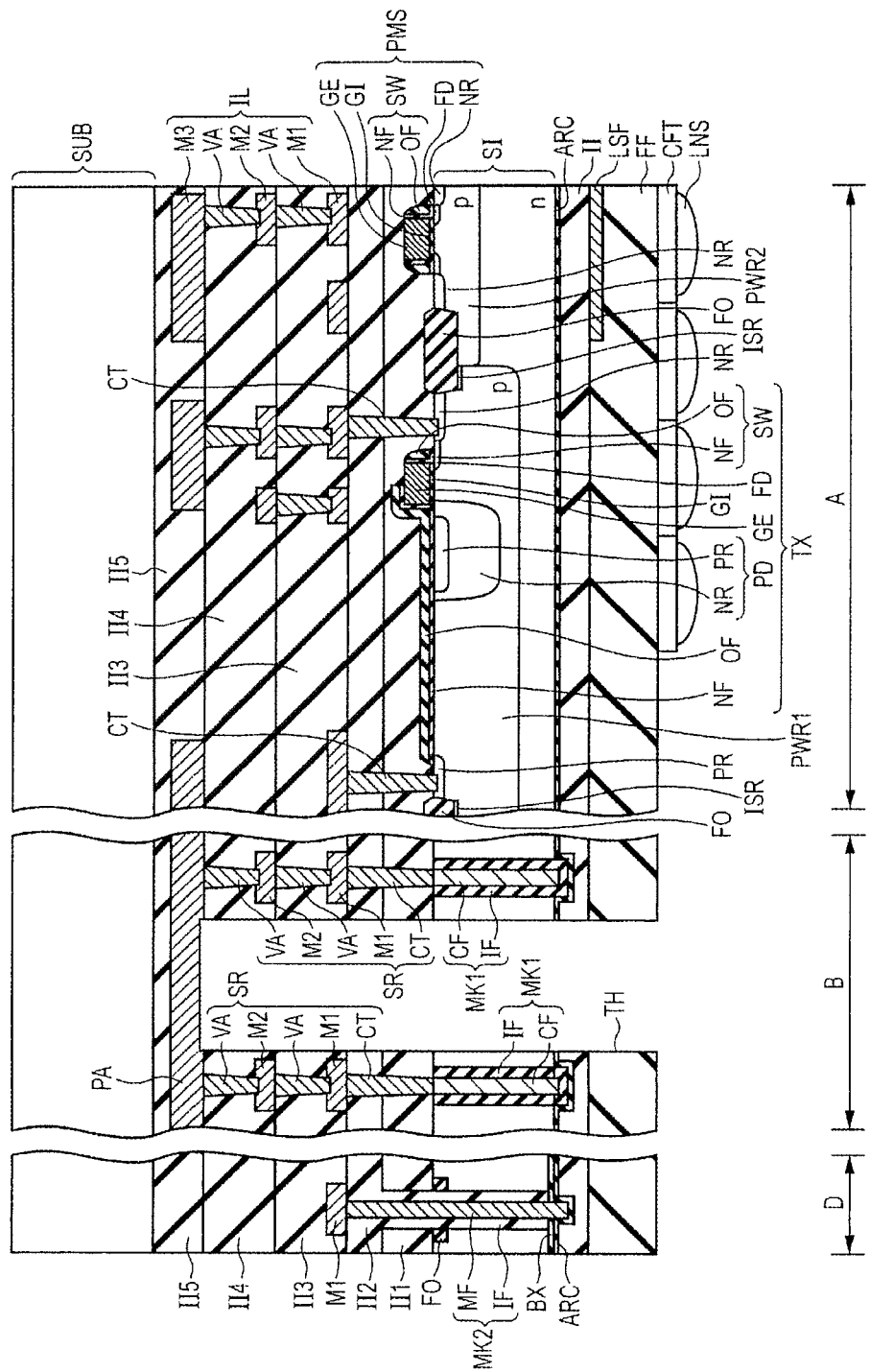
FIG. 41 is a schematic cross sectional view simply showing the configuration of the regions A, B, and D shown in FIG. 2 of a semiconductor device in accordance with a third example of Fifth Embodiment.

Referring to FIG. 41, in a third example of the present embodiment, the mark-like appearance part MK1 in the pad region B is the same as the mark-like appearance part MK of First Embodiment. The mark MK2 in the dicing line region D is the same as the mark MK of Second Embodiment.

Figure 42:
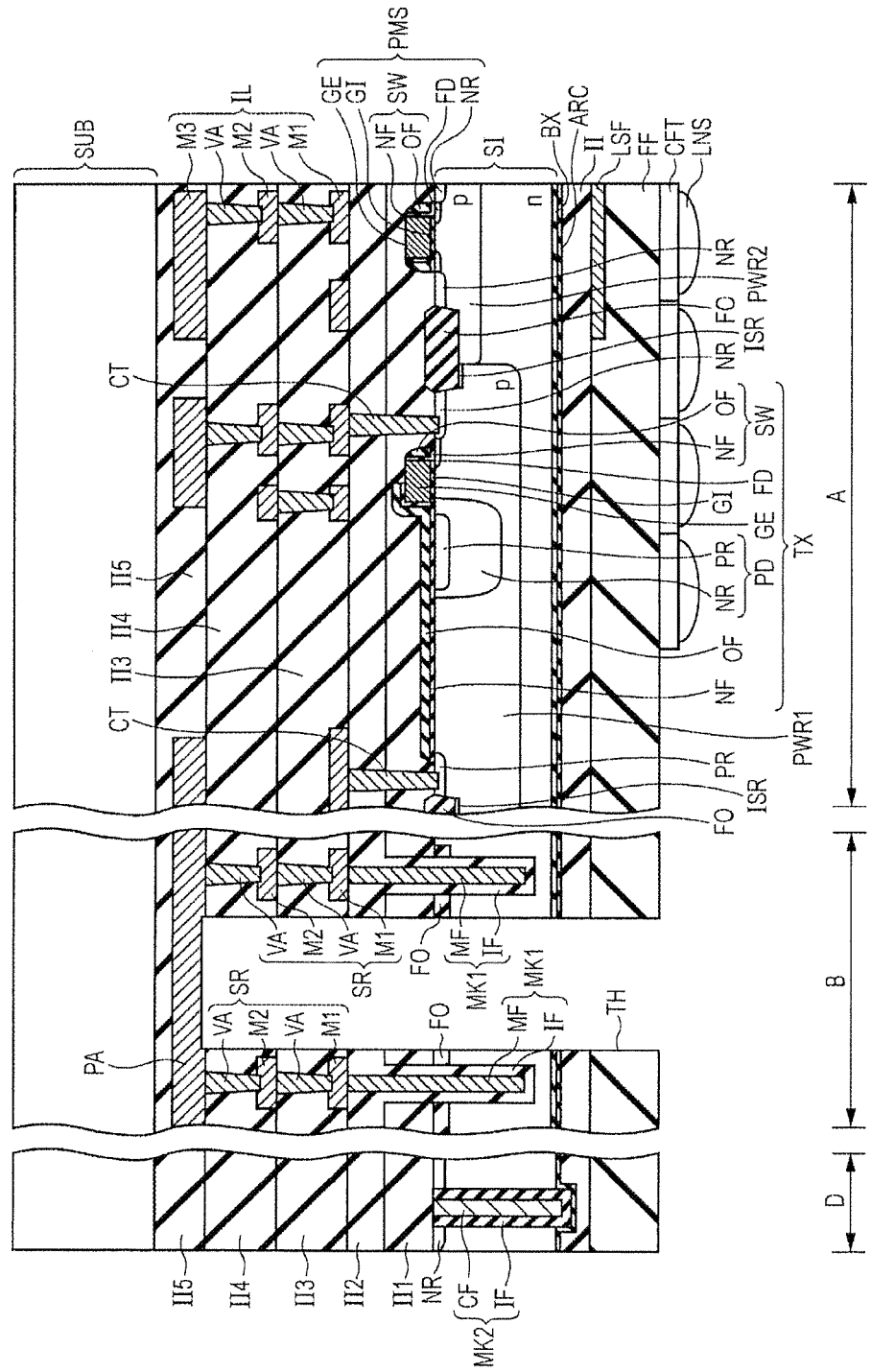
FIG. 42 is a schematic cross sectional view simply showing the configuration of the regions A, B, and D shown in FIG. 2 of a semiconductor device in accordance with a fourth example of Fifth Embodiment.

Referring to FIG. 42, a fourth example of the present embodiment has basically the same configuration as that of FIG. 40. However, the mark-like appearance part MK1 in the pad region B is formed in a form not to reach the main surface S2.

Figure 43:
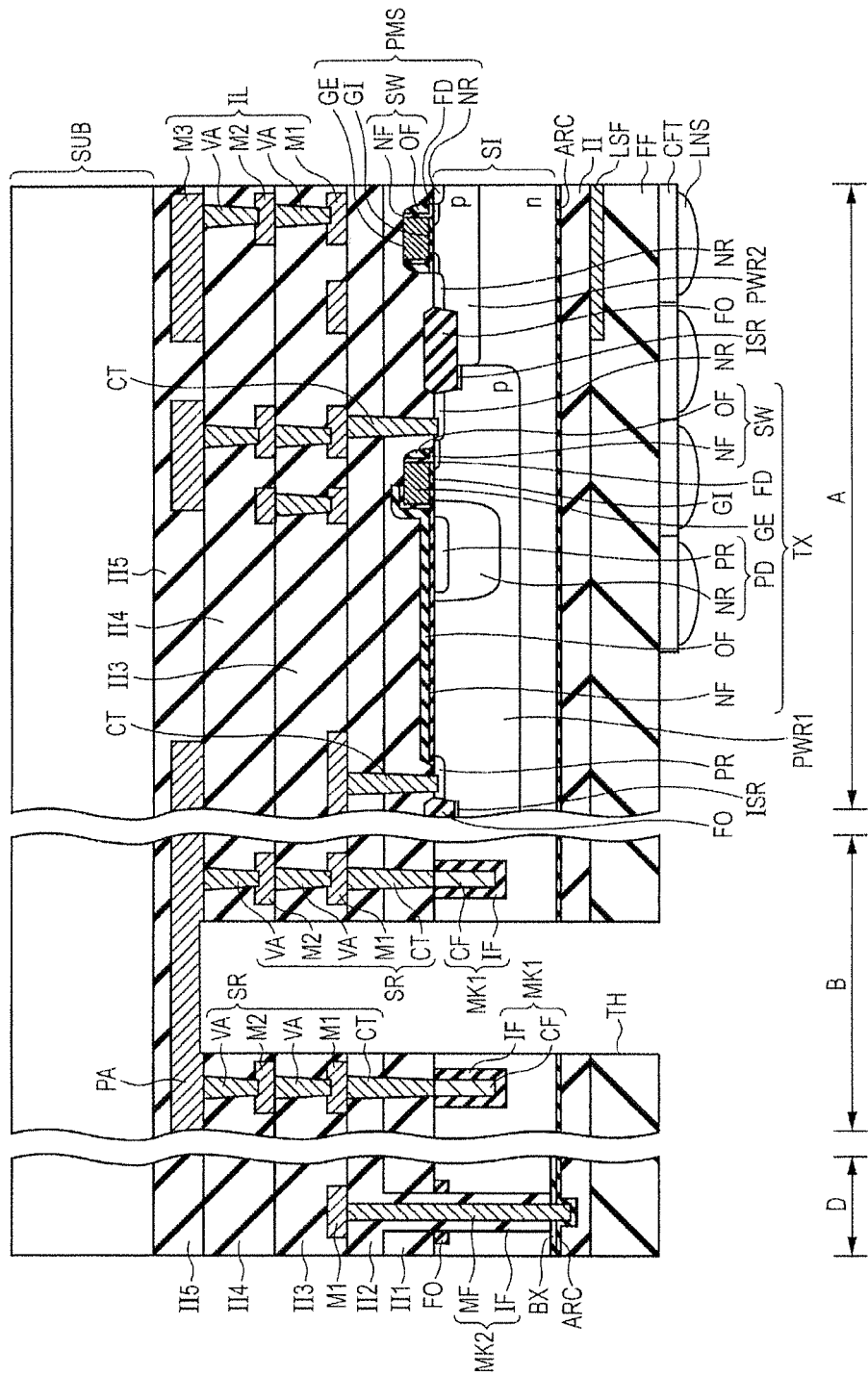
FIG. 43 is a schematic cross sectional view simply showing the configuration of the regions A, B, and D shown in FIG. 2 of a semiconductor device in accordance with a fifth example of Fifth Embodiment.

Referring to FIG. 43, a fifth example of the present embodiment has basically the same configuration as that of FIG. 41. However, the mark-like appearance part MK1 in the pad region B is formed in a form not to reach the main surface S2.

Figure 44:
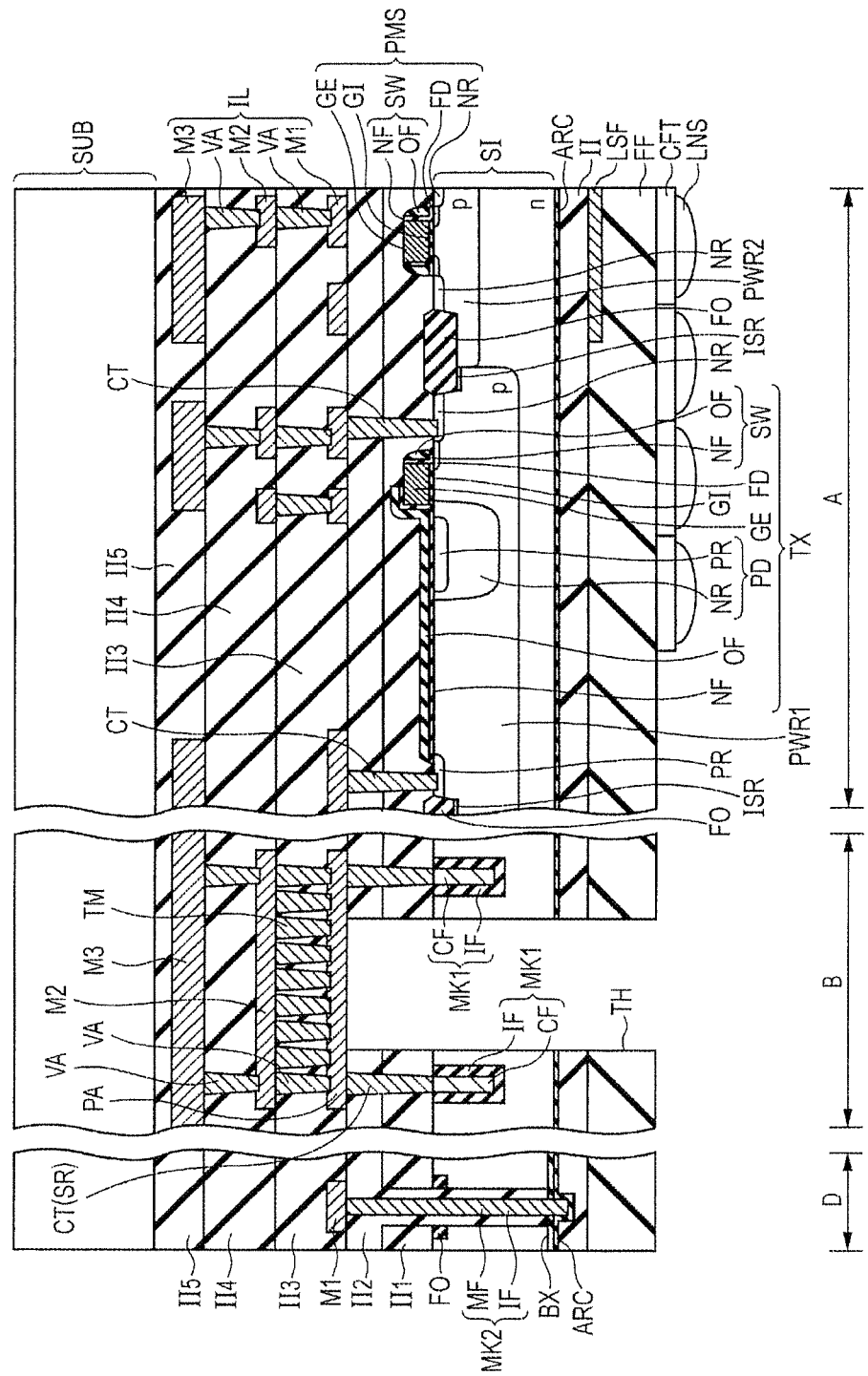
FIG. 44 is a schematic cross sectional view simply showing the configuration of the regions A, B, and D shown in FIG. 2 of a semiconductor device in accordance with a sixth example of Fifth Embodiment.

Referring to FIG. 44, a sixth example of the present embodiment has basically the same configuration as that of FIG. 43. However, as with Third Embodiment, the pad electrode PA is formed as the same layer as the metal wire M1.

When the trench part TH2 (second trench part) for forming the mark-like appearance part MK1 in the pad region B and the trench part TH2 (first trench part) for forming the mark MK2 in the dicing line region D are formed by different steps as in the present embodiment, it is possible to arbitrarily control the depth of, particularly, the trench part TH2 in the pad region B. Whereas, when the trench part TH2 in the pad region B is formed shallow so as not to reach the main surface S2 as in, for example, FIG. 39, it becomes easier to bury the insulation film and the conductive film into the trench part TH2 (second trench part) as compared with the case where the trench part TH2 is formed deep so as to reach the main surface S2.

Whereas, in the present embodiment, the mark-like appearance part MK1 in the pad region B and the mark MK in the dicing line region D are formed by different steps, and thereby both can be formed so as to have different forms.

Sixth Embodiment

Figure 45:
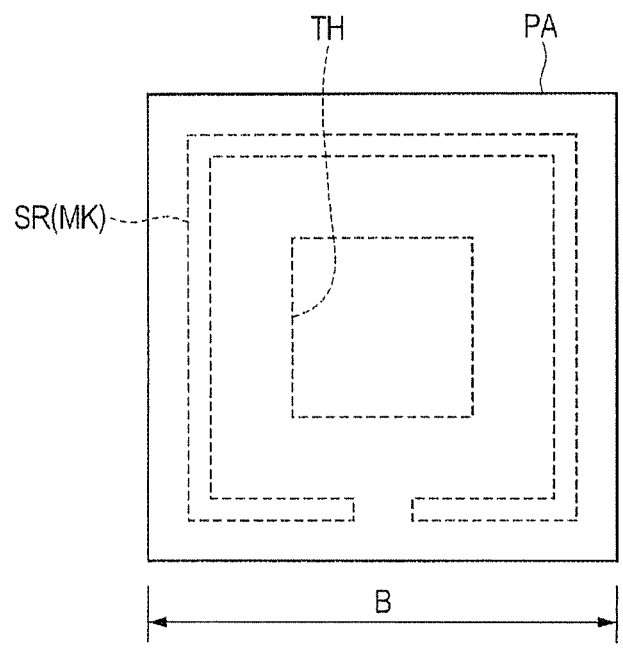
FIG. 45 is a schematic plan view simply showing the configuration of a pad region B in accordance with a first example of Sixth Embodiment.
Figure 46:
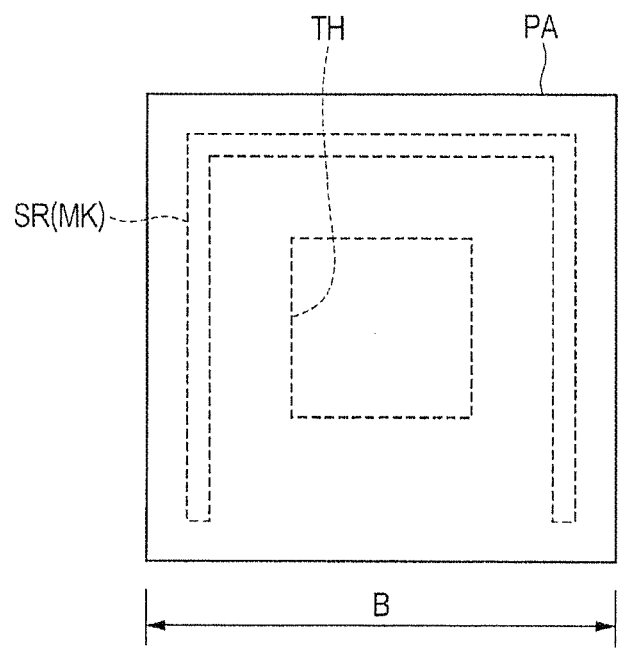
FIG. 46 is a schematic plan view simply showing the configuration of a pad region B in accordance with a second example of Sixth Embodiment.
Figure 47:
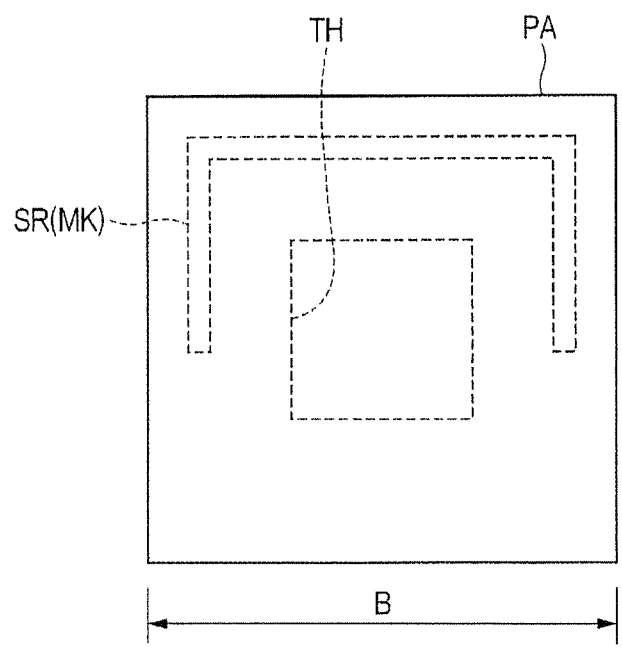
FIG. 47 is a schematic plan view simply showing the configuration of a pad region B in accordance with a third example of Sixth Embodiment.
Figure 48:
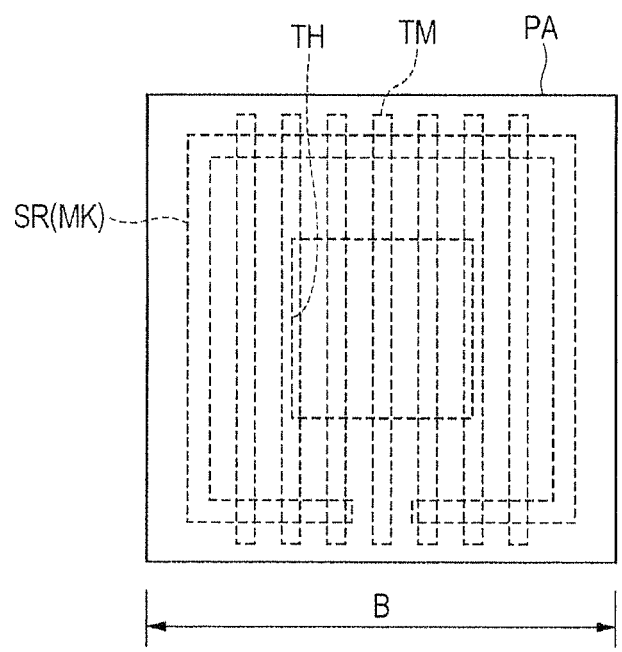
FIG. 48 is a schematic plan view simply showing the configuration of a pad region B in accordance with a fourth example of Sixth Embodiment.
Figure 49:
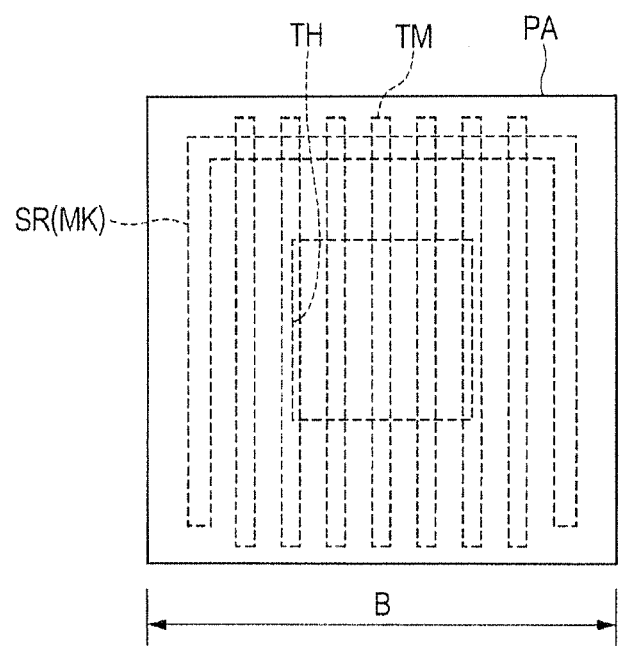
FIG. 49 is a schematic plan view simply showing the configuration of a pad region B in accordance with a fifth example of Sixth Embodiment.
Figure 50:
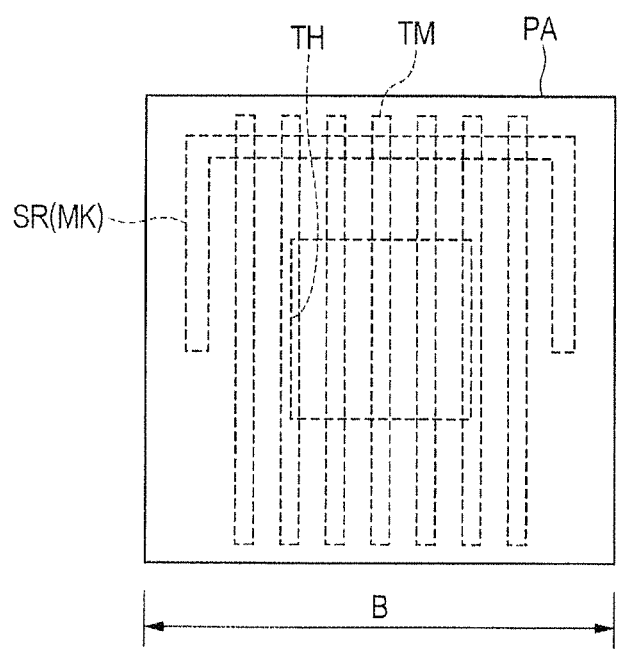
FIG. 50 is a schematic plan view simply showing the configuration of a pad region B in accordance with a sixth example of Sixth Embodiment.

In the respective embodiments, basically, as shown in FIGS. 5 and 32, the coupling part SR (and the mark-like appearance part MK) around the opening TH in the pad region B is formed so as to have, for example, a rectangular planar shape in such a manner as to entirely surround the outer circumference of the opening TH in plan view. However, as shown in FIGS. 45 to 50, the coupling part SR (and the mark-like appearance part MK) around the opening TH in the pad region B may be formed in such a manner as to surround only a part of the outer circumference in plan view. FIGS. 45 to 47 each show, for example, a modified example of the form of the pad region B of FIG. 5; and FIGS. 48 to 50 each show, for example, a modified example of the form of the pad region B of FIG. 32. Further, although not shown, the form of the each drawing of the present embodiment may be applied to any configuration of First to Fifth Embodiments.

Up to this point, the invention completed by the present inventors was specifically described by way of embodiments. However, it is naturally understood that the present invention is not limited to the embodiments, and may be variously changed within the scope not departing from the gist thereof.

What is claimed is:

1. A semiconductor device comprising:
   a semiconductor substrate having a main surface and a back surface opposite the main surface;

a first transistor formed on the main surface of the semiconductor substrate and including the photodiode for used as a photoelectric conversion element;

a plurality of interlayer insulation films formed over the main surface of the semiconductor substrate;

a plurality of metal wirings formed over the main surface of the semiconductor substrate and disposed on the interlayer insulation films;

a plurality of metal vias formed over the main surface of the semiconductor substrate and connected to the metal wirings;

a pad electrode formed over the main surface of the semiconductor substrate and disposed on the interlayer insulation films;

a trench formed in the semiconductor substrate;

a metal part formed in the trench; and a first seal ring connected to the pad electrode and the metal part such that first seal ring is disposed between the pad electrode and the metal part;

wherein an opening is formed in the semiconductor substrate and the interlayer insulation films such that the opening penetrates through both the semiconductor substrate and the interlayer insulation films to expose a surface of the pad electrode, wherein the first seal ring comprises a first wiring of the metal wirings and a first metal via of the metal vias and surrounds the opening, and wherein the first seal ring disposed between the first transistor and the opening in plan view.

2. The semiconductor device according to claim 1, further comprising a second seal ring comprises a second wiring of the metal wirings and a second metal via of the metal vias, and disposed around the first seal ring;

wherein the pad electrode is disposed between the second seal ring and the first transistor in plan view.

3. The semiconductor device according to claim 2, further comprising an antireflection film formed on the back surface of the semiconductor substrate and formed of a silicon nitride film.

4. The semiconductor device according to claim 3, further comprising;

a second transistor, for controlling the operations of the photodiodes, formed on the main surface of the semiconductor substrate and including a gate electrode, a source region; and a light shielding film formed over the antireflection film;

wherein the light shielding film is disposed to overlap with the second transistor in a cross-sectional view.

5. The semiconductor device according to claim 4, further comprising;

a planarization film formed over the light shielding film to cover the light shielding film, and formed of a silicon oxide film; and a color filter formed over the planarization film to overlap with the first transistor in a cross-sectional view; and a microlens formed over the color filter to overlap with the first transistor in a cross-sectional view.

6. The semiconductor device according to claim 4, further comprising a insulation film formed in the trench such that the insulation film is disposed between a side surface of the metal part and a side surface of the trench.

7. The semiconductor device according to claim 5, wherein the trench penetrates from the main surface of the semiconductor substrate to the back surface of the semiconductor substrate.

8. The semiconductor device according to claim 5, wherein the insulation film is disposed around the metal part such that a bottom surface of the metal part is covered with the insulation film, and wherein the antireflection film covers the back surface of the semiconductor and a bottom surface of the insulation film.

9. The semiconductor device according to claim 5, wherein the insulation film is disposed around the metal part such that a bottom surface of the metal part is covered with the insulation film, and wherein the antireflection film covers the back surface of the semiconductor and a bottom surface of the insulation film.

10. The semiconductor device according to claim 9, wherein the metal part and the insulation film are used as an alignment mark.

11. The semiconductor device according to claim 9, wherein the pad electrode disposed to overlap with the the first seal ring and the trench in a cross-sectional view.

12. The semiconductor device according to claim 9, wherein the first seal ring is disposed to surround all side of the opening in plan view.

* * * * *